United States Patent
Itoga et al.

(10) Patent No.: US 6,735,275 B2
(45) Date of Patent: May 11, 2004

(54) X-RAY EXPOSURE METHOD, X-RAY EXPOSURE APPARATUS, FINE STRUCTURE AND SEMICONDUCTOR DEVICE

(75) Inventors: Kenji Itoga, Hyogo (JP); Toyoki Kitayama, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 192 days.

(21) Appl. No.: 10/140,066

(22) Filed: May 8, 2002

(65) Prior Publication Data

US 2003/0099324 A1 May 29, 2003

(30) Foreign Application Priority Data

Nov. 28, 2001 (JP) ........................ 2001-362939

(51) Int. Cl.$^7$ ............................... H01L 21/30

(52) U.S. Cl. ............................ 378/34; 430/5

(58) Field of Search .................... 378/34, 35; 430/5

(56) References Cited

U.S. PATENT DOCUMENTS

| | | | | |
|---|---|---|---|---|
| 4,061,829 A | * | 12/1977 | Taylor ........................ | 428/451 |
| 5,131,022 A | * | 7/1992 | Terashima et al. ............ | 378/34 |
| 6,324,250 B1 | * | 11/2001 | Amemiya et al. ............ | 378/34 |
| 6,351,512 B1 | * | 2/2002 | Terashima et al. ............. | 378/1 |
| 6,366,639 B1 | * | 4/2002 | Ezaki et al. .................. | 378/34 |
| 6,652,956 B2 | * | 11/2003 | Clevenger et al. .......... | 428/210 |

FOREIGN PATENT DOCUMENTS

JP  2000-338299  12/2000

OTHER PUBLICATIONS

Seo, Younghun et al.; "Resist profile Characteristics caused by photoelectron and Auger electron blur at the resist–tungsten substrate interface in 100 nm proximity x–ray lithography", *J. Vac. Sci. Technol. B*, (Nov./Dec. 2000).

Taylor, G.N. et al.; "Organosillicon monomers for plasma–developed x–ray resists", *J. Vac. Sci. Technol.*, 19(4), pp. 872–880, (Nov./Dec. 1981).

Smith, Henry I., et al.; "X–ray tithography—A review and assessment of future applications", *J. Vac. Sci. Technol.*, 17(1), pp. 533–535, (Jan./Feb. 1980).

Itoga, K. et al.; "Reduction of Secondary Election from Substrates in Proximity X–ray Lithography using Harder Radiation Spectra", *The 45$^{th}$ Intl. Conference on Electron . . . and Nanofabrication*, Washington, DC (May 29–Jun. 1, 2001).

Takigawa, Tadahiro, "The Innovation of ULSI Lithography", *Science Forum Co. Ltd.*, 1$^{st}$ Edition, p. 222 (Nov. 10, 1994).

Itoga, K. et al.; "Effect of secondary electron from the substrate in X–ray lithography using harder radiation spectra", *J. of Vacuum Sci. & Technol. B*, vol. 19, No. 6, pp. 2439–2443 ( Nov./Dec. 2001).

* cited by examiner

Primary Examiner—David V. Bruce
Assistant Examiner—Hoon Song
(74) Attorney, Agent, or Firm—Leydig, Voit & Mayer, Ltd.

(57) ABSTRACT

An X-ray exposure method and an X-ray exposure apparatus using exposure X-rays having short wavelengths for formation of a fine pattern in X-ray lithography and suppressing fogging due to secondary electrons from a substrate bearing a resin film. The X-ray exposure method includes forming, by coating, a resist film on a substrate made of a material having an absorption-edge in or near an illumination wavelength range; and illuminating the resist film with X-rays having a wavelength range, including the absorption-edge wavelength, through an X-ray mask. The X-ray intensity is reduced in the wavelength range of an absorption spectrum including the absorption-edge of the material of the substrate in an optical path leading to the substrate.

17 Claims, 82 Drawing Sheets

X-RAY EXPOSURE METHOD, X-RAY EXPOSURE APPARATUS, FINE STRUCTURE AND SEMICONDUCTOR DEVICE

BACKGROUND OF THE INVENTION

1. Field of the Invention

The present invention relates to an X-ray exposure apparatus, an X-ray exposure method used in forming a fine structure such as a semiconductor device, the fine structure and the semiconductor device fabricated using the same. More particularly, the present invention relates to an X-ray exposure apparatus and an X-ray exposure method capable of suppressing a pattern transfer defect caused by secondary electrons from a substrate even if X-rays with wavelengths shorter than an absorption edge wavelength of a substrate are used in a transfer technique for a fine pattern such as a semiconductor integrated circuit and the like, the fine structure and the semiconductor device.

2. Description of the Background Art

FIG. 81 is an illustration of a construction showing a general X-ray exposure system (Japanese Patent Laying-Open No. 2000-338299). In FIG. 81, as a radiation source, a radiation generator (synchrotron radiation (SR) apparatus) 101 with a critical wavelength of 0.846 nm is adopted, which emits radiation 102. The radiation 102 is reflected twice by mirrors 103a and 103b with an oblique incidence angle of 1 degree into beams with a rectangular section and transmitted through a beryllium window 104 with a thickness of 20 μm. A radiation path including the X-ray mirrors and the beryllium window is called a beam line 105.

The radiation coming out from the beam line 105 is directed, for illumination, to a mask 108 constituted of an absorber 107 and a membrane 106 which is a transmissive part. A fine pattern is determined by placement of absorbers on membrane 106 of the transmissive part. The X-rays pass through the mask and are thereby patterned. The patterned X-rays impinge on a resist 110 coated on a substrate 109 and illuminated parts are photochemically activated to form a resist pattern. X-rays are absorbed by the resist, but all of them is not absorbed; the X-rays remaining unabsorbed are transmitted through the resist to reach substrate 109 and impinge on it.

FIG. 82 is a graph showing spectra of X-rays with which surfaces of resists are illuminated in two kinds of X-ray exposure apparatuses. In FIG. 82, a spectrum having a peak in the neighborhood of a wavelength of 0.43 nm is used as exposure X-rays having a peak in the shorter wavelength range. On the other hand, a spectrum having a peak in the neighborhood of a wavelength of 0.7 nm is used as exposure X-rays in the longer wavelength range. Exposure X-rays in the longer wavelength range have a spectrum at the surface of a resist, obtained in a case where an SiC mirror as a reflecting X-ray mirror is used and an SiC film of a thickness 2 μm is adopted in a transmissive part of a mask. Exposure X-rays in the shorter wavelength range have a spectrum at the surface of the resist, obtained in a case where a nickel mirror is used and a diamond film of a thickness 2 μm is adopted in the transmissive part of a mask.

In prior art X-ray exposure, X-rays in the longer wavelength range equal to or more than an absorption-edge wavelength of silicon of 0.7 nm were mainly employed. In contrast, in exposure using X-rays in the shorter wavelength range, X-rays including wavelengths equal to or less than 0.7 nm and down to the order of 0.3 nm were employed.

In an X-ray proximity exposure technique, there has remained the following problem, which has been one of reasons for difficulty in exposure using X-rays in the shorter wavelength range. That is, in exposure on a silicon substrate or the like, a problem arises that a fogging effect in a resist at the bottom caused by photoelectrons (secondary electrons) from the silicon substrate is enhanced as the wavelength range of exposure X-rays is shifted to the shorter wavelength side. For this reason, none of wavelengths equal to or shorter than 0.67 nm, which is an absorption-edge wavelength of silicon, has been able to be employed.

However, microfabrication of a semiconductor device and others has progressed with certainty, in which case, X-rays with short wavelengths, if they could be employed, would be, with no doubt, advantageous in miniaturization of a semiconductor device. This is because blurring of a pattern effected by diffraction or the like is suppressed more with shorter wavelength X-rays. Hence, in order to avoid the fogging effect caused by photoelectrons from the silicon substrate in a case of X-rays in the shorter wavelength range than the absorption-edge wavelength of silicon, the following schemes have been employed: a 2-layer resist scheme or a scheme forming a coating on a surface of a silicon substrate prior to resist coating.

With the 2-layer resist scheme or the scheme of forming a coating on a surface of a silicon substrate prior to resist coating, however, a problem has occurred that man-hours increase, reducing production efficiency. In light of such a problem, development has been desired of an exposure technique using X-rays with a shorter wavelength than the absorption edge of silicon without reducing production efficiency as compared with the prior art transfer technique for a fine pattern.

SUMMARY OF THE INVENTION

It is an object of the present invention to provide an X-ray exposure method and an X-ray exposure apparatus capable of using exposure X-rays of short wavelengths advantageous for formation of a fine pattern by suppressing a fogging effect due to secondary electrons from a substrate, not limiting to a silicon substrate, enhanced in company with use of the exposure X-rays of short wavelengths; and a fine structure and a semiconductor device using the same.

An X-ray exposure method of the present invention is an exposure method including the steps of: forming, by coating, a resist film on a substrate made of a material having an absorption-edge in and near an illumination wavelength range; and illuminating the resist film with X-rays in the wavelength range including an absorption-edge wavelength through an X-ray mask. In this X-ray exposure method, exposure is performed at a ratio of an amount of X-rays absorbed in a surface layer down to a prescribed depth of the substrate to an amount of X-rays absorbed in the resist film being equal to or less than a prescribed value.

Since an amount of generated secondary electrons is proportional to an amount of absorbed X-rays, with this construction of the X-ray exposure method, generation of secondary electrons from the substrate is suppressed while ensuring sufficient photochemical activation in the resist to thereby enable photochemical activation in the resist with less of a fogging effect. Note that the passage "an amount of X-rays absorbed in a surface layer down to a prescribed depth of the substrate" means an amount of X-rays absorbed in a depth range from the surface to a depth of the maximum shooting range of secondary electrons generated in the substrate. While secondary electrons are generated in the substrate in proportion to the X-ray amount, the behavior of the generated secondary electrons can be approximated such that a half thereof directs to the resist film side while the other half directs to the opposite side thereto.

In the above X-ray exposure method of the present invention, exposure is performed providing means reducing X-ray intensity in a wavelength range of an absorption spectrum to which the absorption-edge of the material of the substrate belongs in an optical path leading to the substrate.

According to the method, since X-rays in a wavelength range in which high absorption by the substrate occurs are cut off, an absorbed amount of X-rays in the resist relatively increases as compared with that in the substrate. Hence, since an amount of generated secondary electrons that increase in proportion to an absorbed amount of the X-rays in the substrate is suppressed, a fogging effect at the bottom of the resist caused by secondary electron from the substrate can be suppressed. As a result of the suppression, exposure X-rays including the absorption-edge wavelength of a material of the substrate can be used, thereby, enabling suppression of a fog in a fine pattern or the like defect caused by X-ray diffraction and so on.

In the X-ray exposure method, the resist film can include an element having the absorption spectrum overlapping an absorption spectrum to which the absorption-edge of the material of the substrate belongs.

According to the construction, it is enabled to increase an amount of X-rays absorbed in the resist film, while decreasing an amount of X-rays reaching the substrate. As a result, a fogging effect in the resist caused by secondary electrons generated in the substrate can be suppressed. An element included in the resist film in this case is not necessarily required to have an absorption spectrum having an absorption-edge therein. The element included in the resist film has only to have an absorption spectrum overlapping the wavelength range.

In the X-ray exposure method, the resist film includes an element an absorption-edge of which is in a wavelength range longer than the absorption-edge of the material of the substrate and there is provided means for reducing X-ray intensity mainly in a wavelength range equal to and shorter than the absorption-edge wavelength of the material of the substrate.

According to the X-ray exposure method, the resist film can be illuminated with exposure X-rays in a wavelength range hard to be absorbed by the substrate but easy to be absorbed in the resist film. Hence, the resist film can be photochemically activated into a prescribed fine pattern while suppressing an amount of generated secondary electrons from the substrate.

In the X-ray exposure method, the resist film includes an element an absorption-edge of which is in a wavelength range shorter than the absorption-edge of the material of the substrate and there is provided means for reducing X-ray intensity mainly in a wavelength range equal to and longer than the absorption-edge wavelength of the element included in the resist film.

According to the construction, as described above, the resist film can be illuminated with exposure X-rays in a wavelength range hard to be absorbed by the substrate but easy to be absorbed in the resist film. Hence, the resist film can be photochemically activated into a prescribed fine pattern while suppressing an amount of generated secondary electrons from the substrate. In this case, since X-rays in a wavelength range shorter than the absorption-edge wavelength of the material of the substrate is absorbed in the resist film to suppress a fogging effect caused by diffraction or the like, the method is advantageous for formation of a fine pattern.

In the X-ray exposure method, there can be provided at least one of a filter and a transmissive part of the mask with an absorptive power mainly in and near a wavelength range of the absorption-edge wavelength of the material of the substrate.

According to the construction, by including an element having an absorption-edge wavelength different from an absorption-edge wavelength of the material of the substrate, an amount of X-rays absorbed in the resist is increased, which enables suppression of an amount of X-rays absorbed in the substrate.

In the X-ray exposure method, the at least one of a filter and a transmissive part of a mask can decrease transmission of X-rays of wavelengths equal to and shorter than the absorption-edge wavelength of the material of the substrate.

In this case, by including an element having an absorption wavelength range longer than an absorption-edge wavelength of the material of the substrate in the resist, absorption of X-rays in the substrate can be suppressed while performing sufficient photochemical activation in the resist.

In the X-ray exposure method, the at least one of a filter and a transmissive part of a mask can decrease transmission of X-rays of wavelengths equal to and longer than the absorption-edge wavelength of the material of the substrate.

In this case, by including an element having an absorption wavelength range shorter than the absorption-edge wavelength of the material of the substrate in the resist, absorption of X-rays in the substrate can be suppressed while performing sufficient photochemical activation in the resist.

In the X-ray exposure method, an reflecting X-ray mirror capable of changing a reflecting spectrum while holding an optical axis at a fixed position is provided in a radiation path in the radiation source side with respect to the X ray mask and by adjusting a position of the X-ray reflecting mirror, X-ray intensity in an wavelength range of an absorption spectrum to which the absorption edge of the material of the substrate belongs can be reduced.

According to the construction, by adjusting a position of the X-ray reflecting mirror while holding the optical axis at the fixed position, the resist film can be illuminated with X-rays easy to be absorbed in the resist film excluding a wavelength range easy to be absorbed in the substrate. Modulation of an intensity spectrum of exposure X-rays by the reflecting X-ray mirror can be achieved to an great extent in terms of a wavelength range and an intensity, both.

In the X-ray exposure method, an element performing a major absorption among elements included in the resist film can be an element having a mass number larger than that of an element constituting the substrate.

An element having a larger mass number has a larger absorptive power at a smaller content thereof. Hence, a content of the element included in the resist can be reduced.

In the X-ray exposure method, there is provided a resist including an element having an absorption-edge wavelength; and as an exposure X-ray, such an X-ray is used that is in a wavelength range from said absorption-edge wavelength to a wavelength shorter by 400 eV than said absorption-edge wavelength.

By including a material having an absorption edge in a wavelength range shorter than an absorption-edge wavelength of the material of the substrate, not only is a fogging effect caused by secondary electrons from the substrate is suppressed, but a fine pattern can also be transferred with more of sharpness. Furthermore, by narrowing a wavelength range width of X-rays, more than more of sharpness can be achieved.

The foregoing and other objects, features, aspects and advantages of the present invention will become more apparent from the following detailed description of the present invention when taken in conjunction with the accompanying drawings.

BRIEF DESCRIPTIN OF THE DRAWINGS

DESCRIPTION OF THE PREFERRED EMBODIMENTS

Description will be given of embodiments of the present invention using the accompanying drawings.

1. Elucidation of Causes for Occurrence of a Fog at the Bottom of a Resist

In exposure with X-rays in the shorter wavelength range, a fog occurs in a resist at the bottom thereof by electrons coming from a silicon substrate. Hence, a resist residue is generated in a case of a negative resist, while in a case of a positive resist, a constriction occurs at the bottom of a resist pattern. This phenomenon is understood in this way: In X-ray exposure, secondary electrons are generated in a resist by X-ray illumination and the resist is photochemically activated by the electrons to thereby perform a pattern formation. An amount of generated secondary electrons is proportional to an amount of absorbed X-rays. That is, with more of absorbed X-rays in the resist, secondary electrons are generated more therein.

Figure 1:
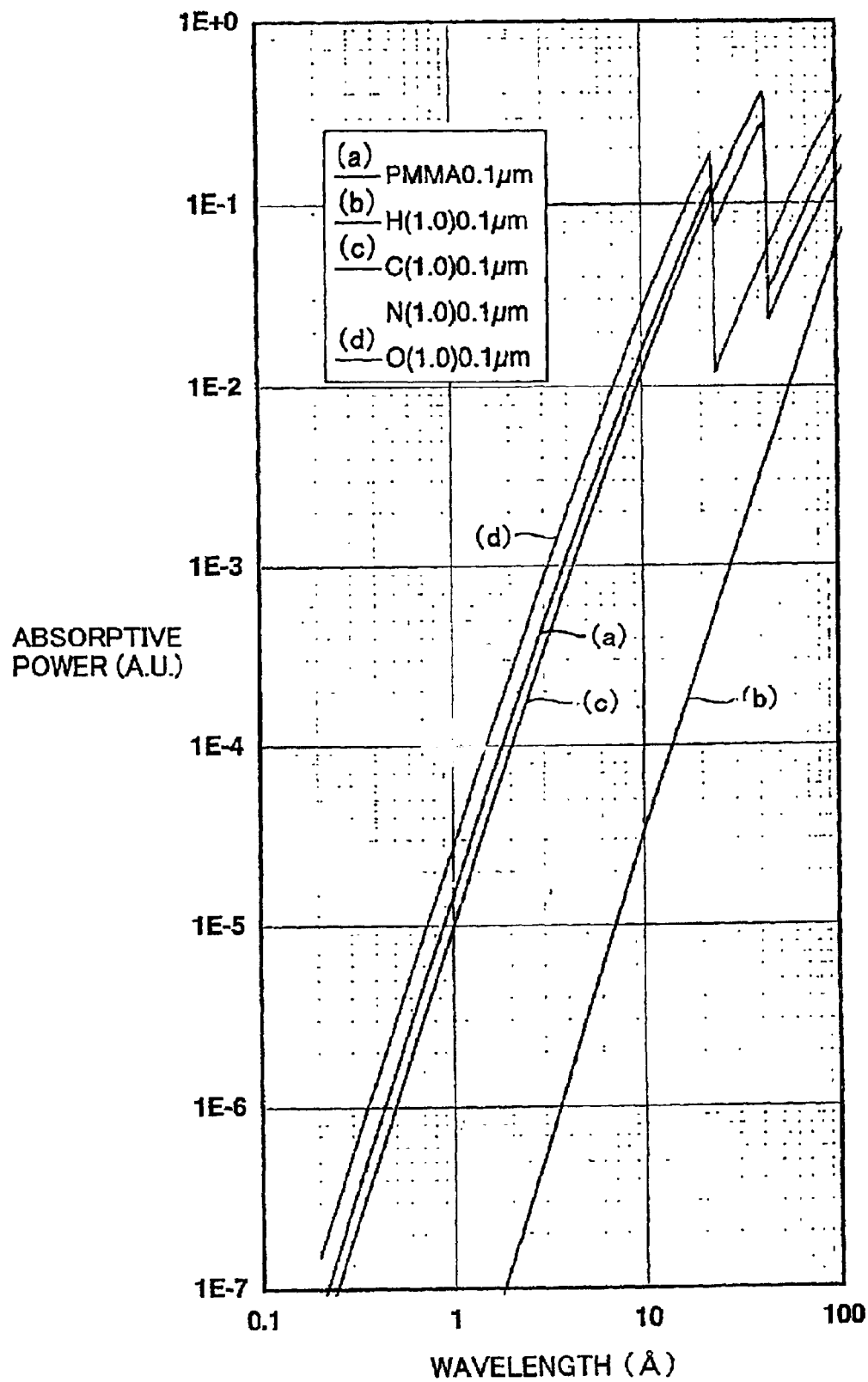
FIG. 1 is a graph showing absorption spectra of PMMA (poly(methyl methacrylate)) for use in describing the present invention.

On the other hand, a silicon substrate is also illuminated with X-rays transmitted through the resist to generate secondary electrons. One half of the secondary electrons generated in the silicon substrate heads for the resist side to photochemically activate the resist at the bottom. An influence of exposure X-rays to the resist at the bottom from the silicon substrate depends greatly on X-ray absorptive powers of the resist and the silicon substrate, that is a wavelength dependency of secondary electrons generated. An X-ray absorptive characteristic of a prior art resist material represented by PMMA or the like has a tendency that an absorbed amount decreases in proportion to a wavelength to the third power toward a shorter wavelength as shown in FIG. 1.

An amount of generated secondary electrons from a substrate, not limited to a silicon substrate, has a tendency that an absorbed amount generally does not decrease monotonously toward a shorter wavelength in a case where a substrate is of a high density material, in a case where an absorption-edge is located in the vicinity of exposure wavelengths or in the like case, That is, if wavelengths of an exposure X-rays are shorter, a case arises where the exposure X-rays are hard to be absorbed and an absorbed amount in the substrate is large to thereby generate much of secondary electrons. Such a reduction in photochemical activation level in the resist and increase in secondary electrons from the substrate cooperatively emphasize a fogging effect to a greater level in the resist at the bottom.

Especially, in a case of a substrate including an element having an absorption-edge in an exposure wavelength range, secondary electrons do not decrease monotonously with reduction in wavelength, but rather, rapidly increase in the shorter wavelength side with respect to the absorption-edge. As a result of this, a fogging effect is extraordinarily emphasized. The present invention has been made by confirming that a cause for increase in fogging effect in a resist at the bottom thereof with decreased wavelength of exposure X-rays is based on the above mechanism and providing a structure to prevent the cause from occurring.

Figure 2:
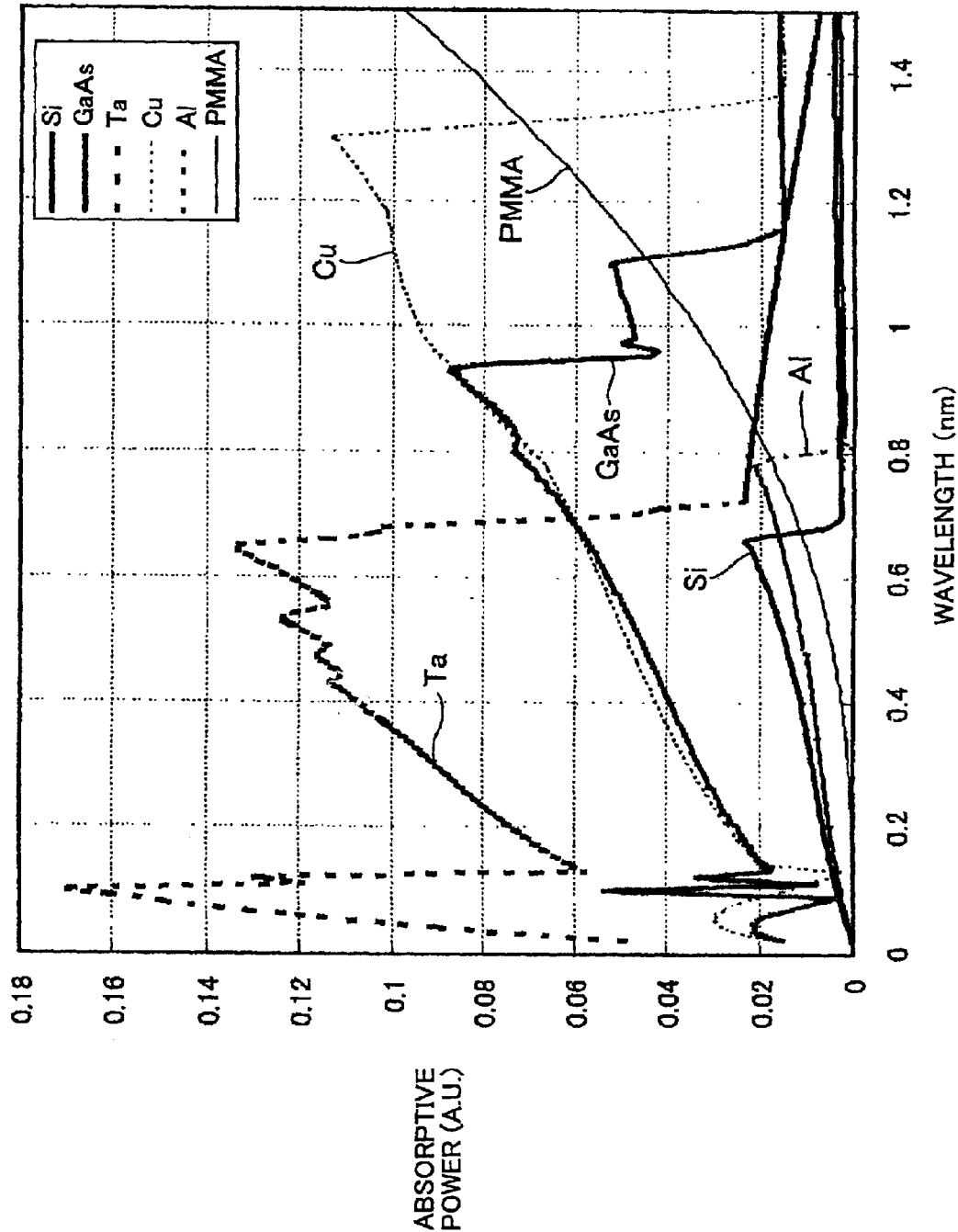
FIG. 2 is a graph showing absorption spectra of a resist material PMMA, and materials of substrates for use in describing the present invention.

In order to understand an increase in fogging effect in a resist at the bottom in company with reduction in wavelength of exposure X-rays in concrete and quantitative manners, description will be given of a case where a material of the resist on a silicon substrate is PMMA as an example. In FIG. 2, there are shown wavelength dependencies of an intensity of an X-ray absorption in cases of PMMA, silicon and other materials of a substrate. Here, an absorptive power expresses, for a material of a substrate such as silicon, an amount of X-rays absorbed in the maximum shooting range of an electron in the material and for a resist, an amount of X-rays absorbed in the range of 200 nm in thickens of the resist.

In FIG. 2, in a case of PMMA, an absorbed amount of X-rays decreases monotonously with reduction in wavelength of exposure X-rays. That is, with reduction in wavelength, an absorption coefficient of X-rays decreases in proportion to about a wavelength to the third power. In contrast to this, in a case of silicon, the absorption coefficient dose not decrease monotonously with reduction in wavelength, but an absorbed amount rapidly increases in the vicinity of a wavelength of about 0.7 nm in the shorter wavelength side. An amount of secondary electrons generated by exposure depends on an absorbed amount of X-rays; therefore, in a case where exposure is performed with X-rays of wavelengths of 0.7 nm or shorter, secondary electrons generated in the substrate increases as compared with those generated in the resist.

2. Suppression of a Fogging Effect

Figure 3:
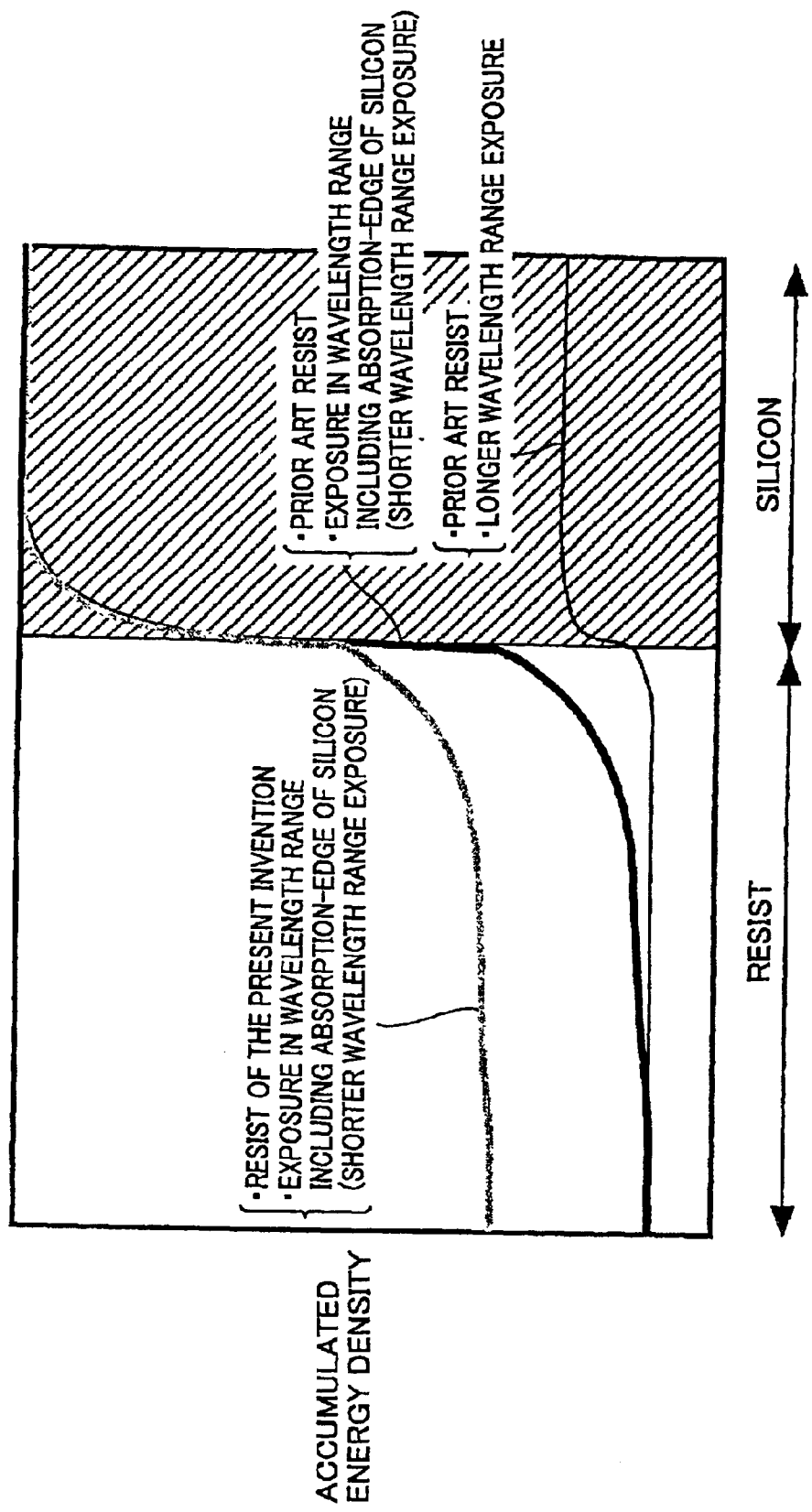
FIG. 3 is a representation showing energy distributions accumulated in silicon substrates and resist films coated thereon in an incidence direction of X-rays.

In FIG. 3, there are shown a relationship between a position in a resist in a depth direction thereof and an accumulated energy density in each of cases. Using FIG. 3, description will be given of a basic concept of the present invention. Even in a case of a prior art system including a prior art resist and so on to perform exposure with X-rays in a wavelength range longer than an absorption edge wavelength of silicon, accumulated energy in the silicon substrate is larger as compared with that in the resist. A current flowing into the resist by secondary electrons generated in the substrate is small in terms of energy.

In a case where a system of the present invention such as to include a resist of the present invention is used and illumination is effected with X-rays in the shorter wavelength range including the absorption-edge of silicon, energy flowing into the resist from the silicon substrate increases. The present invention can decrease an amount of a fog caused by secondary electrons by including an element having an absorption-edge in a illumination wavelength range in the resist even in a case where energy due to secondary electrons generated in the substrate flows into the resist.

3. Measurement of a Fogging Effect

An influence of a fogging effect by secondary electrons from a substrate increases since a ratio between an amount of absorbed X-rays in the resist and an amount of absorbed X-rays by a material of a substrate exceeds a threshold value. Therefore, the following formula for R was used as an evaluation formula for a fogging effect in the resist and experiments to seek the threshold value were performed.

$R=(1/2)\cdot\{$(an amount of X-rays absorbed in the maximum shooting range in a surface layer of a substrate)/(an amount of X-rays absorbed in a resist of a thickness 200 nm)$\}$.  (1)

A factor (1/2) is a factor coming from approximation that one half of generated secondary electrons proceed to the resist side. Furthermore, while, neither an integration symbol nor a summation symbol is included in the formula, it is natural to obtain the summation performed over wavelengths. That is, the formula other than the factor (1/2) expresses an area ratio between an absorption spectrum in the maximum shooting range of electrons in the surface layer and an absorption spectrum in the resist.

When a PMMA resist is exposed to radiation emitted from a radiation generator with a critical wavelength 0.846 μm through a construction of two platinum mirrors with an angle of incidence 89 degrees, a mask of a structure of beryllium of a thickness 20 μm and a diamond membrane of a thickness 2 μm, no fog was observed. An R value of this system was almost 0.6. From combination of the fact and results so far obtained through experiences, it ha been found that if an R value of an exposure system is 0.6 or less, an influence of a substrate is allowed to be neglected.

4. Means for Suppressing a Fogging Effect

In order to reduce an R value to 0.6 or less, as seen from the evaluation formula, there is a necessity for designing a system so as to maintain an amount of absorbed X-rays in a resist higher as compared with that by a material of a substrate. Two methods are available in a broad sense: (a) one is a method in which as for a resist material, a resist component is adjusted so as to perform absorption of X-rays to an extent as high as that a fogging effect caused by secondary electrons from a substrate can be neglected, for example included as the resist component is an element having an absorption-edge in the shorter wavelength range used in exposure; and (b) the other is a method cutting off a wavelength range in which a material of a substrate has high absorption with mirrors and a filter. In addition, (c) a third method as a combination the above methods can be considered, which decreases X-rays in a wavelength range of high absorption in the substrate while using X-rays in a wavelength range of high absorption in the resist, thereby enabling a fogging effect caused by secondary electrons from the substrate to decrease with good efficiency.

In the former method using an absorption-edge of an element included in a resist, by selecting a narrow band slightly shorter than the absorption edge, an influence of a substrate can be further reduced. This method aims at not only enhancement of a ratio of an amount of absorbed X-rays in a resist and that by a substrate, but also an reduced amount of blur in a formed resist pattern by selecting a narrow band width and shorter wavelengths. That is, by generating more of photoelectrons in the vicinity of 300 eV that greatly contribute to pattern formation in a resist, a high contrast pattern can be attained.

To be concrete, in a case where a substrate is of an element in the third period of the periodic table of the elements such as silicon or aluminum, one or more elements in the same third period such as silicon, phosphorus, sulfur, chlorine and so on are included in the substrate. In this case, since absorption-edge wavelengths of the elements reside in the side shorter than absorption-edge wavelengths of aluminum and silicon, an influence of the substrate can be suppressed with less of a content of an element by cutting off wavelengths longer than the absorption-edge of the element with mirrors or a filter.

In a case where bromine in the fourth period or iodine in the fifth period is included in a resist, sufficient absorption of X-rays can be ensured even with a smaller number of atoms thereof because of heaviness of a mass of one element atom. However, by using mirrors or a filter, an influence of a substrate can be suppressed with less of a content of the element. In a case where a substrate is of silicon or aluminum, an influence of the substrate can be reduced by including an element lighter in mass than the elements, such as oxygen or fluorine, in a resist according to a wavelength range in use.

Figure 4:
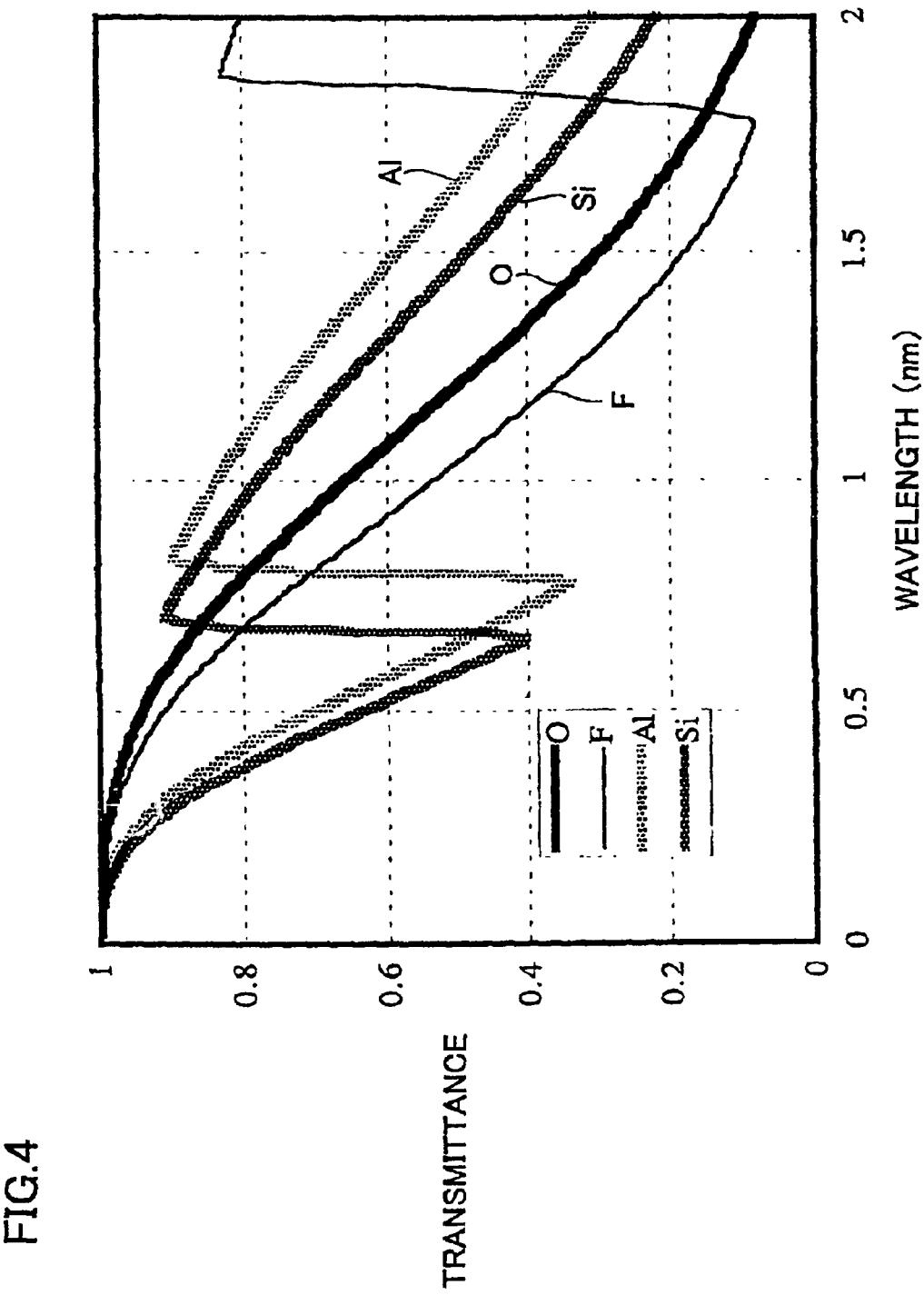
FIG. 4 is a graph showing a wavelength dependency of an X-ray transmittance of each of fluorine, oxygen, silicon and aluminum for use in describing the present invention.

In FIG. 4. There are shown transmittances in cases, in each of which it is assumed that a thin film of the same thickness is constituted of the same number of atoms of each element. It is found that transmittances of oxygen and fluorine are lower but absorption efficiencies thereof are higher in the longer wavelength side with respect to absorption-edges of silicon and aluminum. Therefore, it is only required to use X-rays of wavelengths longer than the absorption-edges of silicon and aluminum and to substitute the elements for several hydrogen atoms in the resist.

In a case of a substrate of an element in the sixth period such as tantalum, tungsten, platinum or the like, by using exposure X-rays of wavelengths longer than absorption-edges of the elements and using a resist including an element having a high absorption coefficient in an exposure wavelength range such as bromine or iodine, an influence of a substrate can be suppressed.

Furthermore, in a case of a substrate of copper, gallium arsenide or the like having a absorption-edge in a wavelength side slightly longer than an exposure wavelength range, secondary electrons from the substrate can be suppressed by selecting wavelengths in a narrow band width shorter than an absorption-edge of bromine, which is an element included in a resist, with mirrors and a filter.

Description will be given of a relationship between an effect of reducing secondary electrons of a substrate and a content of each single element included in a resist In a case where a plurality of elements are included in the resist, it is natural that individual effects of the elements are summed up to a larger total effect.

Here, while description will be given of a system mainly using X-rays emitted from a radiation generator, X-rays are not limited to the X-rays from the radiation generator, but it is natural that a similar effect is attained even with each of various kinds of X-ray sources including a plasma X-ray source and further that a similar effect is attained even with an exposure technique using an electron beam having energies of the same order as do the X-rays.

First Embodiment

In the first embodiment of the present invention, chlorine is included in a resist. As a radiation source, a radiation emitted from a radiation generator with a critical wavelength 0.846 nm is used. The radiation is reflected twice using nickel mirrors with an angle of oblique incidence 1 degree, transmitted through a beryllium window with a thickness 20 $\mu$m and then directed to a diamond membrane with a thickness 2 $\mu$m placed on a mask surface for illumination. With the use of this system, a pattern is formed on a silicon substrate.

As for a resist in use, a resist includes chlorine in proportion of 2 atoms of chlorine to 1 unit of PMMA (C:H:O=5:8:2). A content of chlorine in the resist at this time is 42 wt %. In the following description, wt % is simply referred to as %.

Figure 5:
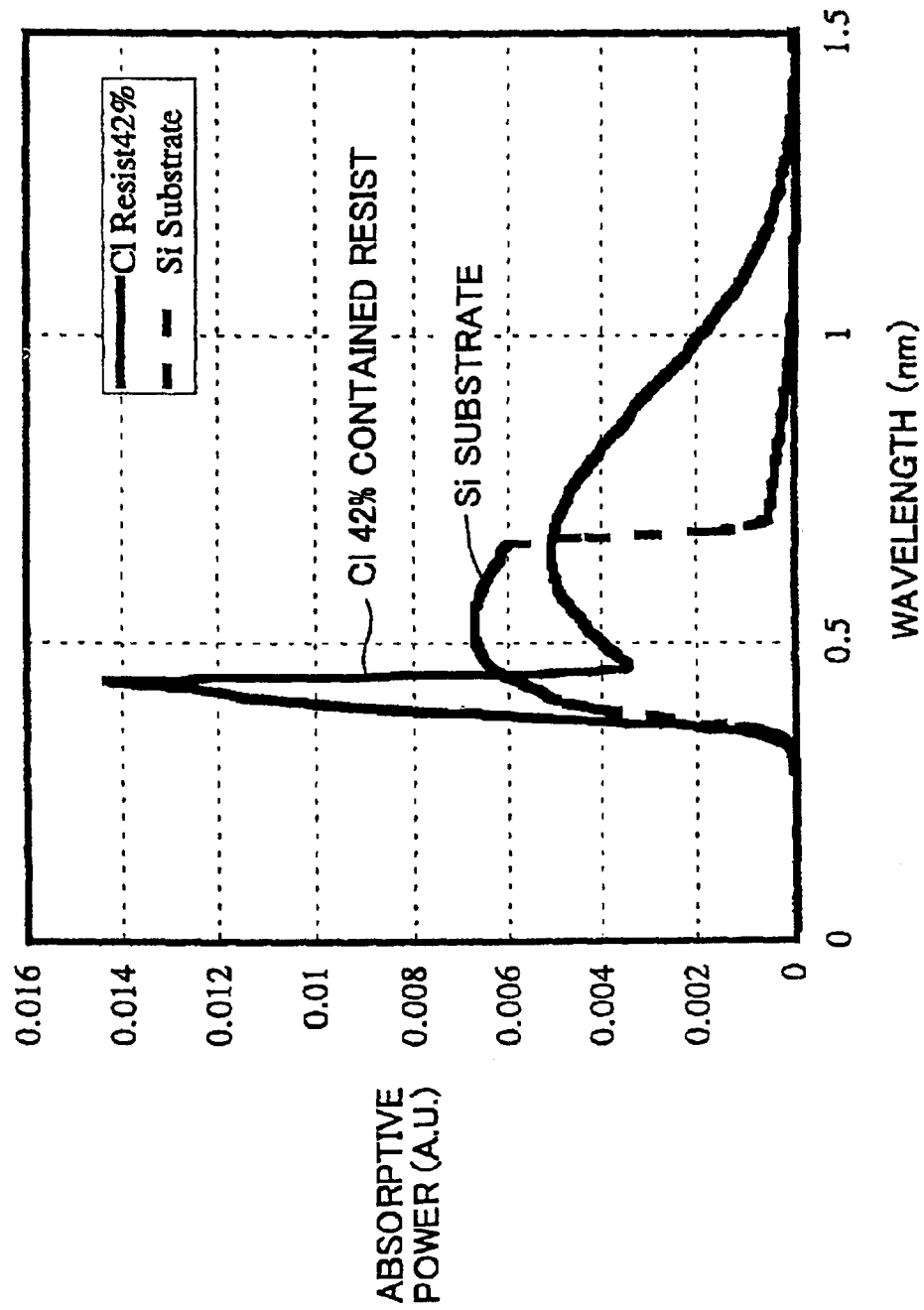
FIG. 5 is a graph showing an absorption spectrum of a chlorine contained resist and an absorption spectrum of a silicon substrate for use in describing an X-ray exposure method in a first embodiment of the present invention.

In FIG. 5, there are shown a spectrum absorbed in a resist and a spectrum emitted from a silicon substrate into the resist. Both correspond to the denominator of the evaluation formula (1) and the numerator thereof From a defining formula for R, an R value is obtained as 0.60 integrating the absorption spectra of FIG. 5 over wavelengths. The R value shows that an influence of a silicon substrate is not problematical.

Figure 6:
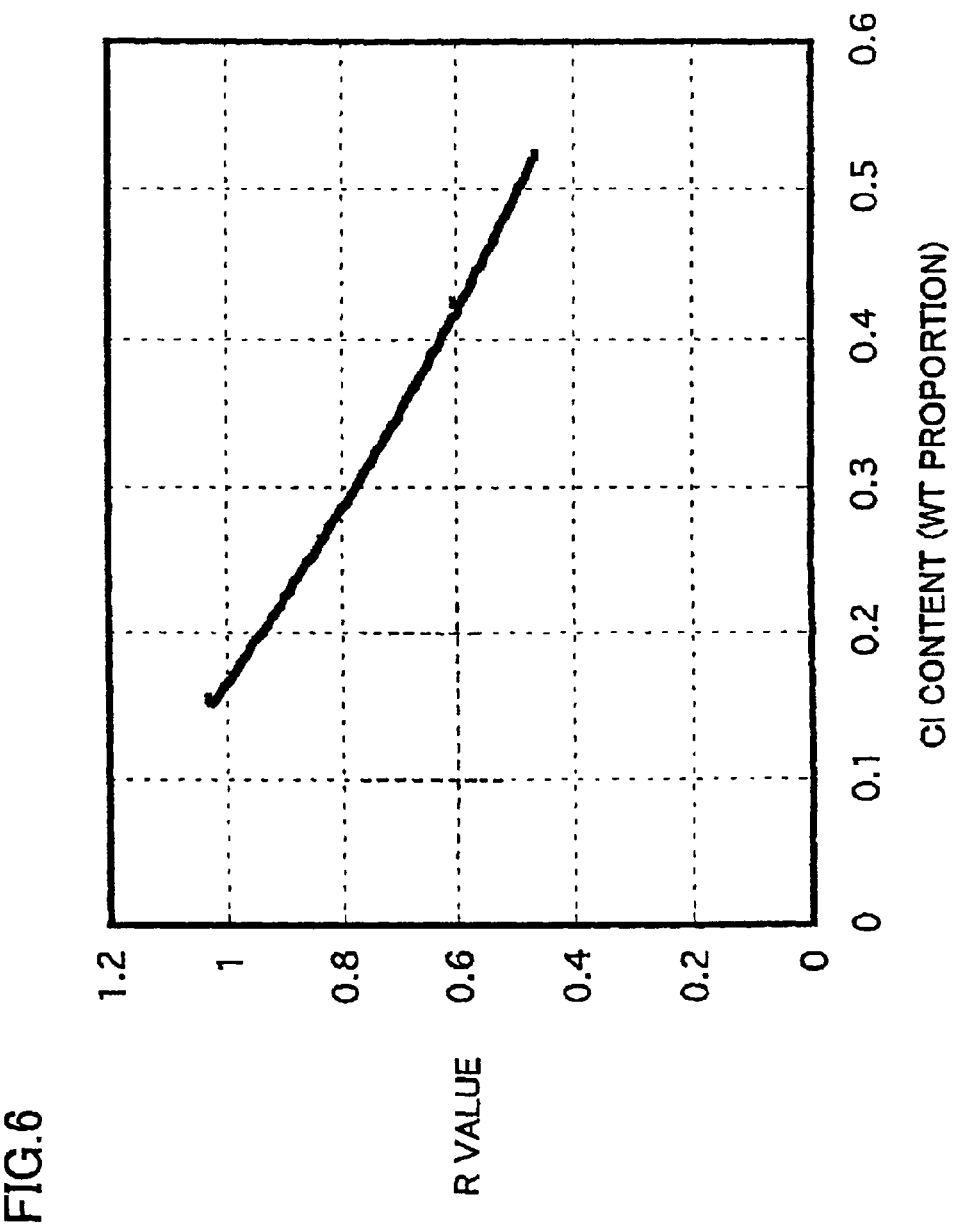
FIG. 6 is a graph showing a relationship between a chlorine content in a chlorine contained resist and an R value in the first embodiment of the present invention.

FIG. 6 is a graph showing a chlorine content dependency of an R value in the same system. According to FIG. 6, an R value decreases monotonously with a content of chlorine and shows a value of 0.6 or less in the range of chlorine contents of 42% or higher. Therefore, by setting a content of chlorine to 42% or higher, an influence of a silicon substrate can be suppressed.

Second Embodiment

Figure 7:
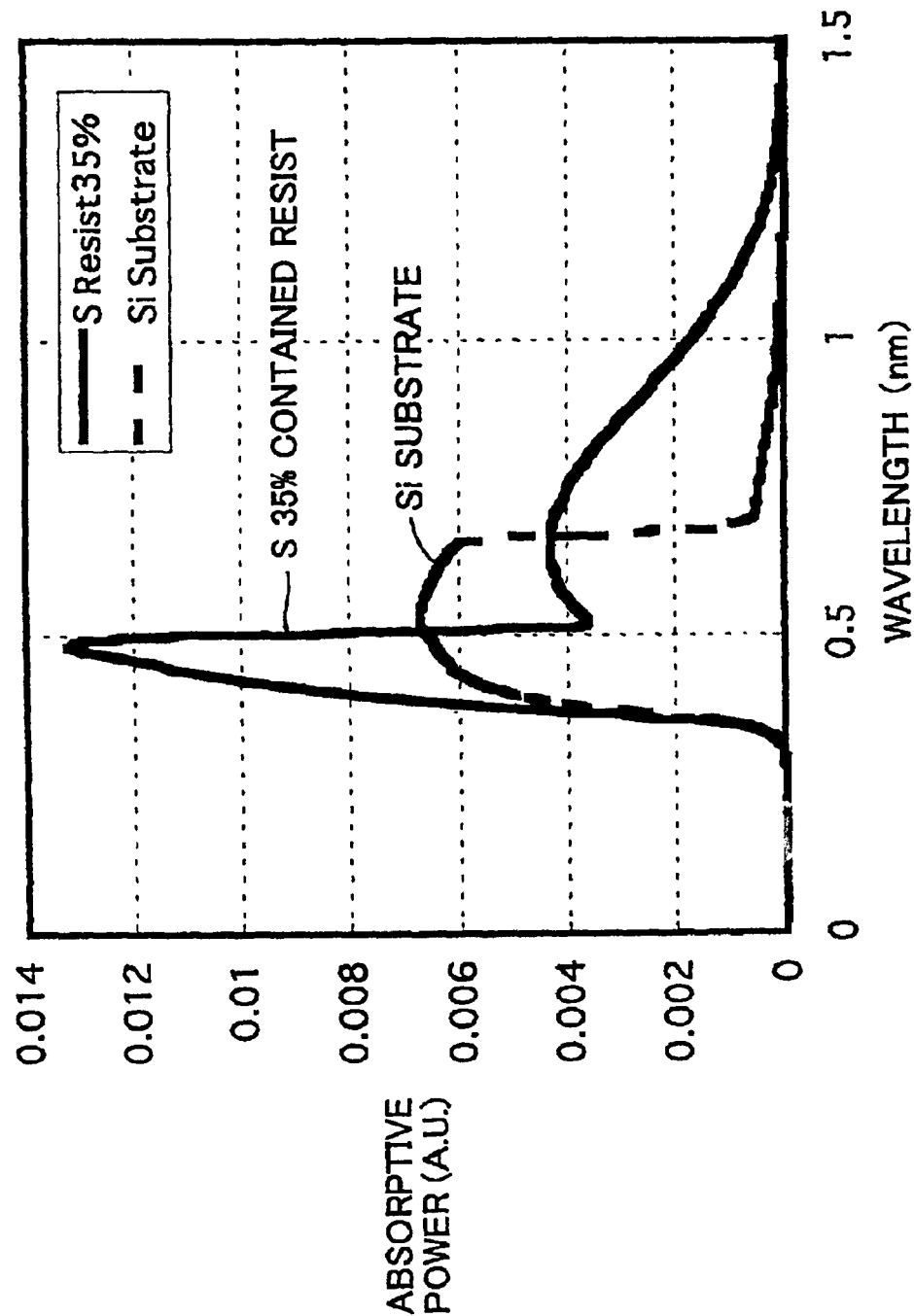
FIG. 7 is a graph showing absorption spectra of a sulfur contained resist and a silicon substrate in an X-ray exposure method of a second embodiment of the present invention.

In the second embodiment of the present invention, the system in the first embodiment is used and sulfur is included in a resist instead of chlorine. A content thereof is in a proportion of 1.7 atoms of sulfur to 1 unit of PMMA. A content of sulfur at this time is 35%. In FIG. 7, there is shown an absorption spectrum of the resist including sulfur and a spectrum of secondary electrons emitted from a silicon substrate into the resist. An R value is obtained from the figure as 0.60, showing that an influence of the substrate can be neglected.

Figure 8:
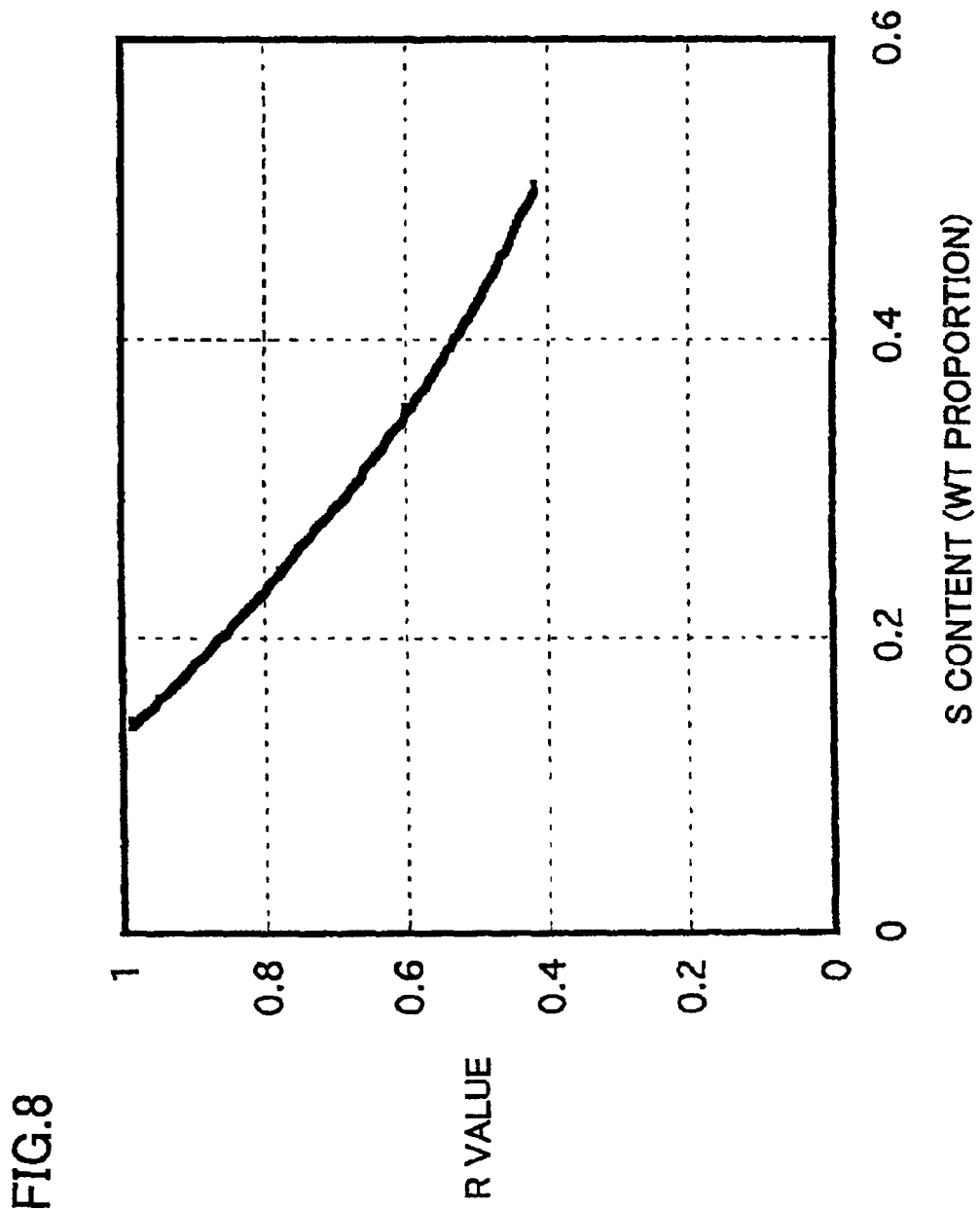
FIG. 8 is a graph showing a relationship between a sulfur content in a sulfur contained resist and an R value in the X-ray exposure method of a second embodiment of the present invention.

Furthermore, FIG. 8 is a graph showing a sulfur content dependency of an R value in the same system. An R value shows 0.6 or less in the range of sulfur contents of 35% or higher and an influence of the substrate can be neglected.

Third Embodiment

Figure 9:
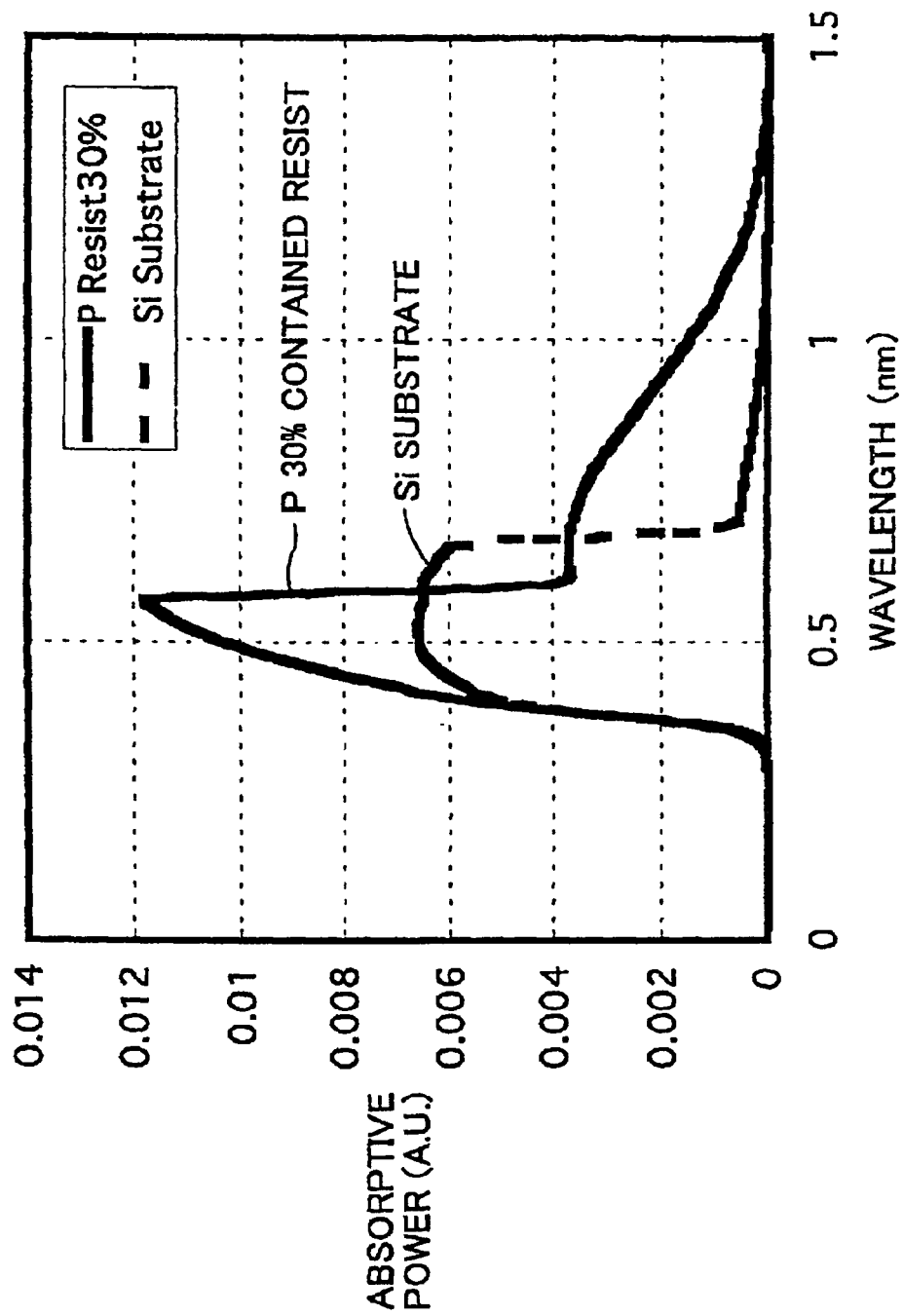
FIG. 9 is a graph showing absorption spectra of a phosphorus contained resist and a silicon substrate in an X-ray exposure method of a third embodiment of the present invention.

In the third embodiment of the present invention, the system in the first embodiment is used and phosphorus (P) is included in a resist instead of chlorine. A content thereof is in a proportion of 1.4 atoms of phosphorus to 1 unit of PMMA. A content of phosphorus at this time is 30%. In FIG. 9, there is shown an absorption spectrum of the resist and a spectrum of secondary electrons emitted from a silicon substrate into the resist. An R value in exposure wavelengths is 0.59 and an influence of the silicon substrate can be neglected.

Figure 10:
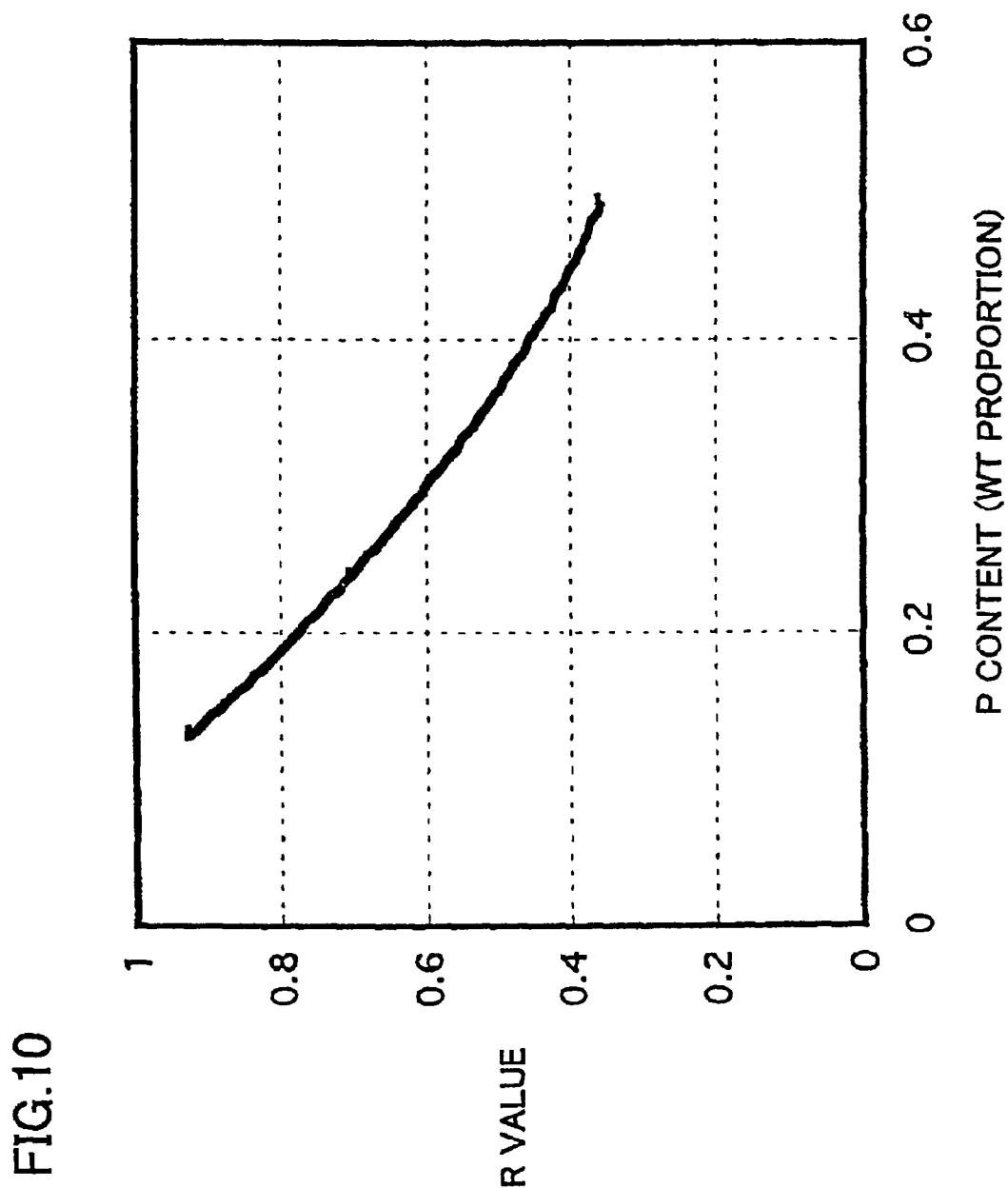
FIG. 10 is a graph showing a relationship between a chlorine content in a phosphorus contained resist and an R value in the X-ray exposure method of a third embodiment of the present invention.

Furthermore, FIG. 10 is a graph showing a phosphorus content dependency of an R value in the same system. According to FIG. 10, an R value decreases monotonously with a content of phosphorus. An R value shows 0.6 or less in the range of phosphorus contents of 30% or higher and an influence of the substrate can be neglected.

Fourth Embodiment

Figure 11:
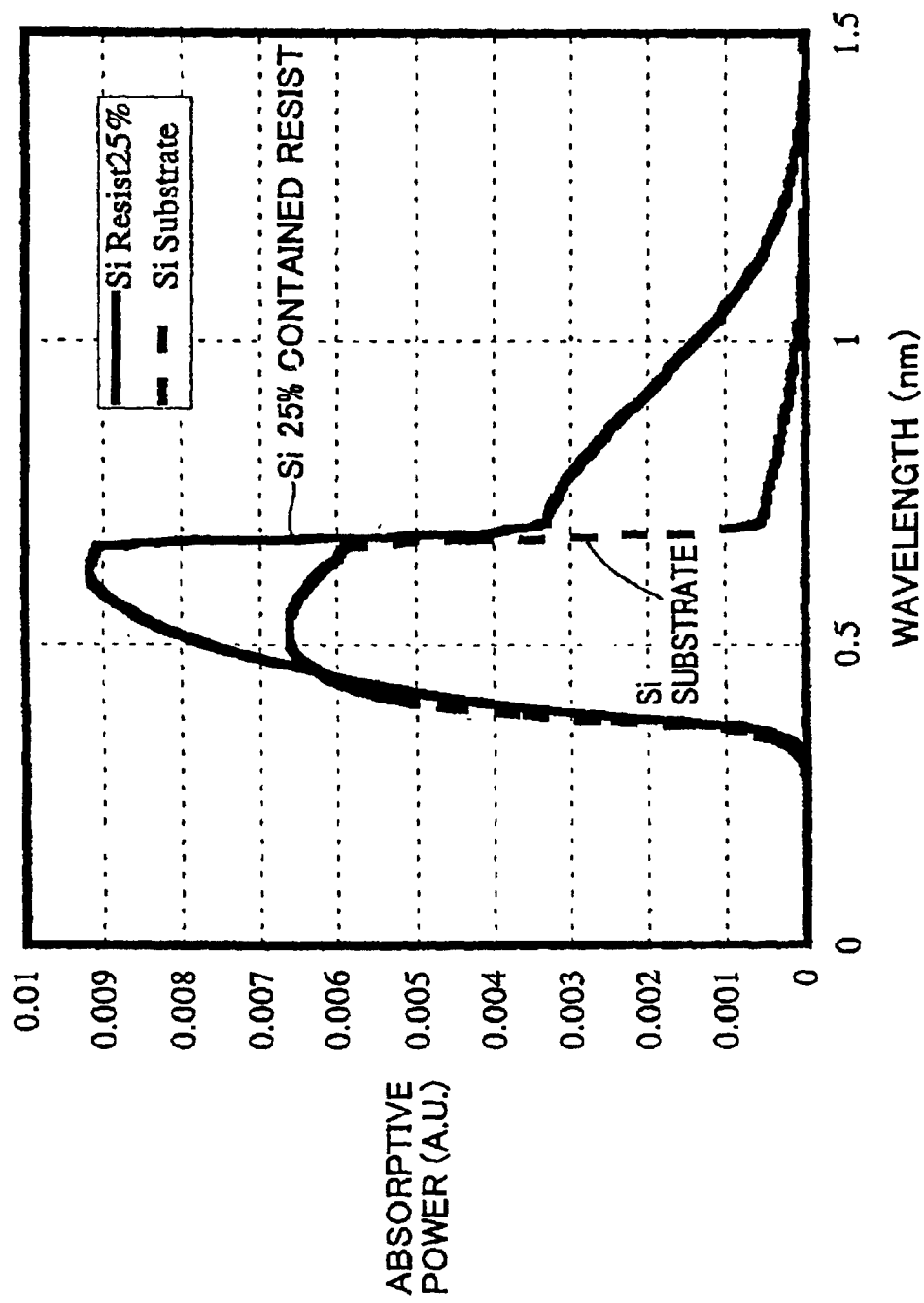
FIG. 11 is a graph showing absorption spectra of a silicon contained resist and a silicon substrate in an X-ray exposure method of a fourth embodiment of the present invention.

In the fourth embodiment of the present invention, the system in the first embodiment is used and silicon (Si) is included in a resist instead of chlorine. A content of silicon is in a proportion of 1.2 atoms of silicon to 1 unit of PMMA. A content of silicon at this time is 25%. In FIG. 11, there are shown an absorption spectrum of the resist and a spectrum of secondary electrons emitted from a silicon substrate into the resist. An R value is obtained from the absorption spectrum as 0.60.

Figure 12:
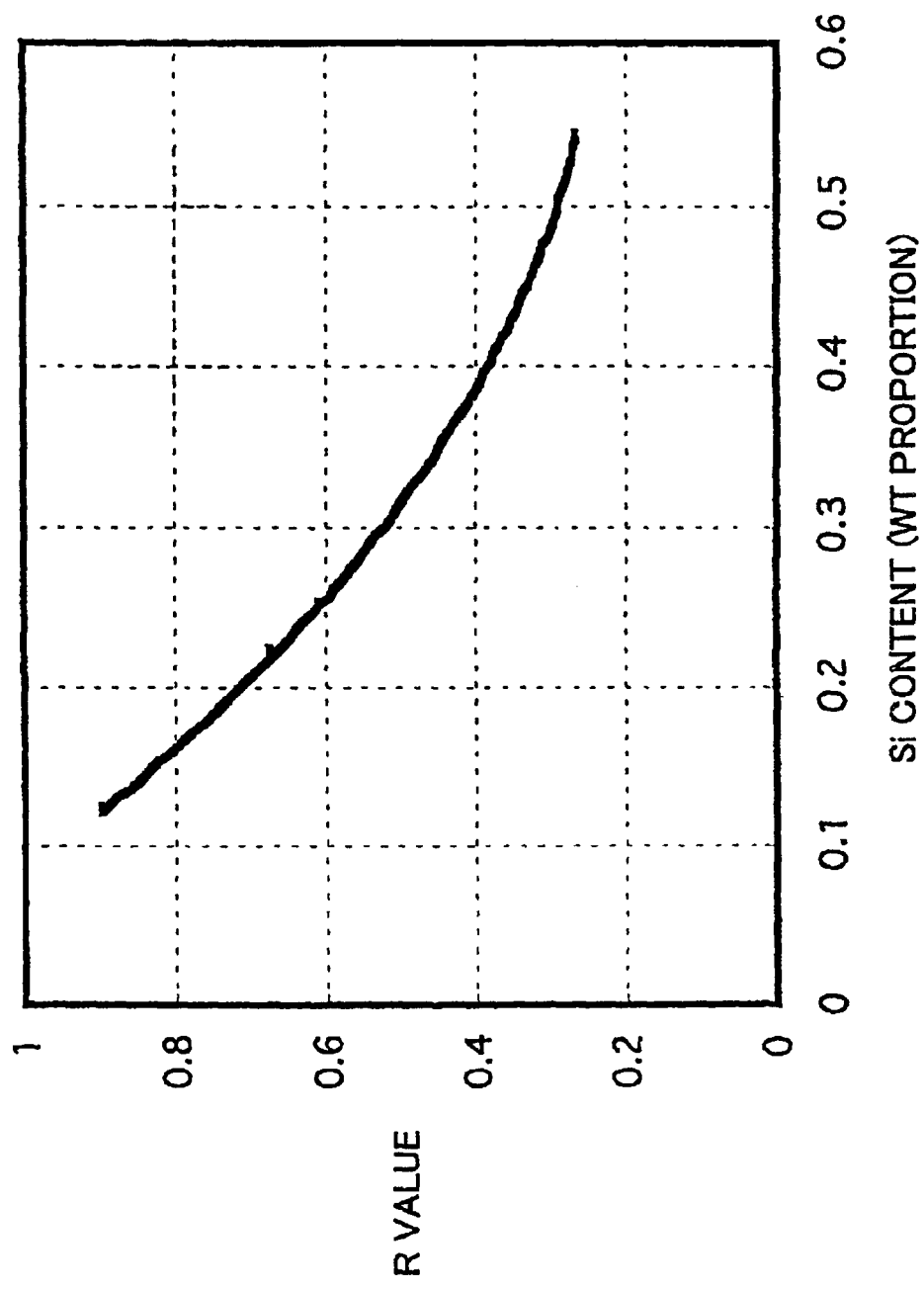
FIG. 12 is a graph showing a relationship between a chlorine content in the silicon contained resist and an R value in the X-ray exposure method of a fourth embodiment of the present invention.

Furthermore, FIG. 12 is a graph showing a silicon content dependency of an R value in the same system. According to FIG. 12, an R value decreases monotonously with a content of silicon. As seen from the figure, an R value can be set to 0.6 or less in the range of silicon contents of 26% or higher and no necessity arise for regarding an influence of the silicon substrate as a problem.

Fifth Embodiment

Figure 13:
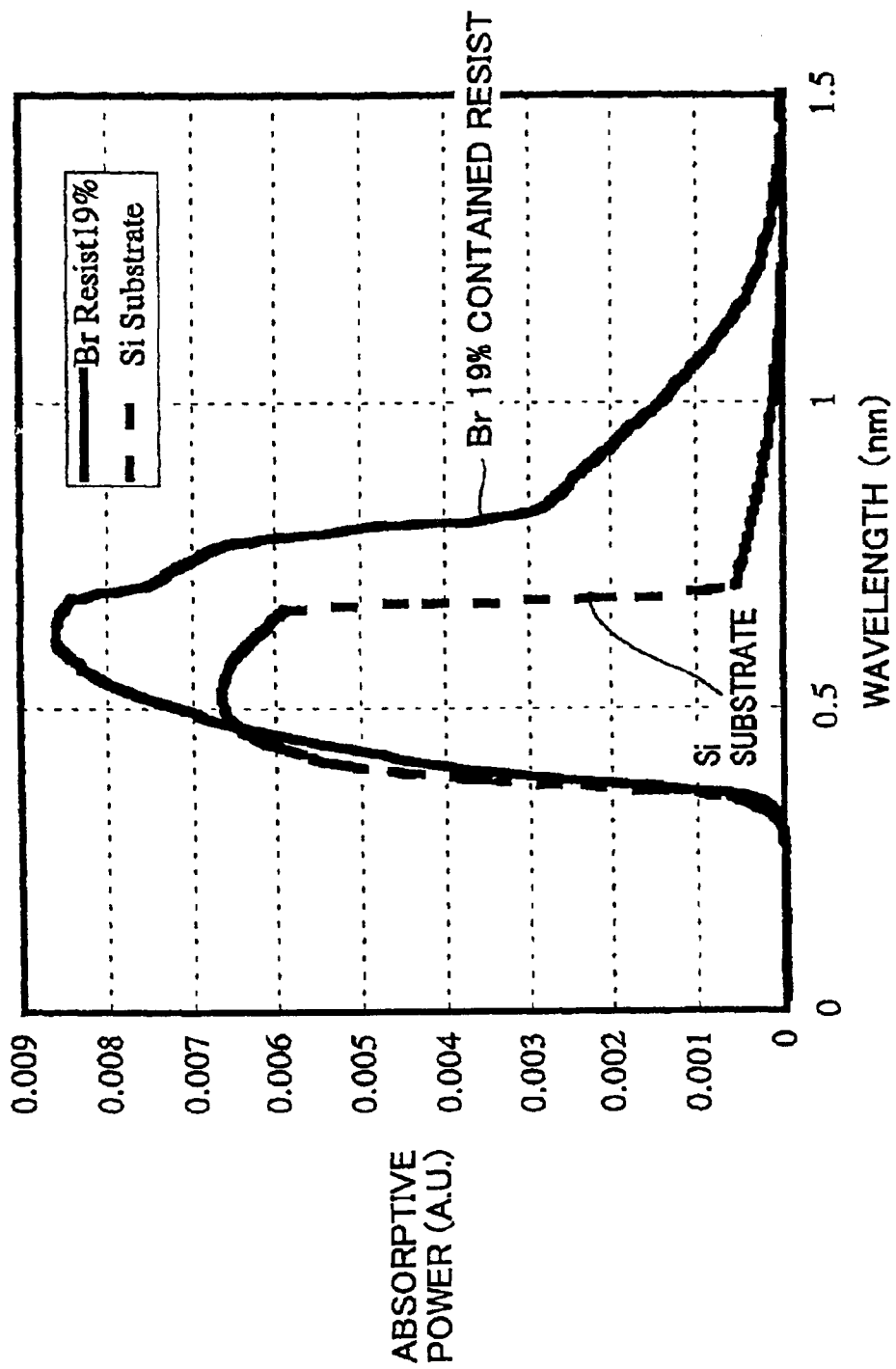
FIG. 13 is a graph showing absorption spectra of a bromine contained resist and a silicon substrate in an X-ray exposure method of a fifth embodiment of the present invention.

In the fifth embodiment of the present invention, the system in the first embodiment is used and bromine (Br) is included in a resist instead of chlorine. A content of bromine is in a proportion of 0.3 atoms of bromine to 1 unit of PMMA. A content of bromine at this time is 19%, In FIG. 13, there are shown an absorption spectrum of the resist and a spectrum of secondary electrons emitted from a silicon substrate into the resist. An R value obtained from an area ratio of the absorption spectra is 0.51, showing that an influence of the silicon substrate is not problematical.

Figure 14:
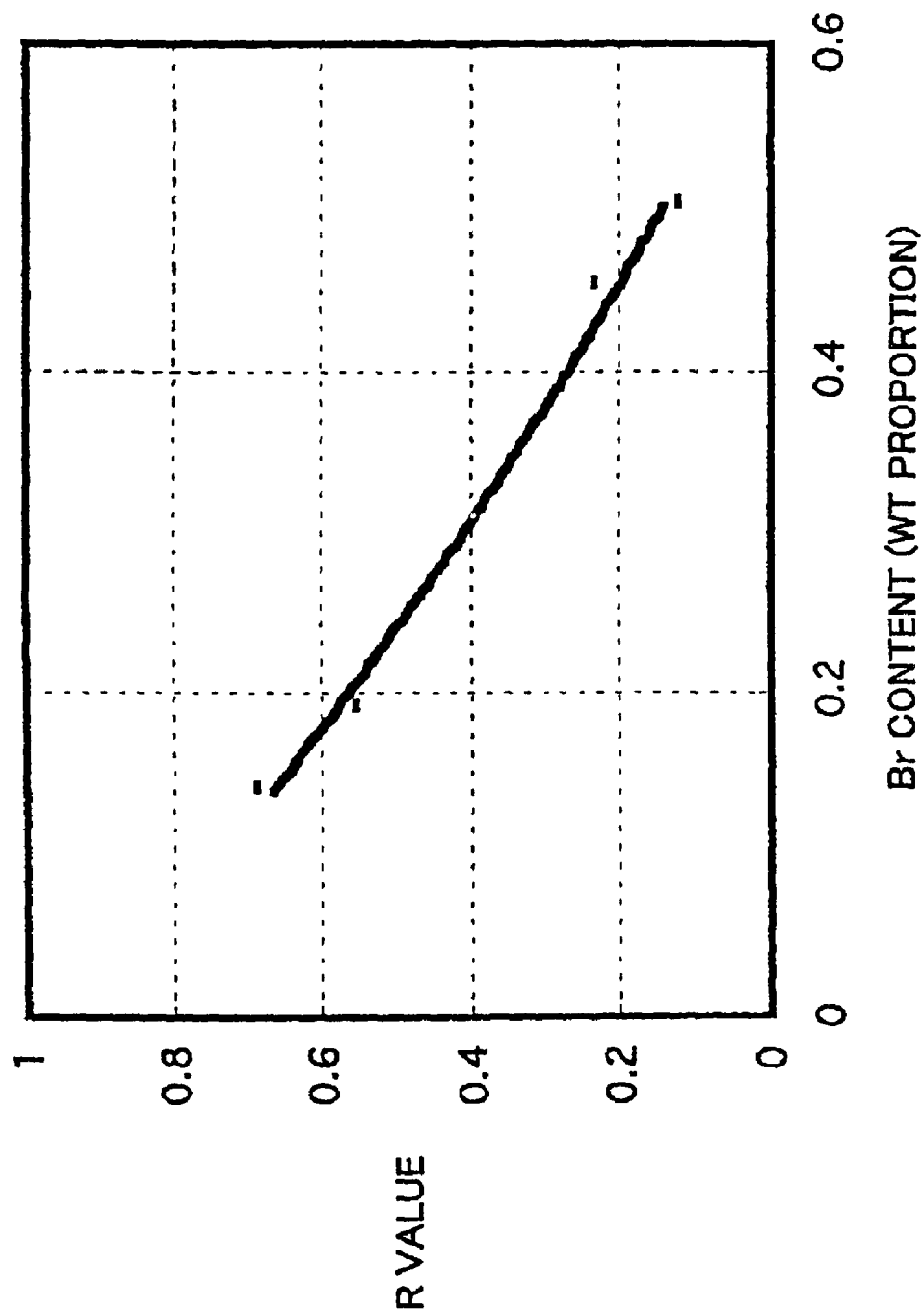
FIG. 14 is a graph showing a relationship between a chlorine content in the bromine contained resist and an R value in the X-ray exposure method of a fifth embodiment of the present invention.

Furthermore, FIG. 14 is a graph showing a bromine content dependency of an R value in the same system. According to FIG. 14, an R value decreases monotonously with a content of bromine and an R value assumes 0.6 or less in the range of bromine contents of 18% or higher and no necessity arise for regarding an influence of the substrate as a problem.

Sixth Embodiment

Figure 15:
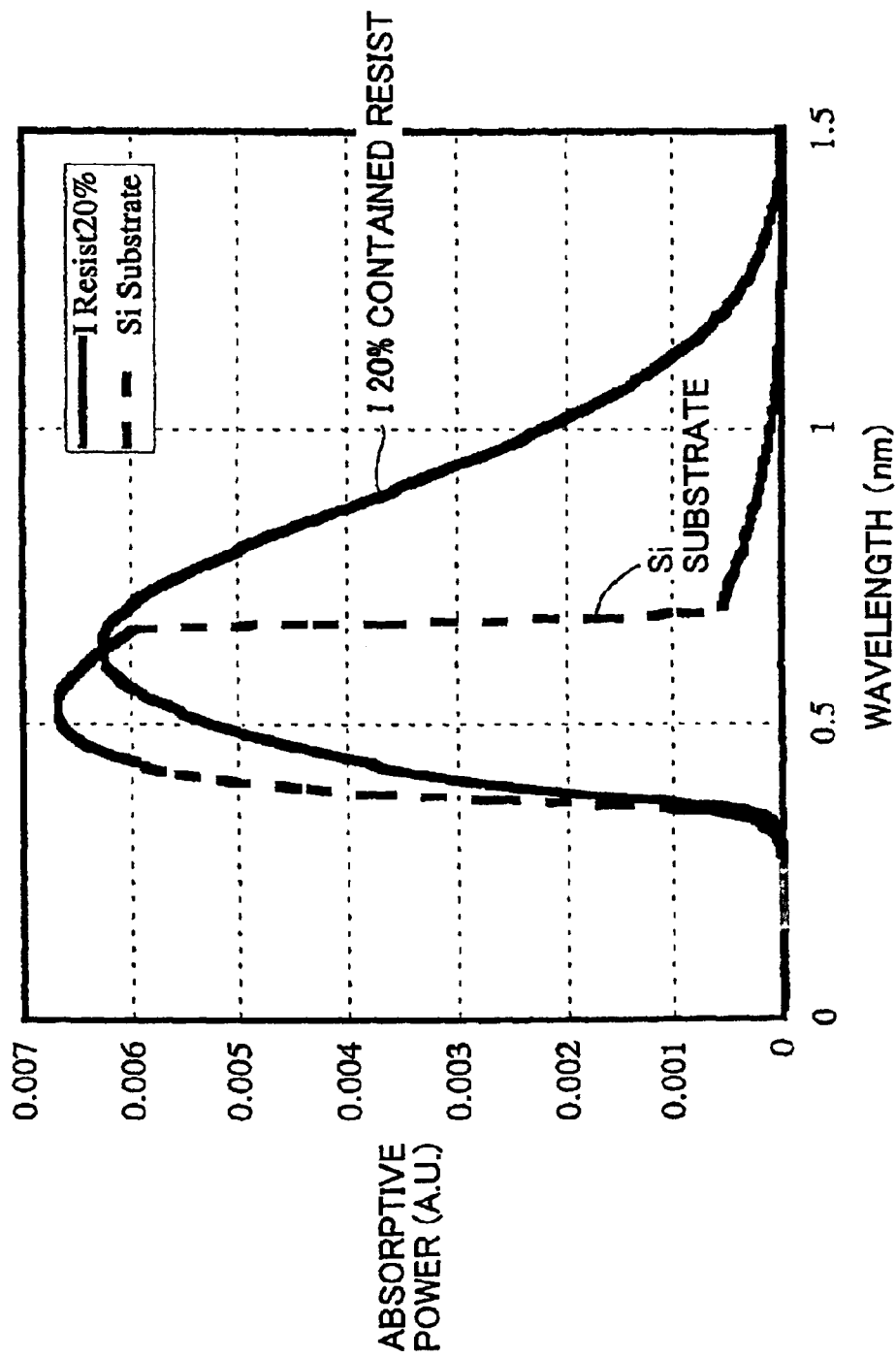
FIG. 15 is a graph showing absorption spectra of an iodine contained resist and a silicon substrate in an X-ray exposure method of a sixth embodiment of the present invention.

In the sixth embodiment of the present invention, the system in the first embodiment is used and iodine (I) is included in a resist instead of chlorine. A content of iodine is in a proportion of 0.2 atoms of iodine to 1 unit of PMMA. A content of iodine at this time is 20%. In FIG. 15, there are shown an absorption spectrum of the resist and a spectrum of secondary electrons emitted from a silicon substrate into the resist. An R value is obtained from the absorption spectra as 0.62.

Figure 16:
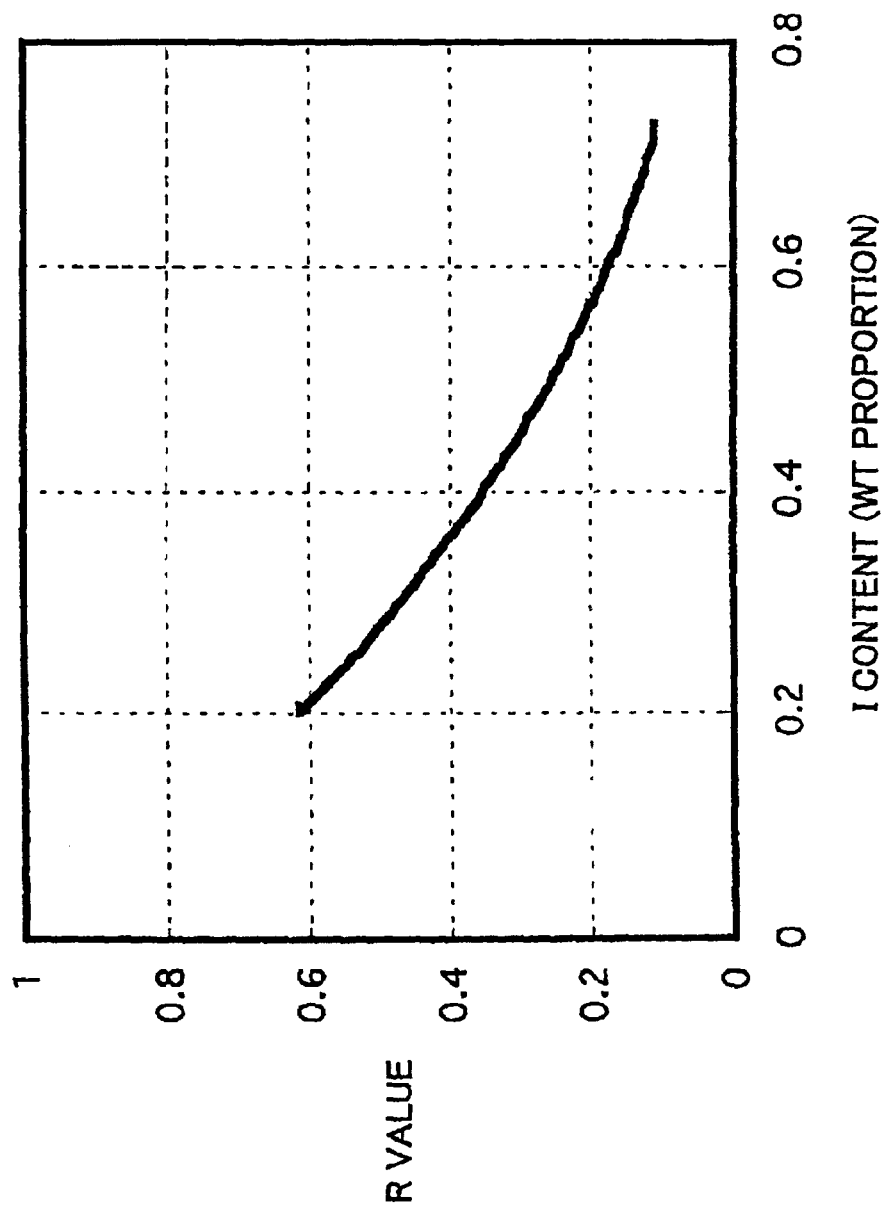
FIG. 16 is a graph showing a relationship between an iodine content in an iodine contained resist and an R value in the X-ray exposure method of a sixth embodiment of the present invention.
Figure 17:
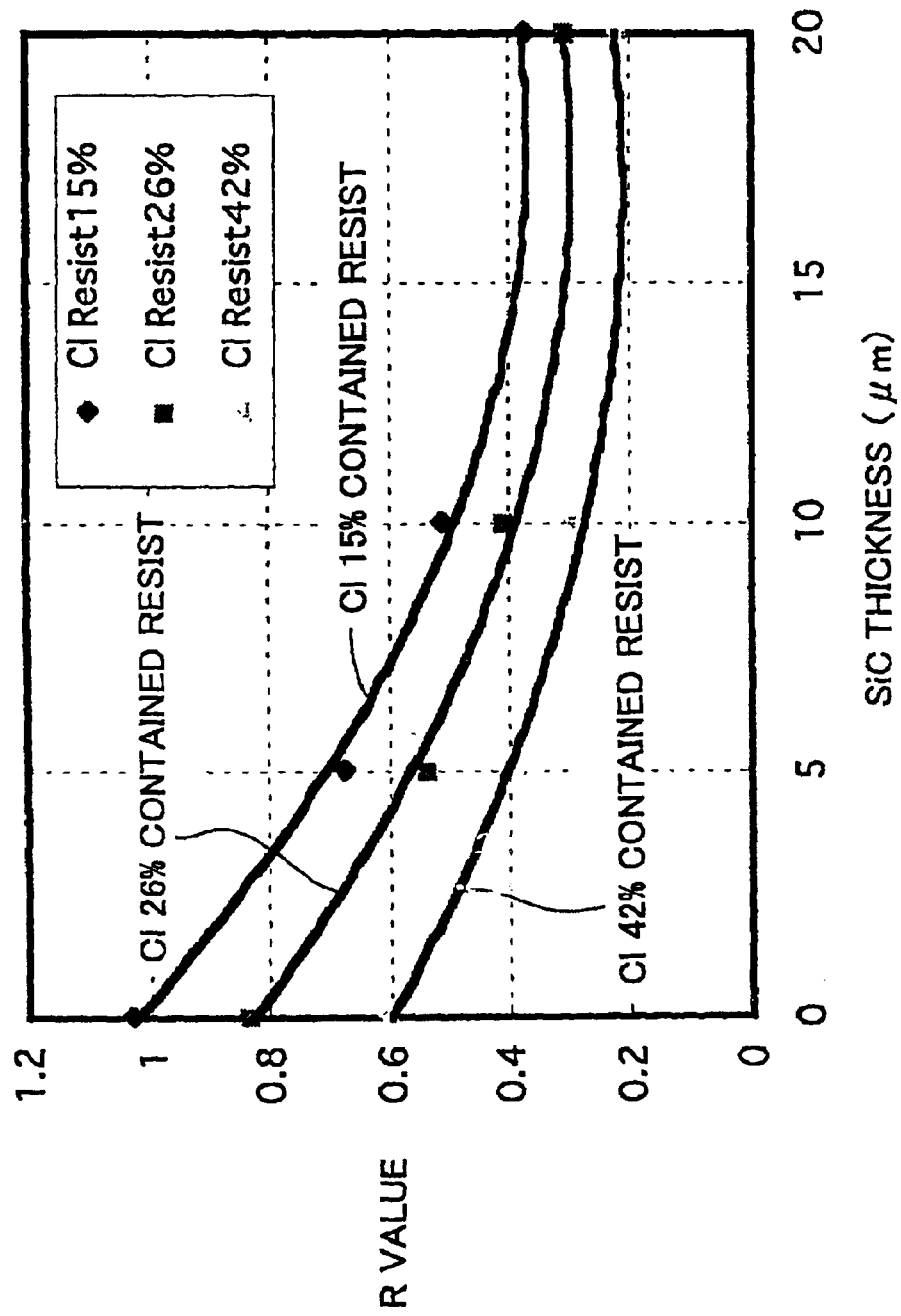
FIG. 17 is a graph showing a relationship between a filter thickness and an R value in each of cases where SIC filters are used in combinations of chlorine contained resists and silicon substrates in an X-ray exposure method of a seventh embodiment of the present invention.
Figure 18:
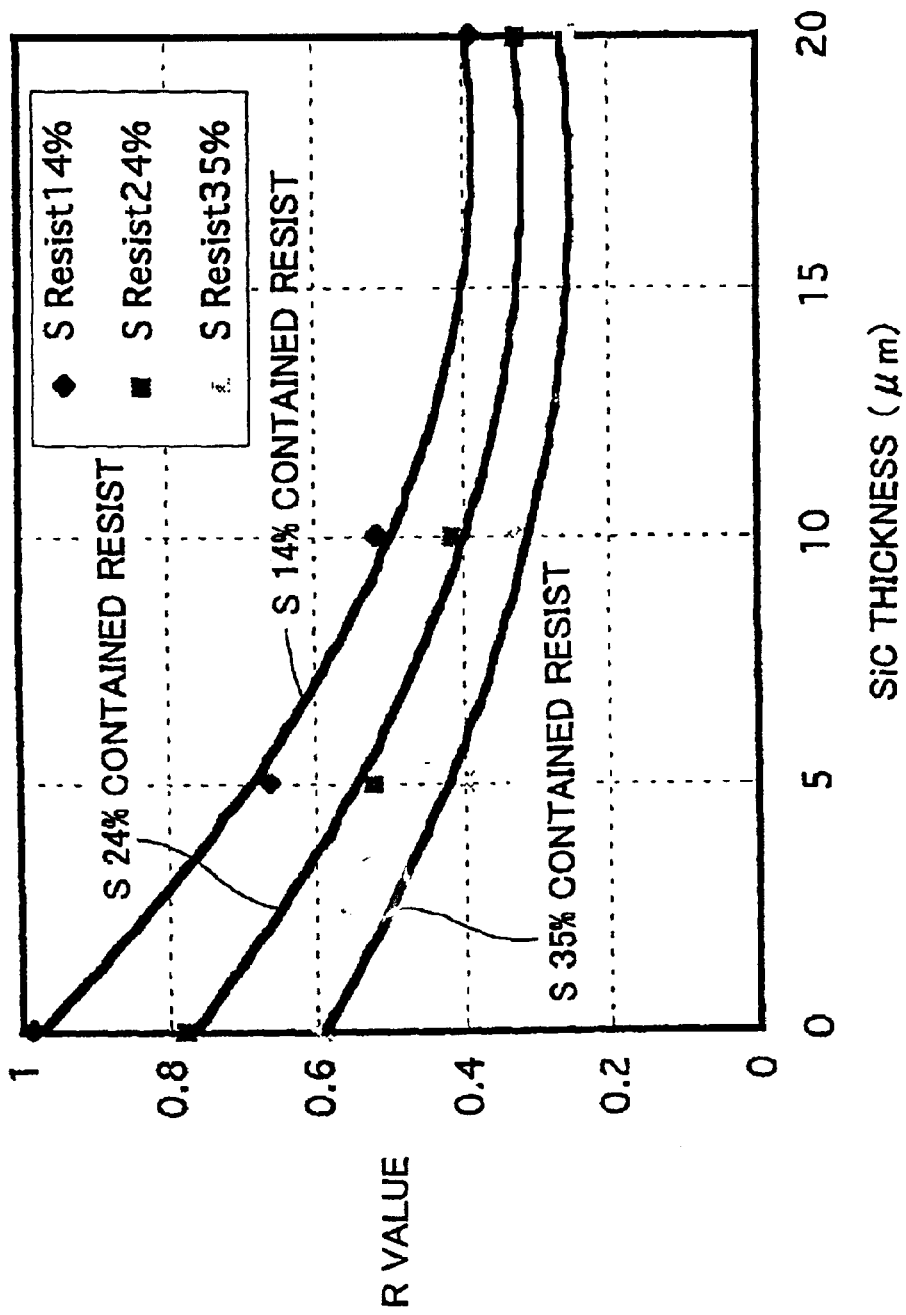
FIG. 18 is a graph showing a relationship between a filter thickness and an R value in each of cases where SIC filters are used in combinations of sulfur contained resists and silicon substrates in the X-ray exposure method of a seventh embodiment of the present invention.
Figure 19:
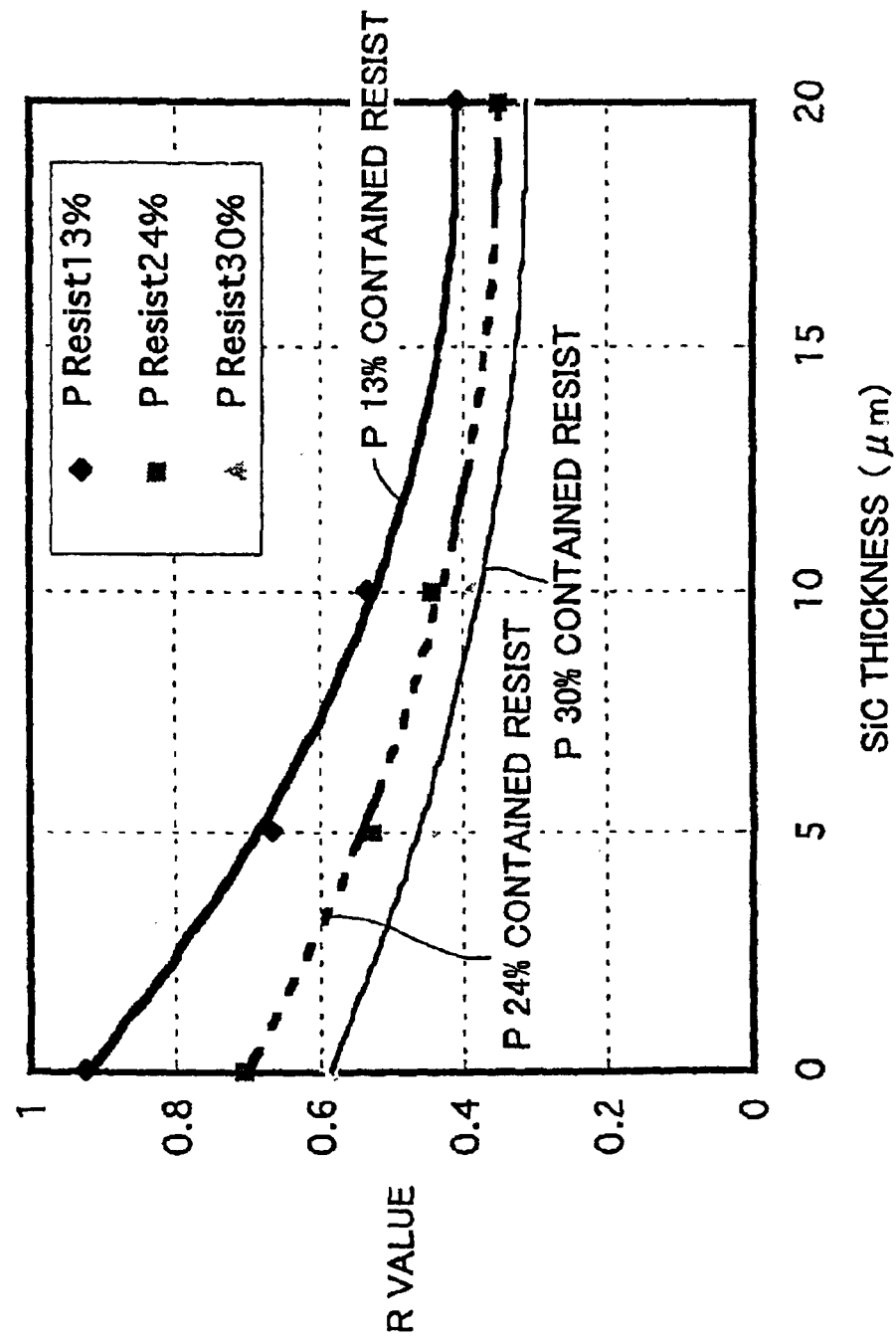
FIG. 19 is a graph showing a relationship between a filter thickness and an R value in each of cases where SIC filters are used in combinations of phosphorus contained resists and silicon substrates in the X-ray exposure method of a seventh embodiment of the present invention.
Figure 20:
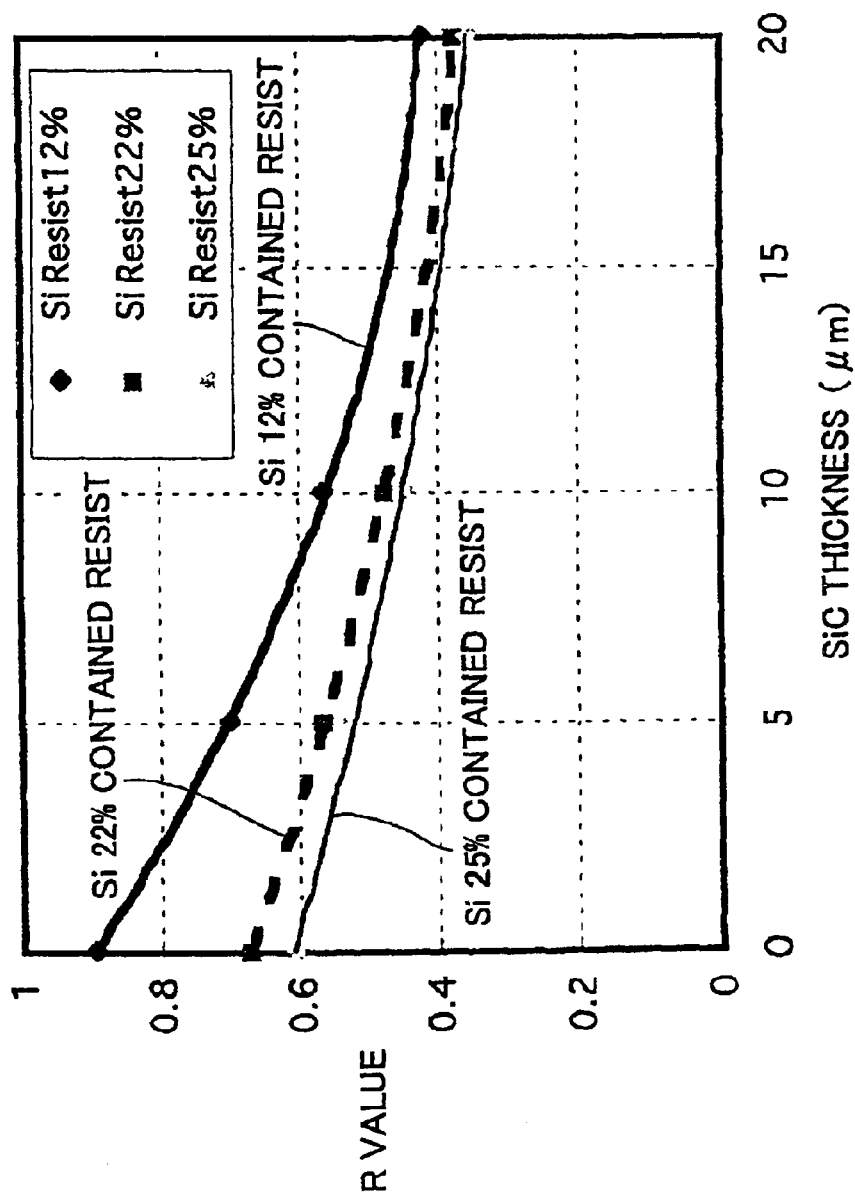
FIG. 20 is a graph showing a relationship between a filter thickness and an R value in each of cases where SIC filters are used in combinations of silicon contained resists and silicon substrates in the X-ray exposure method of a seventh embodiment of the present invention.
Figure 21:
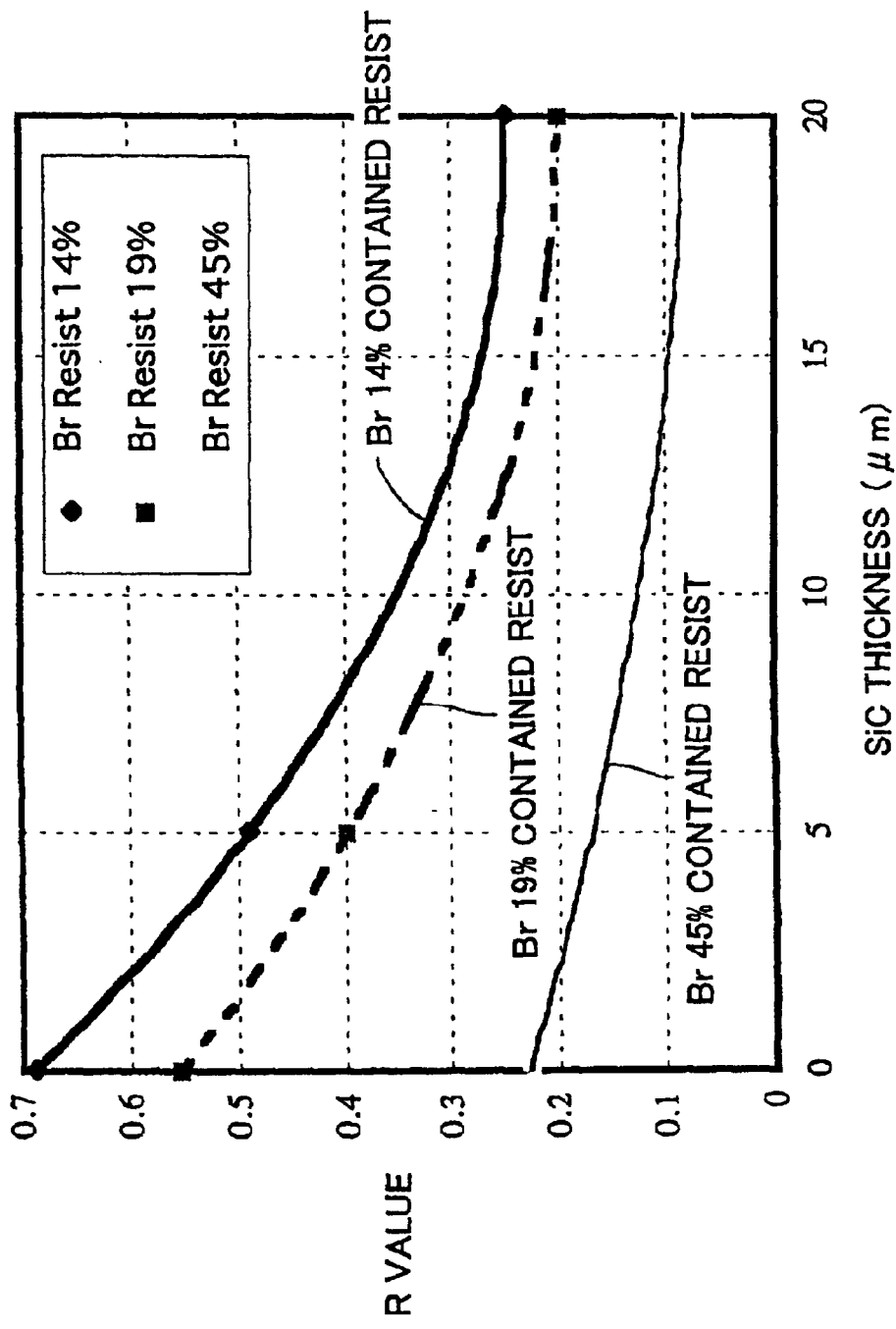
FIG. 21 is a graph showing a relationship between a filter thickness and an R value in each of cases where SIC filters used in combinations of bromine contained resists and silicon substrates in the X-ray exposure method of a seventh embodiment of the present invention.
Figure 22:
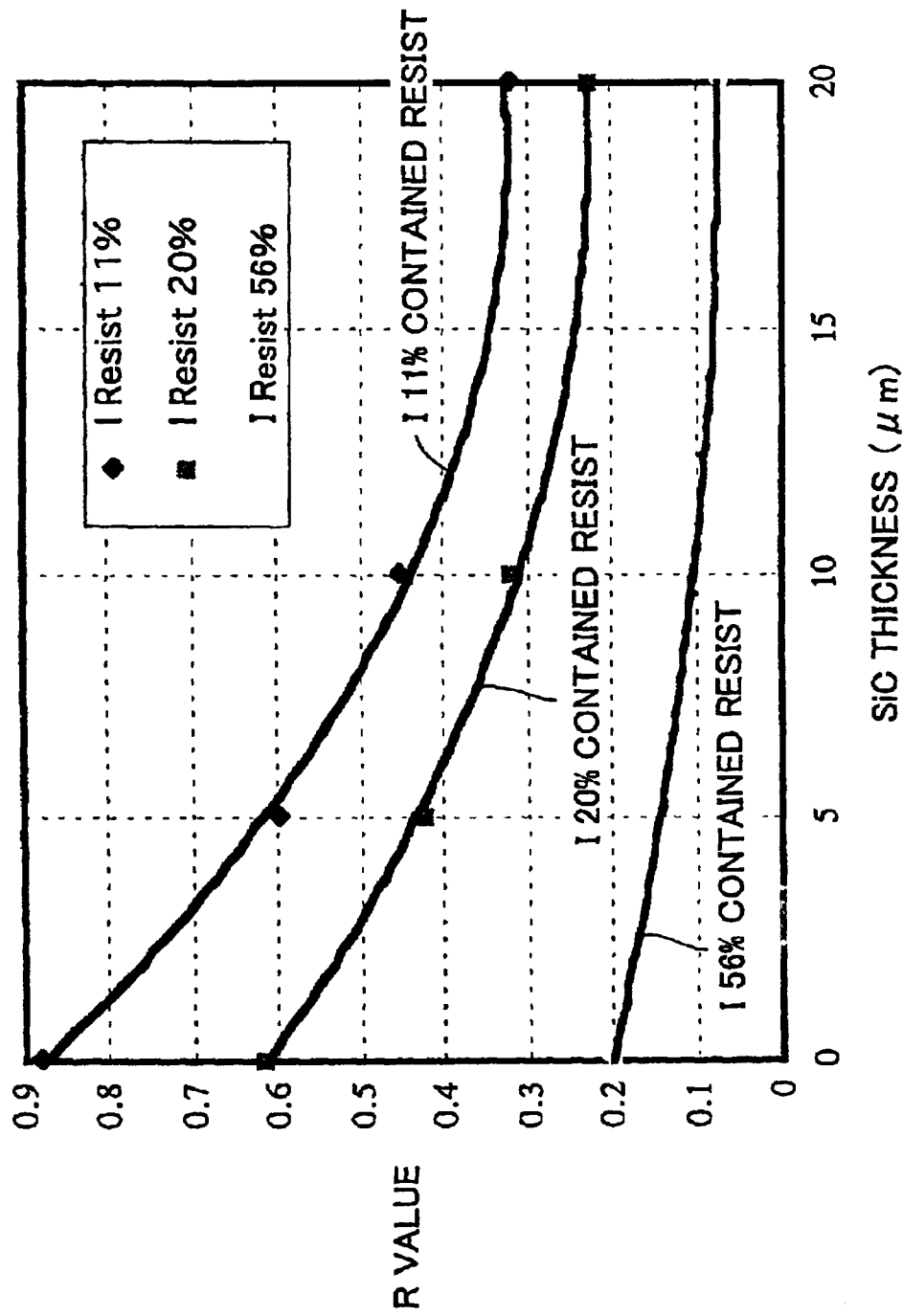
FIG. 22 is a graph showing a relationship between a filter thickness and an R value in each of cases where SIC filters are used in combinations of iodine contained resists and silicon substrates in the X-ray exposure method of a seventh embodiment of the present invention.

Furthermore, FIG. 16 is a graph showing an iodine content dependency of an R value in the same system. According to FIG. 16, an R value decreases monotonously with a content of iodine. An R value assumes 0.6 or less in the range of iodine contents of 22% or higher and no influence of the silicon substrate is problematic.

Seventh Embodiment

In the above first to sixth embodiments, a diamond membrane was used in a transmissive part of a mask. The diamond membrane is transparent to a wavelength range of 0.7 nm or less as is in a case of boron nitride. In the seventh embodiment of the present invention, used instead of the diamond membrane are a mask substrate or a filter, made of a material including silicon such as boron-doped silicon, SiN or SiC opaque to the wavelength range of 0.7 nm or less. By using a membrane or a filter having an absorption band in the wavelength range of 0.7 nm or less as described above, an influence of a silicon substrate can be removed. That is, because of a small amount of X-rays in the wavelength range of 0.7 nm or less capable of being transmitted through the filter or membrane, an amount of X-rays in the shorter wavelength range being transmitted through the resist to reach the substrate is also small. For this reason, a fogging effect caused by secondary electrons from a substrate becomes non-problematical even if the small amount of X-rays is absorbed by the substrate since an amount of generated secondary electrons is small.

In FIGS. 17 to 22, there are shown relationships between an SiC thickness and an R value in cases where resists including different kinds of elements are used with an additional an SiC filter in use.

In a case of a resist including chlorine (FIG. 17), by setting a thickness of an SiC filter of 7 $\mu$m or more, an R value assumes 0.6 or less even if the resist of a chlorine content 15% is used. Therefore, even with a chlorine content of 15%, by using an SiC filter of a thickness of 7 $\mu$m or more, an influence of a silicon substrate can be neglected.

Furthermore, in a case of a resist including sulfur (FIG. 18), by setting a thickness of an SiC filter to 7 $\mu$m or more, an R value can be 0.6 or less even if the resist of a sulfur content 14% is used. Therefore, even in a case where a resist of a sulfur content of 14% is used, by using an SiC filter of a thickness of 7 $\mu$m or more, an influence of a silicon substrate can be neglected.

In a case of a resist including phosphorus (FIG. 19), by setting a thickness of an SiC filter to 7.5 $\mu$m or more, an R value can be 0.6 or less even if the resist of a phosphorus content 13% is used. Therefore, even in a case where a resist of a phosphorus content of 13% is used, by using an SiC filter of a thickness of 7.5 $\mu$m or more, no necessity arise for regarding an influence of a silicon substrate as a problem.

In a case of a resist including silicon (FIG. 20), by setting a thickness of an SiC filter to 8 $\mu$m or more, an R value can be 0.6 or less even with a resist of a silicon content 15%. Therefore, even in a case where a resist of a silicon content of 12% is used, by using an SiC filter of a thickness of 8 $\mu$m or more, an influence of a silicon substrate can be neglected.

In a case of a resist including bromine (FIG. 21), by setting a thickness of an SiC filter to 2.5 $\mu$m or more, an R value can be 0.6 or less even with a resist of a bromine content 14%. Therefore, even in a case where a resist of a bromine content of 14% is used, by using an SiC filter of a thickness of 2.5 $\mu$m or more, an influence of a silicon substrate can be suppressed.

In a case of a resist including iodine (FIG. 22), by setting a thickness of an SiC filter to 5 $\mu$m or more, an R value can be 0.6 or less even with a resist of an iodine content 11%. Therefore, even in a case where a resist of an iodine content of 11% is used, by using an SiC filter of a thickness of 5 $\mu$m or more, no necessity arise for regarding an influence of a silicon substrate as a problem.

In a case where a mask membrane or a filter including silicon is used, by increasing a thickness of a membrane without respect to a kind of an element included in a resist, an R value can be 0.6 or less by reducing a content of any of elements. As a result, a resist capable of reducing an R value to 0.6 or less can be prepared with ease.

Eighth Embodiment

In the eighth embodiment of the present invention, as a radiation source, a radiation emitted from a radiation generator with a critical wavelength 0.846 nm is used. The radiation is reflected twice using nickel mirrors with an angle of oblique incidence 1 degree and transmitted through a beryllium window with a thickness 20 $\mu$m and then directed to a mask surface of a diamond membrane with a thickness 2 $\mu$m for illumination. In this embodiment, with the use of this system, a pattern is formed on an aluminum substrate.

Figure 23:
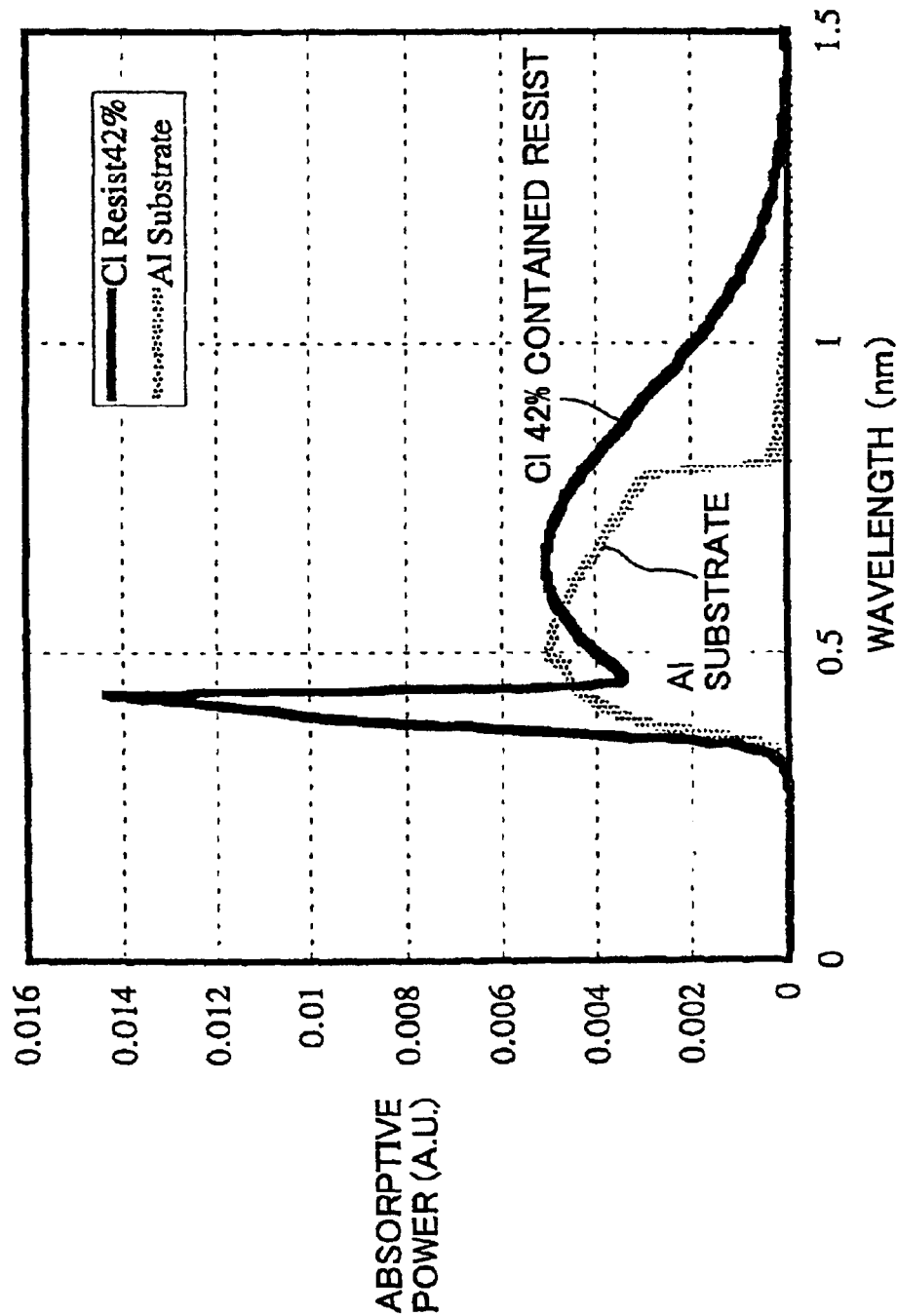
FIG. 23 is a graph showing absorption spectra of a chlorine contained resist and an aluminum substrate in an X-ray exposure method of an eighth embodiment of the present invention.

Chlorine is used as an element included in a resist and mixed with PMMA in proportion of 2 atoms of chlorine to 1 unit of PMMA (C:H:O=5:8:2). A content of chlorine in the resist at this time is 42 wt %. In FIG. 23, there are shown a spectrum absorbed in the resist and a spectrum of secondary electrons emitted from an aluminum substrate into the resist. Both correspond to the denominator of the evaluation formula (1) and the numerator thereof. From the spectra, an R value is obtained as 0.54, allowing to determine that an influence of the aluminum substrate is not problematical.

Figure 24:
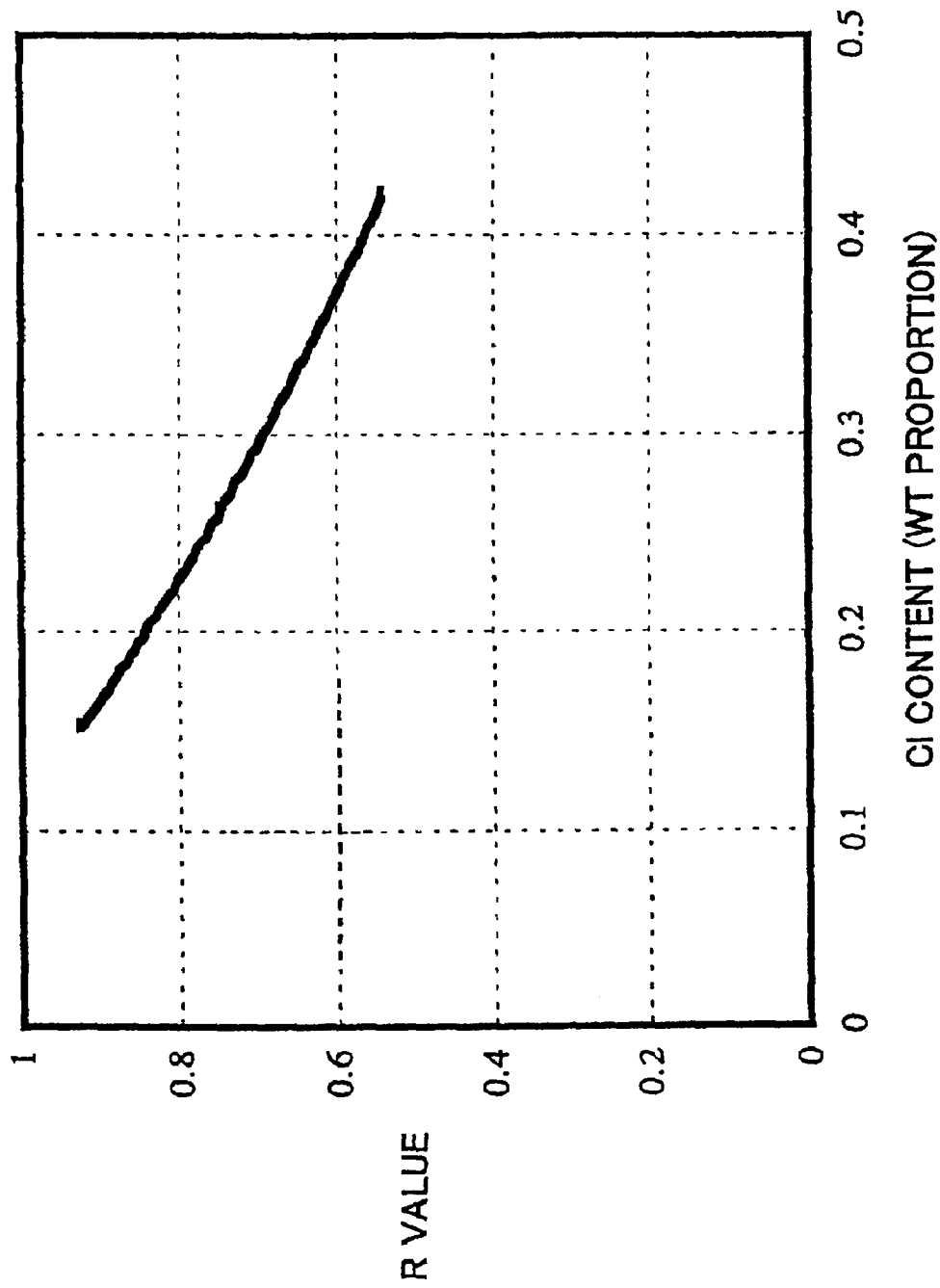
FIG. 24 is a graph showing a relationship between a chlorine content in a chlorine contained resist and an R value in the X-ray exposure method of an eighth embodiment of the present invention.

Furthermore, FIG. 24 is a graph showing a chlorine content dependency of an R value in the same system. An R value decreases monotonously with a content of chlorine and shows a value of 0.6 or less in the range of chlorine contents of 38% or more. Therefore, by setting a content of chlorine in the range, an influence of an aluminum substrate can be neglected.

Ninth Embodiment

Figure 25:
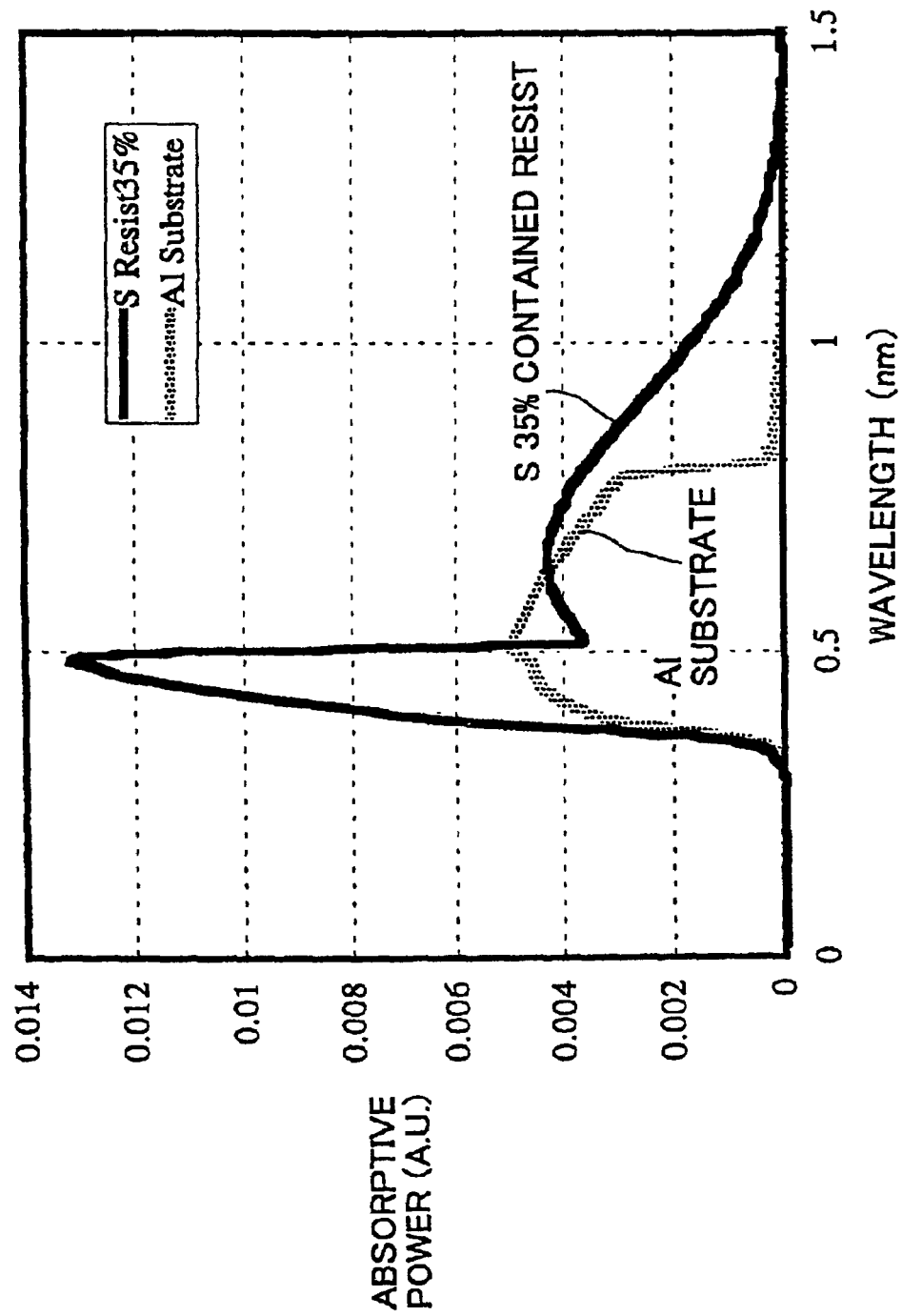
FIG. 25 is a graph showing absorption spectra of a sulfur contained resist and an aluminum substrate in an X-ray exposure method of a ninth embodiment of the present invention.

In the ninth embodiment of the present invention, sulfur is used as an element included in a resist. Sulfur is mixed with PMMA in proportion of 1.7 atoms of sulfur to 1 unit of PMMA. A content of sulfur in the resist at this time is 35 wt %. In FIG. 25, there are shown a spectrum absorbed in the resist and a spectrum of secondary electrons emitted from an aluminum substrate into the resist. From the spectra, an R value is obtained as 0.54 and no influence of secondary electrons from the aluminum substrate is problematic.

Figure 26:
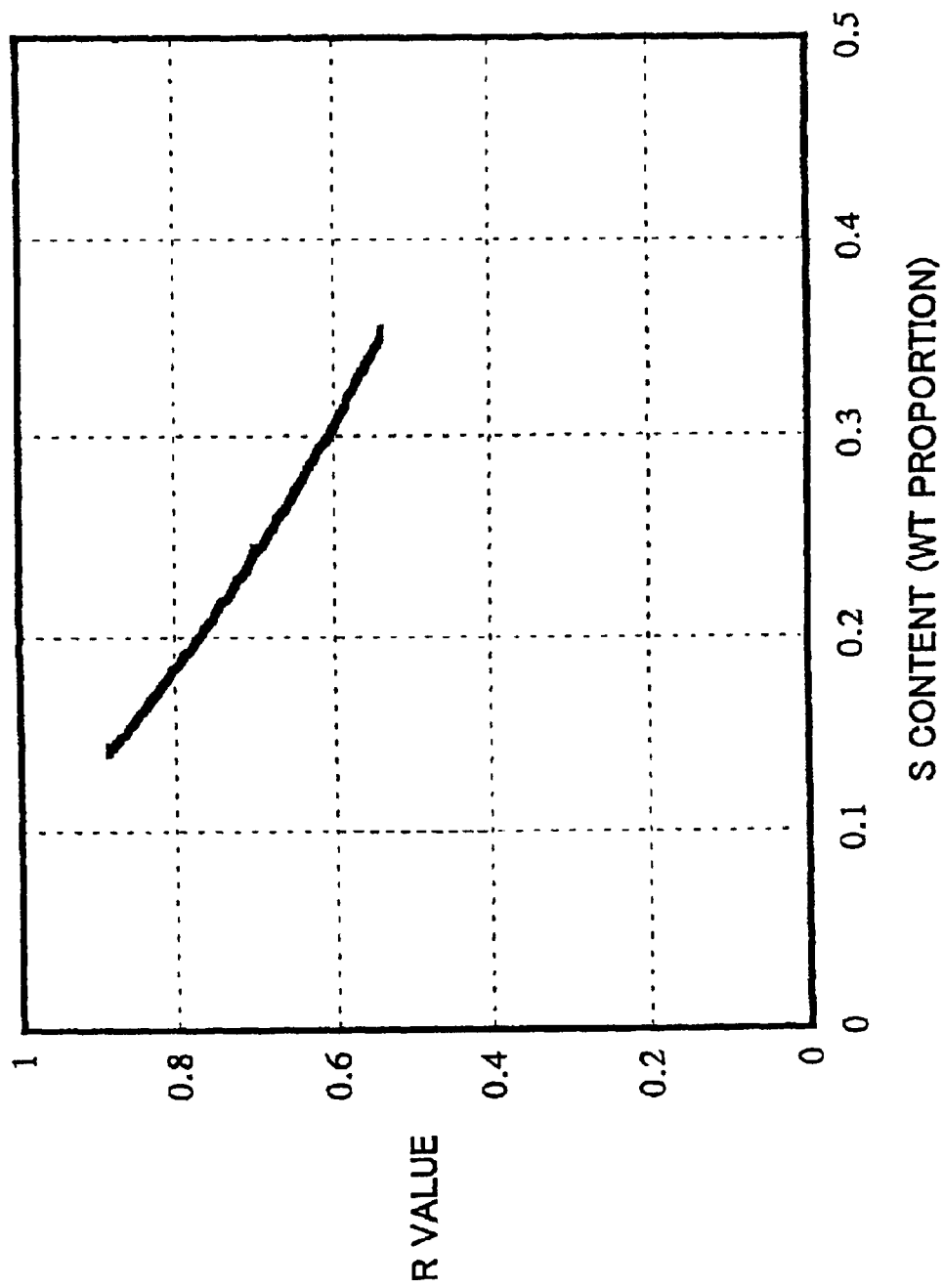
FIG. 26 is a graph showing a relationship between a sulfur content in a sulfur contained resist and an R value in the X-ray exposure method of a ninth embodiment of the present invention.

Furthermore, FIG. 26 is a graph showing a sulfur content dependency of an R value in the same system. According to FIG. 26, an R value decreases monotonously with a content of sulfur and shows a value of 0.6 or less in the range of sulfur contents of 31% or more. Therefore, by setting conditions such that an R value assumes 0.6 or less, an influence of secondary electrons from an aluminum substrate can be neglected.

Tenth Embodiment

Figure 27:
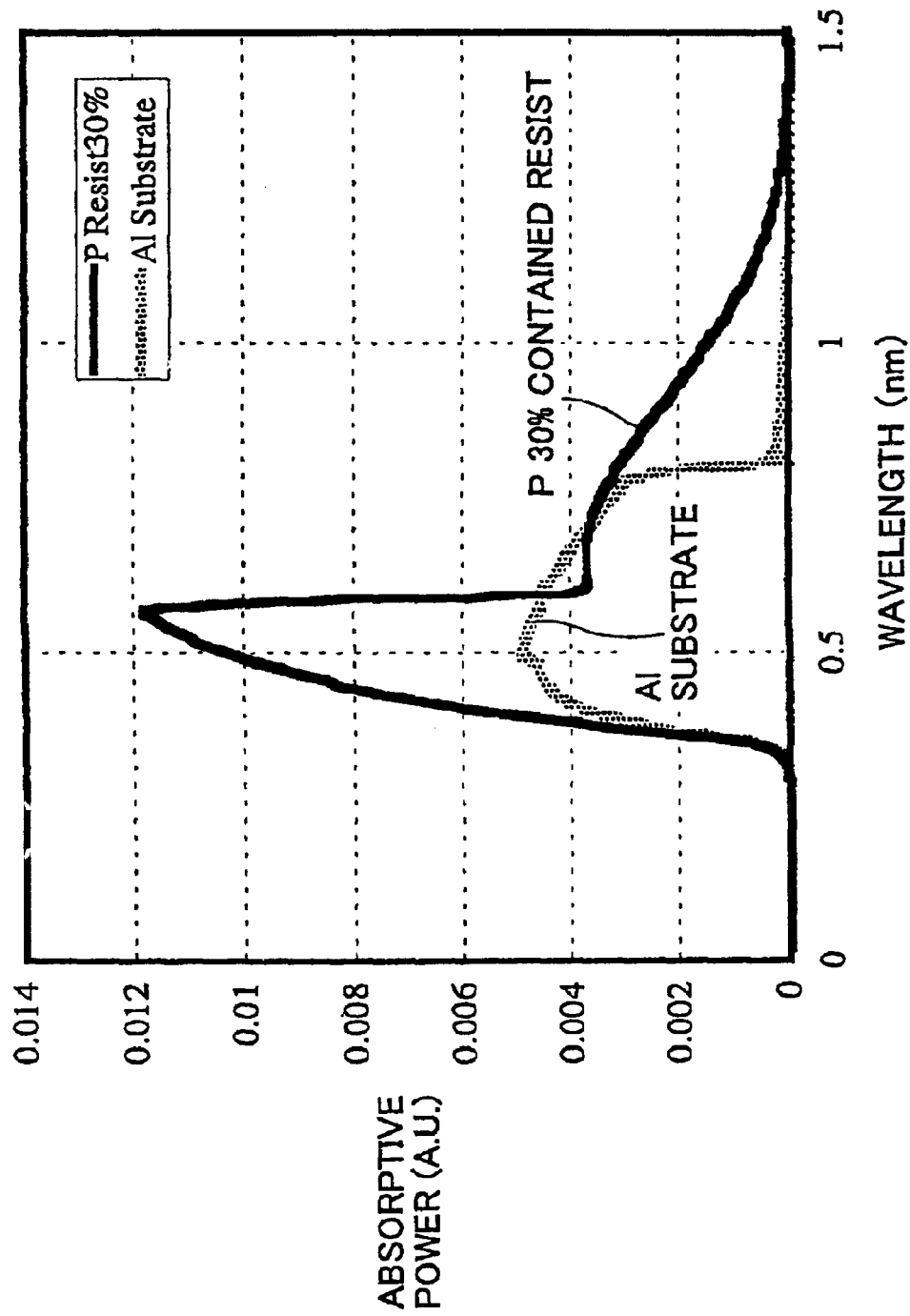
FIG. 27 is a graph showing absorption spectra of a phosphorus contained resist and an aluminum substrate in an X-ray exposure method of a tenth embodiment of the present invention.

In the tenth embodiment of the present invention, a resin used is a phosphorus contained resist obtained by mixing phosphorus into PMMA in a proportion of 1.4 atoms of phosphorus to 1 unit of PMMA in the eighth embodiment. A content of phosphorus in the resist at this time is 30 wt %. In FIG. 27, there are shown a spectrum absorbed in the resist and a spectrum of secondary electrons emitted from a silicon substrate into the resist. From the defining formula for an R value, an R value assumes 0.54 in exposure wavelengths, allowing to determine that an influence of secondary electrons from the silicon substrate is non-problematic.

Figure 28:
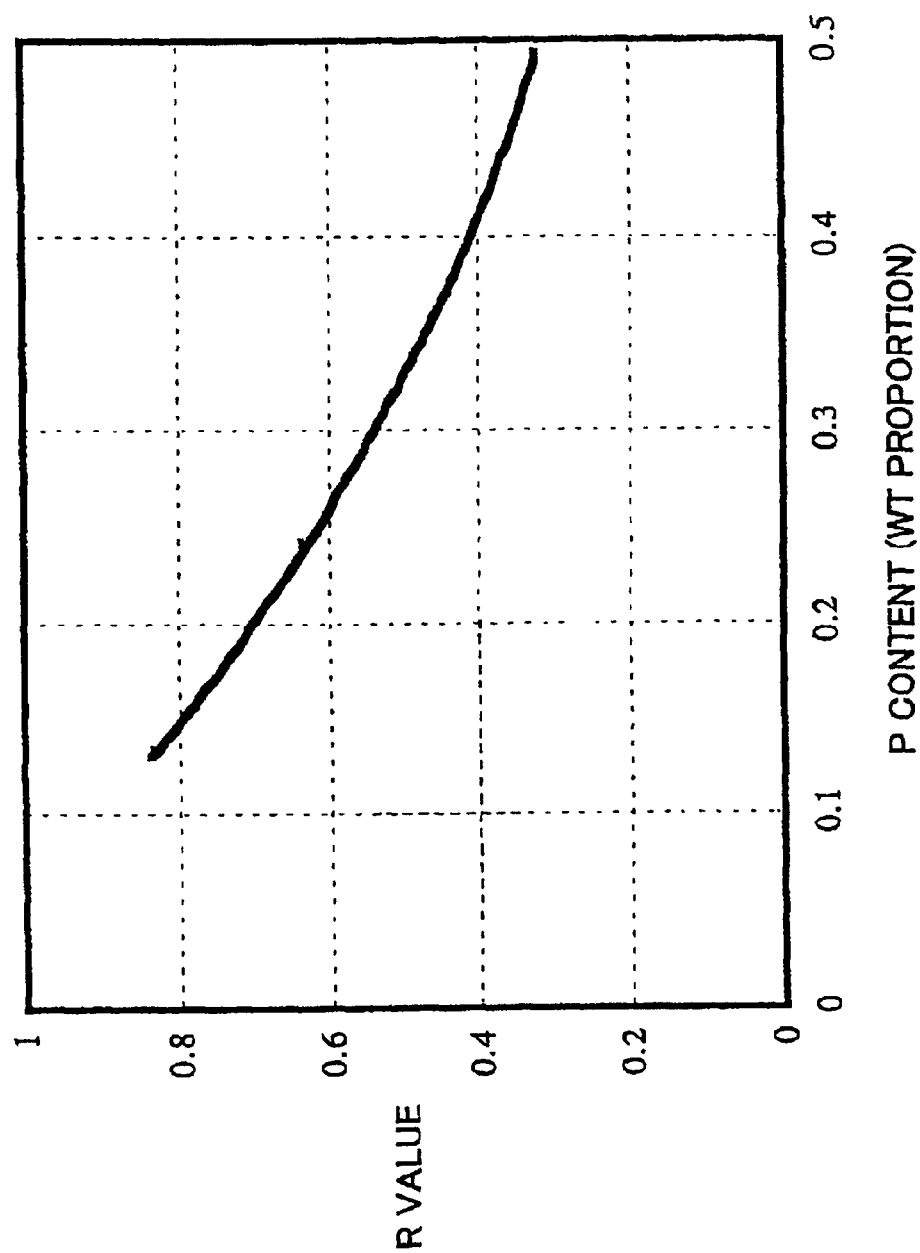
FIG. 28 is a graph showing a relationship between a phosphorus content in a phosphorus contained resist and an R value in the X-ray exposure method of a tenth embodiment of the present invention.

Furthermore, FIG. 28 is a graph showing a phosphorus content dependency of an R value in the same system. According to FIG. 28, an R value decreases monotonously with a content of phosphorus and shows a value of 0.6 or less in the range of phosphorus contents of 26% or more and an influence of secondary electrons from a silicon substrate can be neglected.

Eleventh Embodiment

Figure 29:
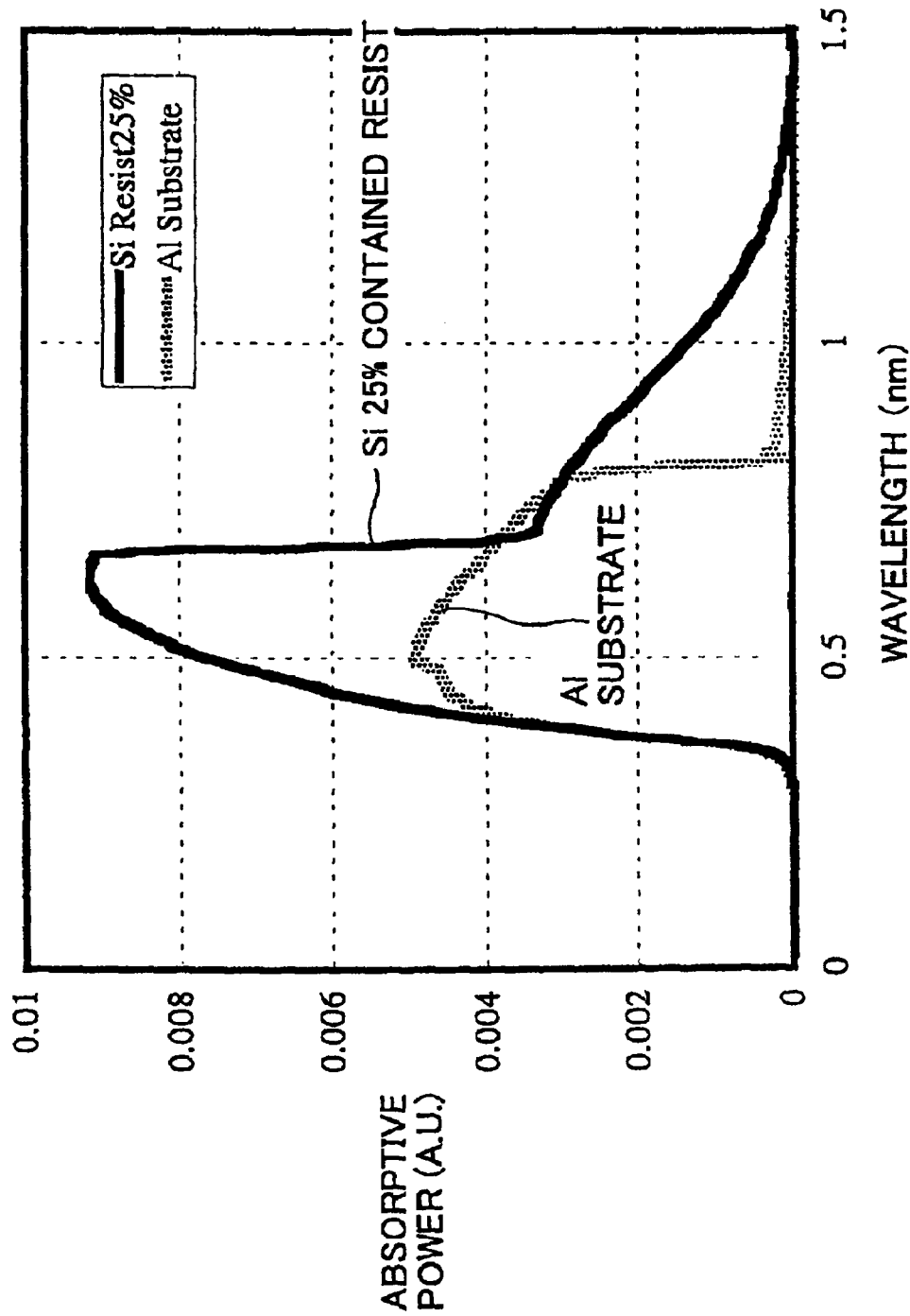
FIG. 29 is a graph showing absorption spectra of a silicon contained resist and an aluminum substrate in an X-ray exposure method of an eleventh embodiment of the present invention.

In the eleventh embodiment of the present invention, a resin used is a silicon contained resist obtained by mixing silicon into PMMA in a proportion of 1.2 atoms of silicon to 1 unit of PMMA in the eighth embodiment. A content of silicon in the resist at this time is 25 wt %. In FIG. 29, there are shown a spectrum absorbed in the resist and a spectrum of secondary electrons emitted from a silicon substrate into the resist. An R value in exposure wavelengths is obtained as 0.55, and it is understood that an influence of secondary electrons from the silicon substrate is non-problematic.

Figure 30:
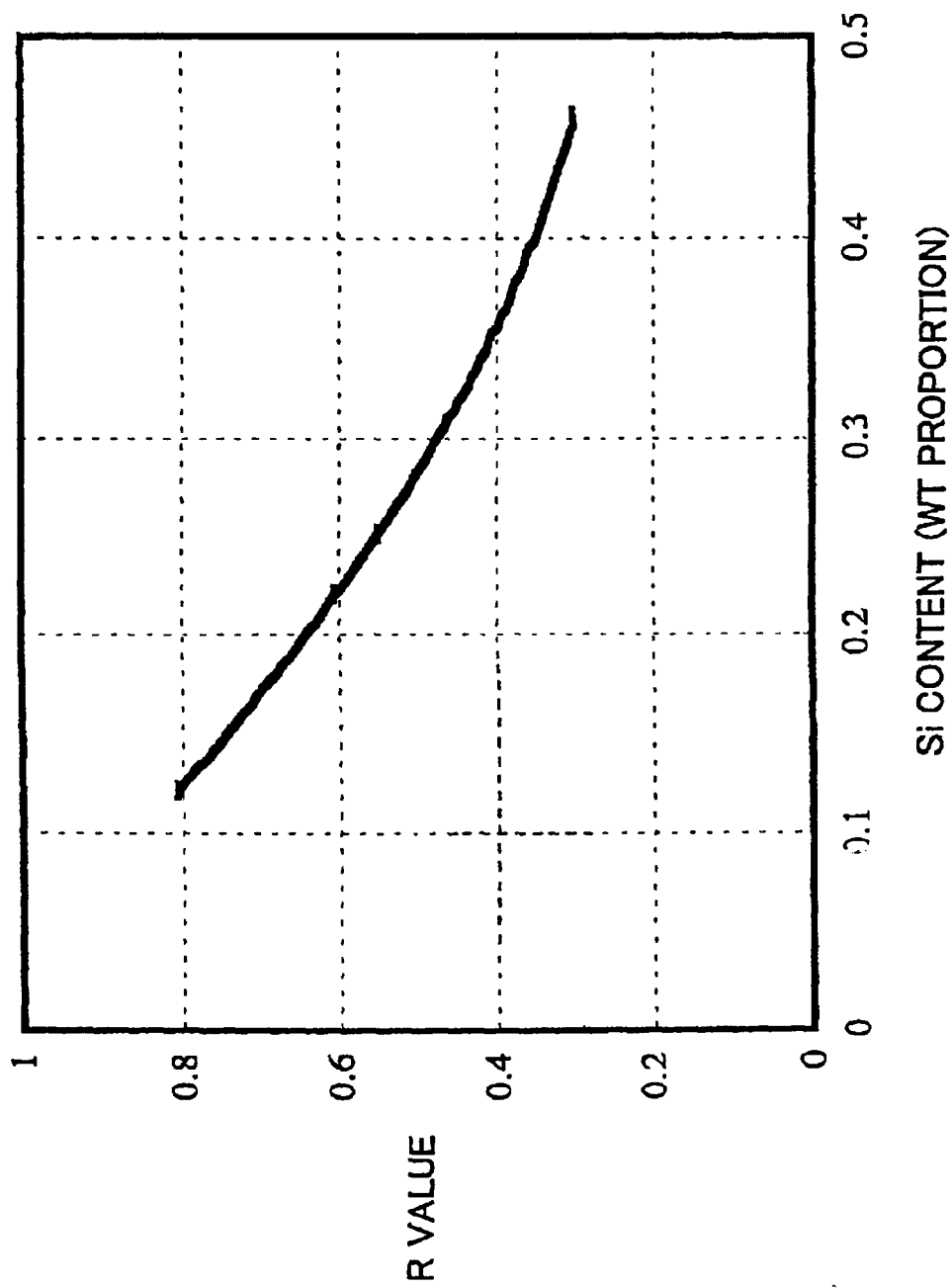
FIG. 30 is a graph showing a relationship between a silicon content in a silicon contained resist and an R value in the X-ray exposure method of an eleventh embodiment of the present invention.

Furthermore, FIG. 30 is a graph showing a silicon content dependency of an R value in the same system. An R value decreases monotonously with a content of silicon and can be 0.6 or less in the range of silicon contents of 23% or more and an influence of secondary electrons from a silicon substrate is non-problematic.

Twelfth Embodiment

Figure 31:
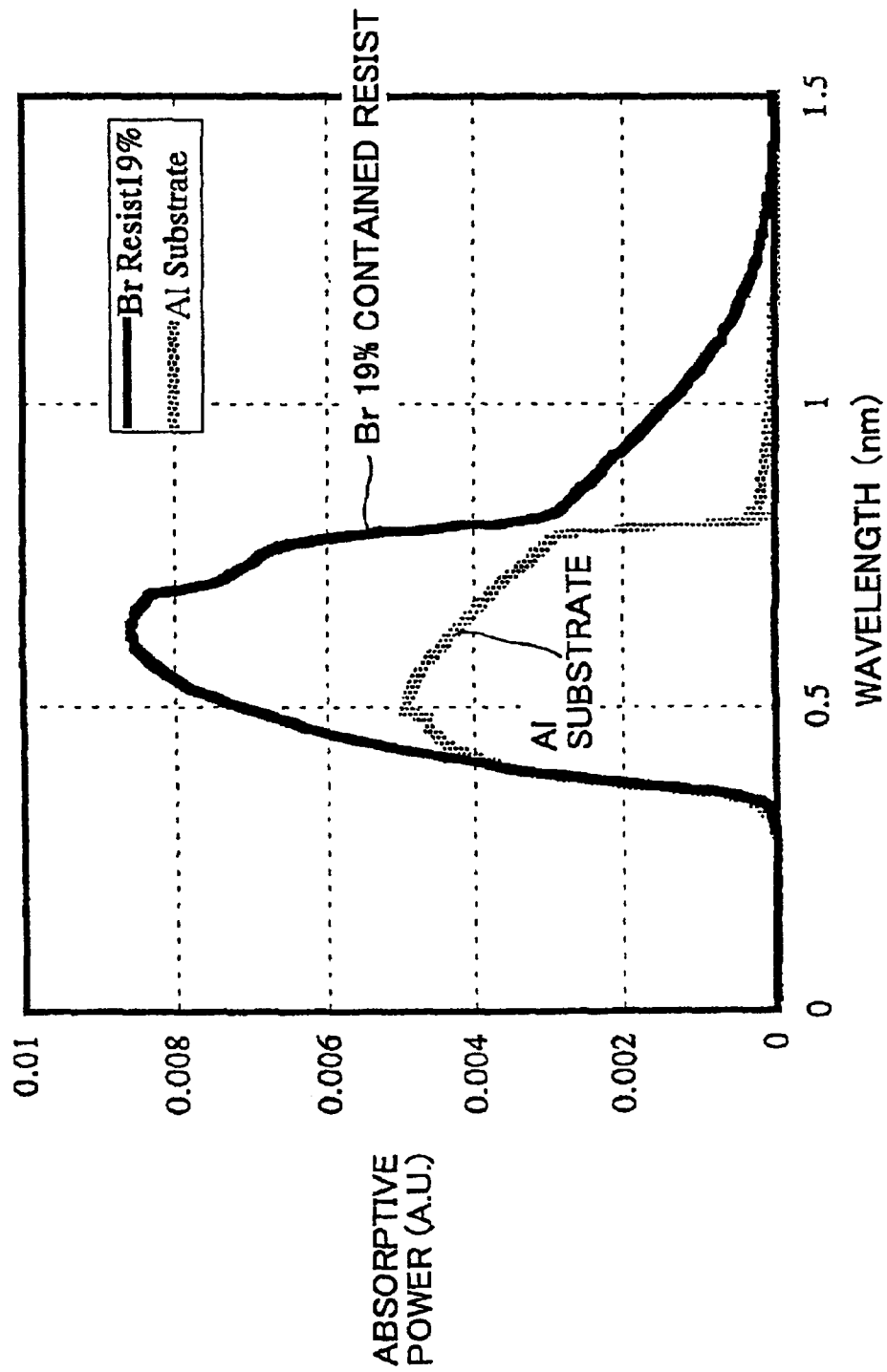
FIG. 31 is a graph showing absorption spectra of a bromine contained resist and an aluminum substrate in an X-ray exposure method of a twelfth embodiment of the present invention.

In the twelfth embodiment of the present invention, a resist used is a bromine contained resist obtained by mixing bromine into PUMA in a proportion of 0.3 atoms of bromine to 1 unit of PMMA in the eighth embodiment. A content of bromine in the resist at this time is 19 wt %. In FIG. 31, there are shown a spectrum absorbed in the resist and a spectrum of secondary electrons emitted from an aluminum substrate into the resist. From the defining formula for an R value, an R value is obtained as 0.50 in exposure wavelengths and it is understood that an influence of secondary electrons from an aluminum substrate is non-problematic.

Figure 32:
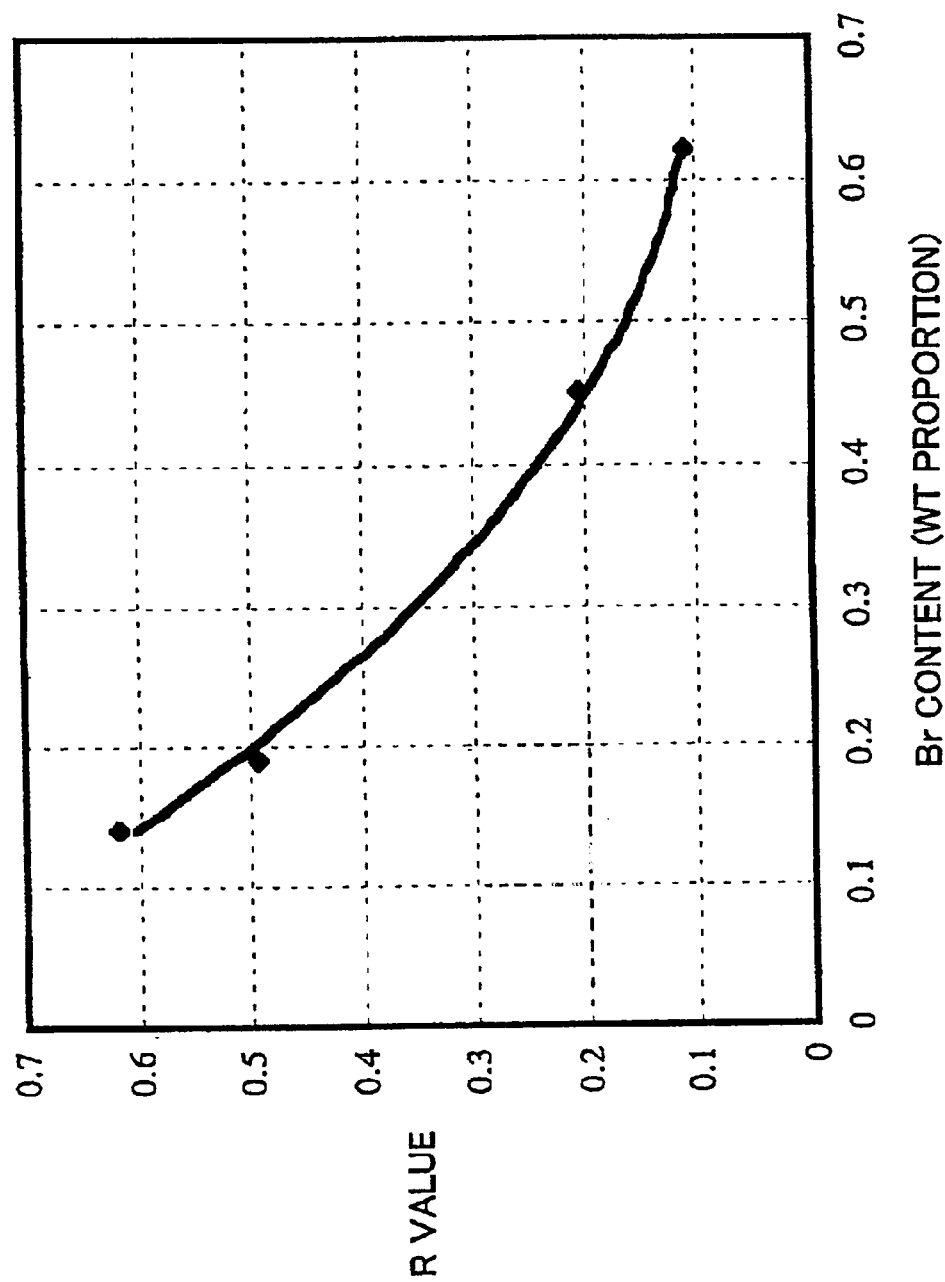
FIG. 32 is a graph showing a relationship between a bromine content in a bromine contained resist and an R value in the X-ray exposure method of a twelfth embodiment of the present invention.

Furthermore, FIG. 32 is a graph showing a bromine content dependency of an R value in the same system. According to FIG. 32, an R value decreases monotonously with a content of bromine and assumes 0.6 or less in the range of bromine contents of 15% or more and an influence of secondary electrons from an aluminum substrate is non-problematic.

Thirteenth Embodiment

Figure 33:
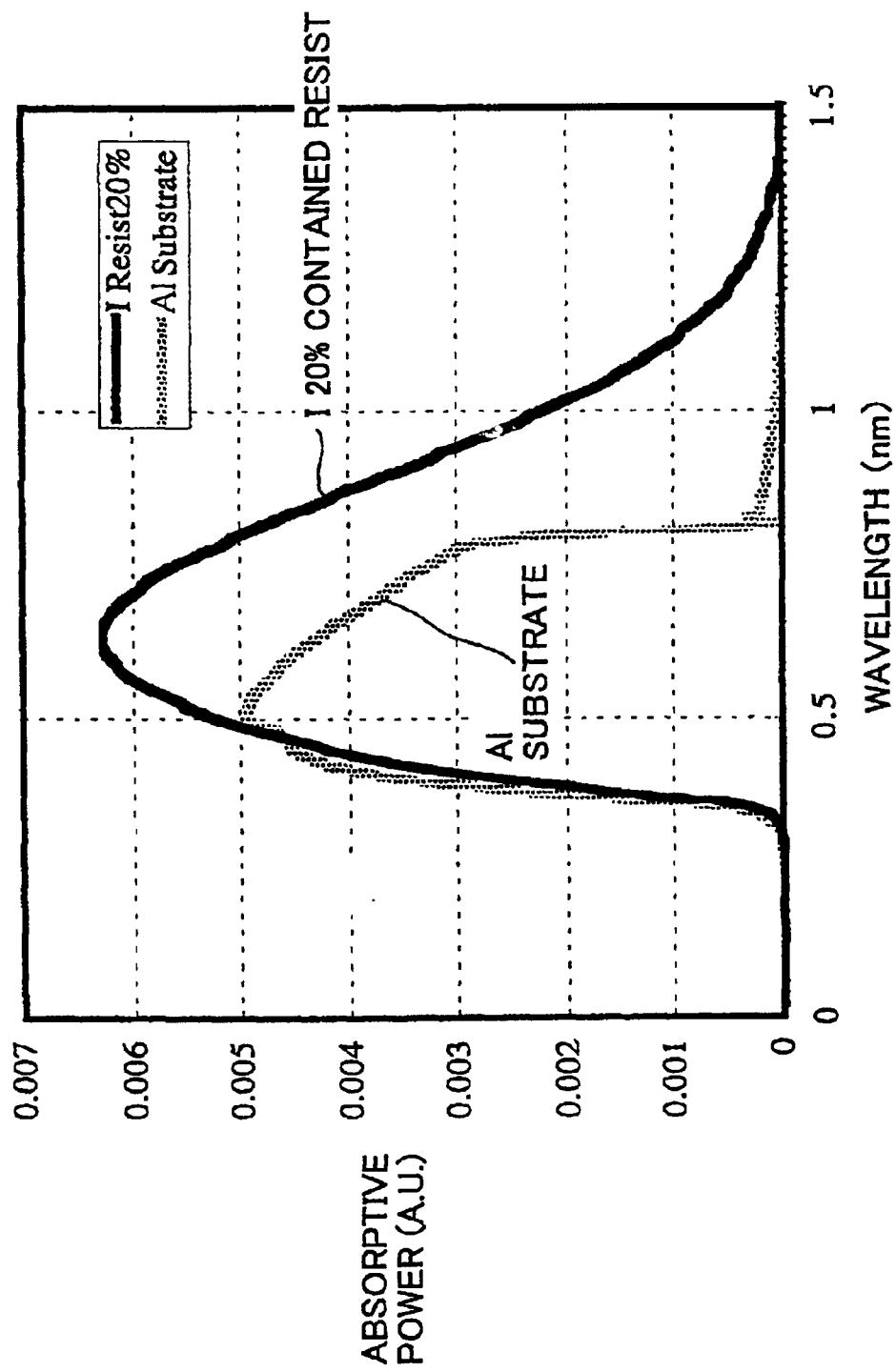
FIG. 33 is a graph showing absorption spectra of an iodine contained resist and an aluminum substrate in an X-ray exposure method of a thirteenth embodiment of the present invention.

In the thirteenth embodiment of the present invention, a resin used is an iodine contained resist obtained by mixing iodine into PMMA in a proportion of 0.2 atoms of iodine to 1 unit of PMMA in the eighth embodiment. A content of iodine in the resist at this time is 20 wt %. In FIG. 33, there are shown a spectrum absorbed in the resist and a spectrum of secondary electrons emitted from an aluminum substrate into the resist. From the definition of an R value, an R value is obtained as 0.55, and it is understood that an influence of secondary electrons from an aluminum substrate is non-problematic.

Figure 34:
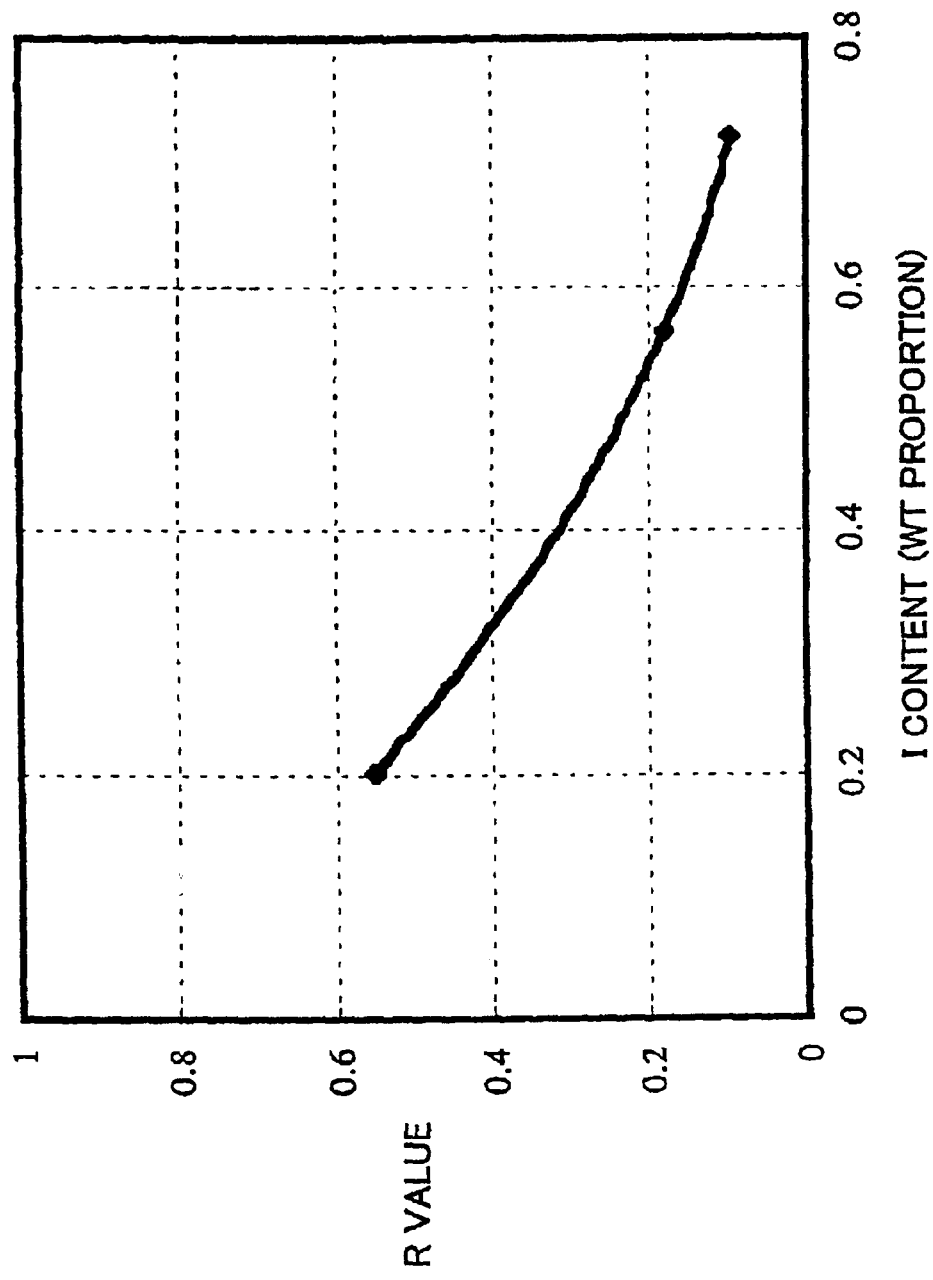
FIG. 34 is a graph showing a relationship between an iodine content in an iodine contained resist and an R value in the X-ray exposure method of a thirteenth embodiment of the present invention.
Figure 35:
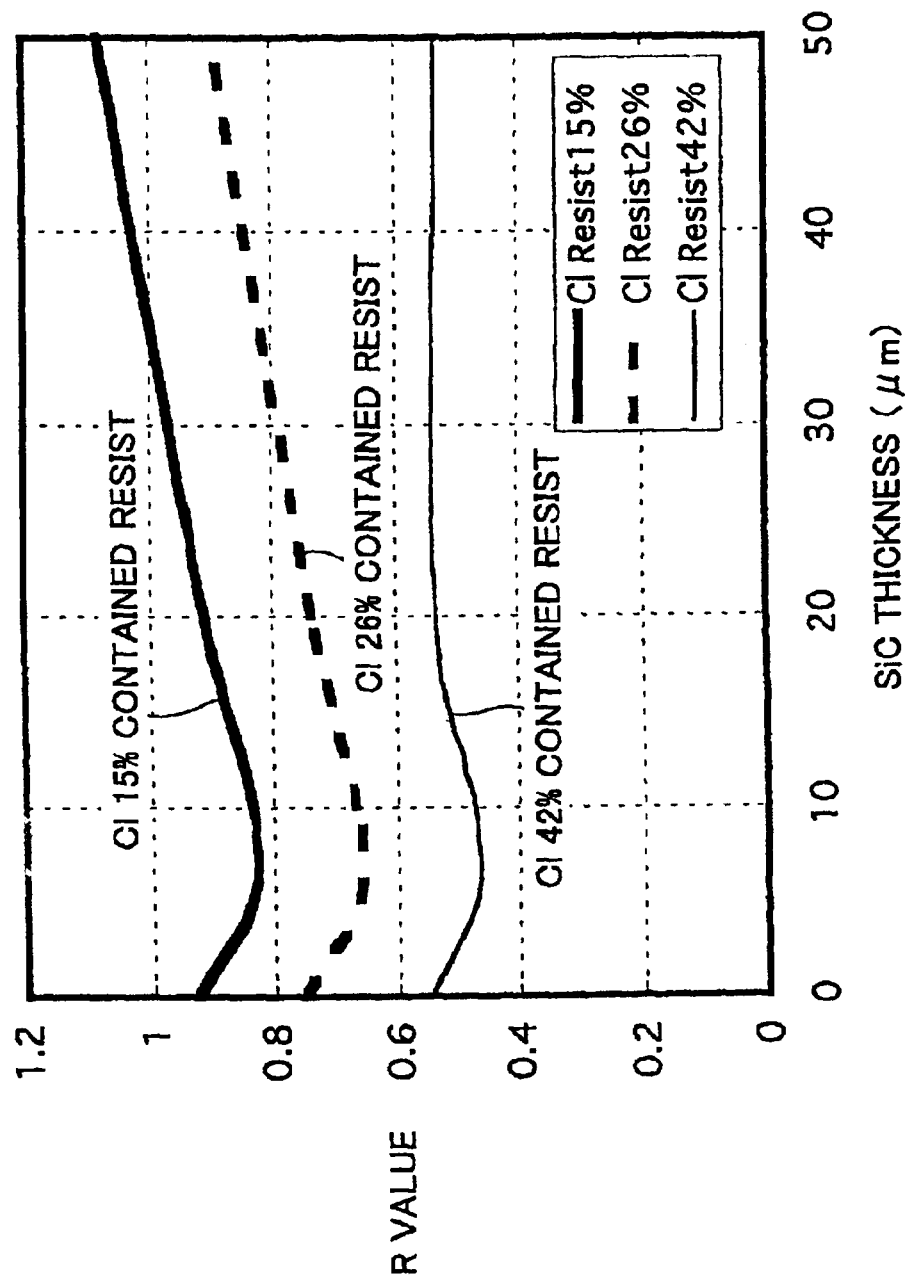
FIG. 35 is a graph showing a relationship between a filter thickness and an R value in each of cases where SIC filters are used in combinations of chlorine contained resists and aluminum substrates in an X-ray exposure method of a fourteenth embodiment of the present invention.
Figure 36:
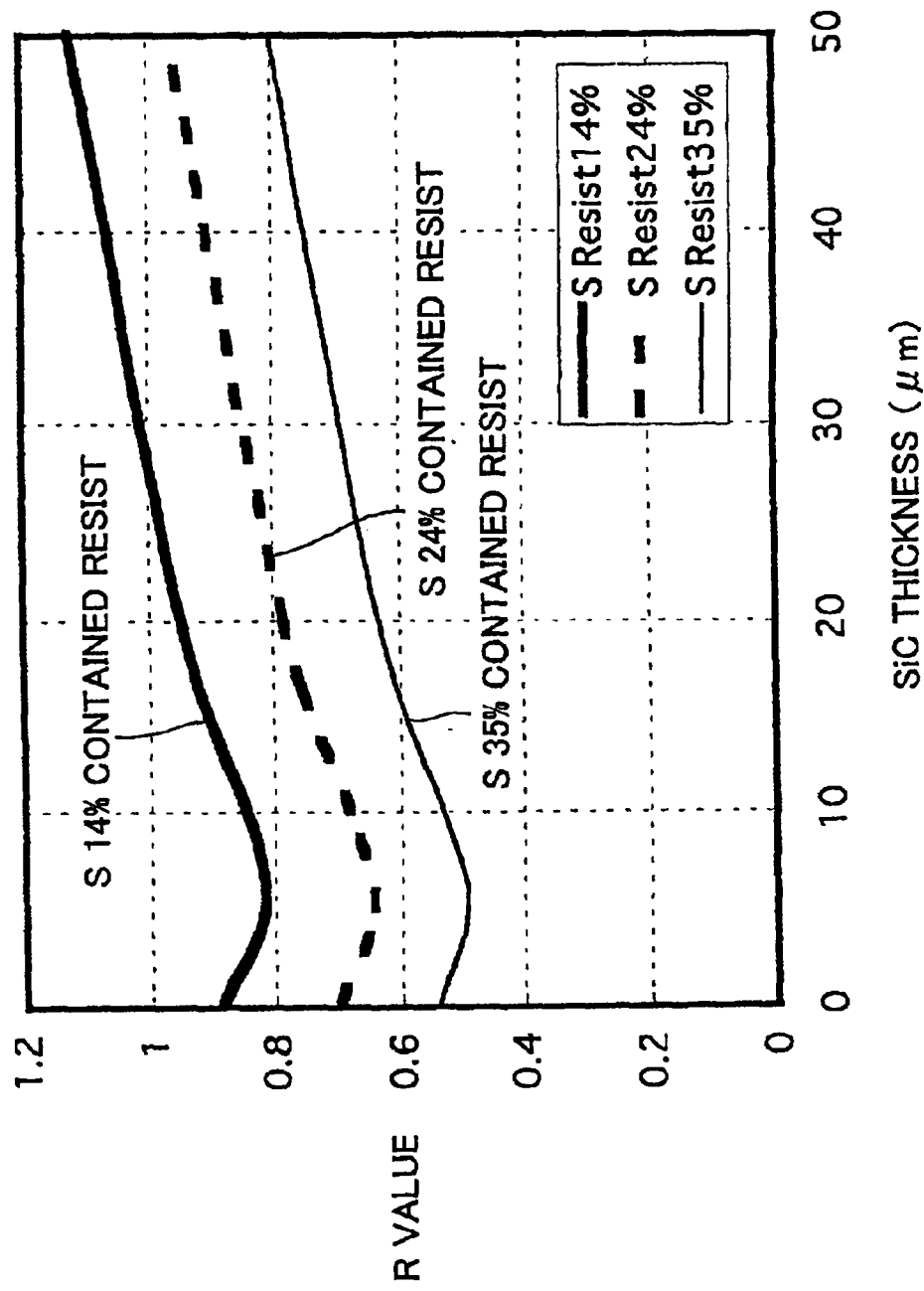
FIG. 36 is a graph showing a relationship between a filter thickness and an R value in each of cases where SIC filters are used in a combination of sulfur contained resists and aluminum substrates in the X-ray exposure method of a fourteenth embodiment of the present invention.
Figure 37:
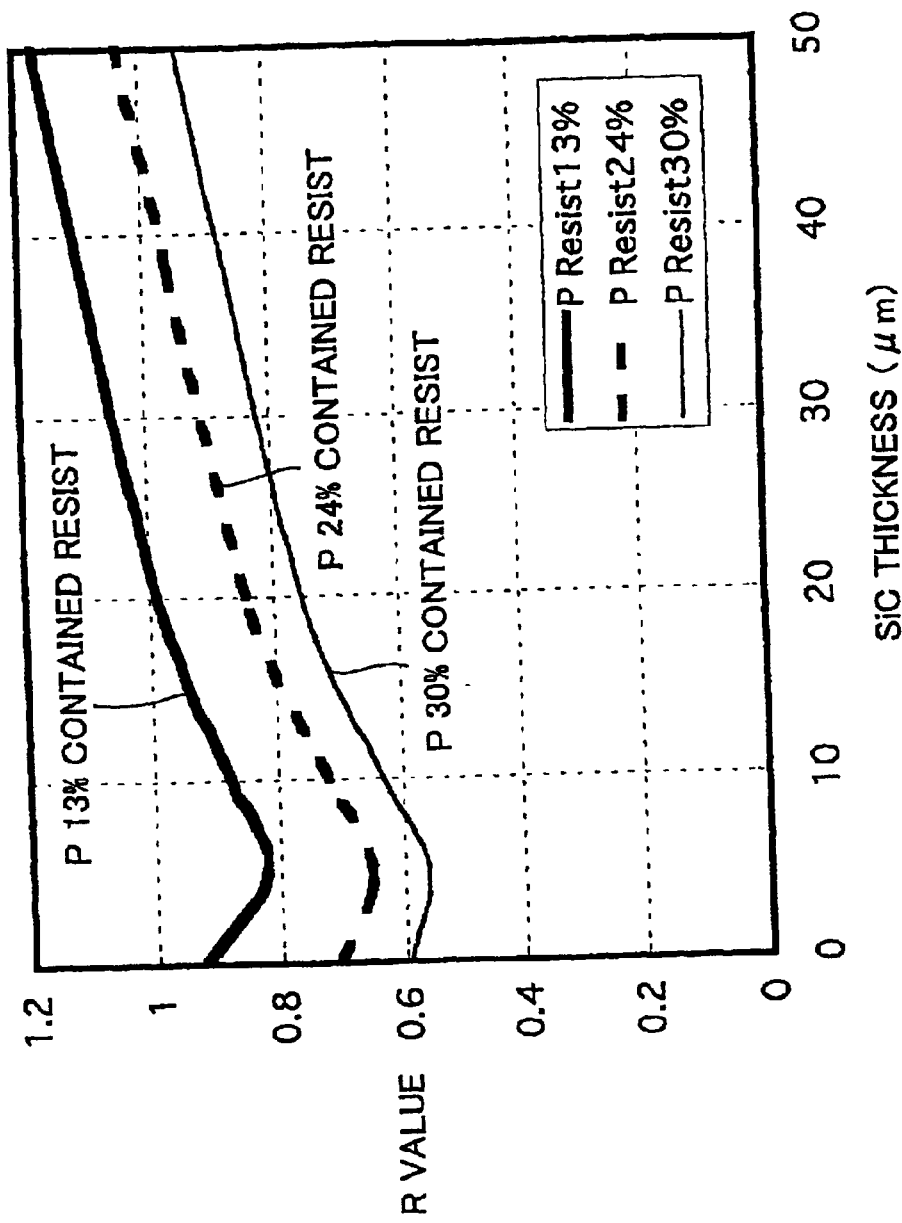
FIG. 37 is a graph showing a relationship between a filter thickness and an R value in each of cases where SIC filters are used in a combination of phosphorus contained resists and aluminum substrates in the X-ray exposure method of a fourteenth embodiment of the present invention.
Figure 38:
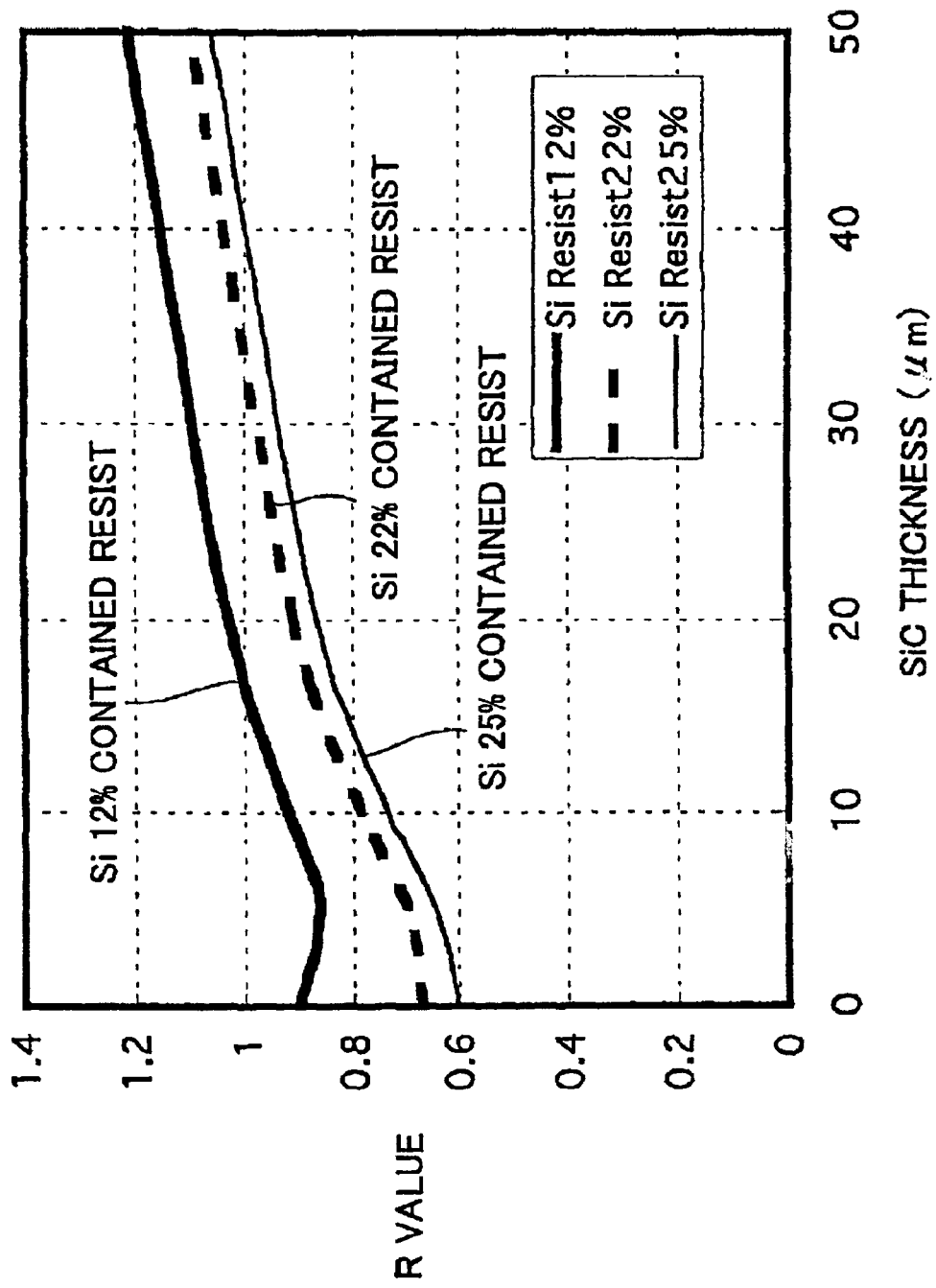
FIG. 38 is a graph showing a relationship between a filter thickness and an R value in each of cases where SIC filters are used in a combination of silicon contained resists and aluminum substrates in the X-ray exposure method of a fourteenth embodiment of the present invention.
Figure 39:
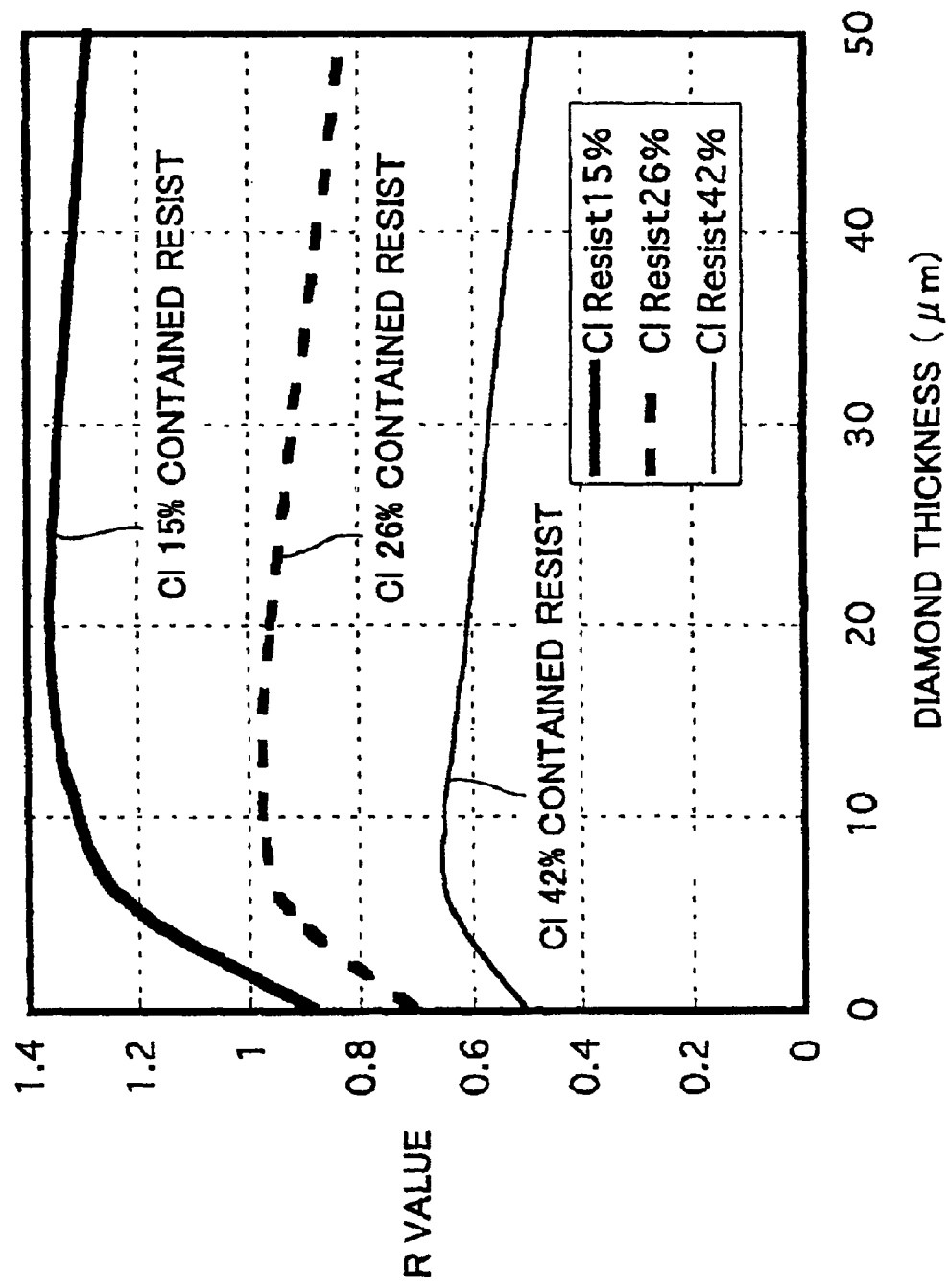
FIG. 39 is a graph showing a relationship between a filter thickness and an R value in cases where diamond filters are used in combinations of chlorine contained resists and aluminum substrates in an X-ray exposure method of a fifteenth embodiment of the present invention.
Figure 40:
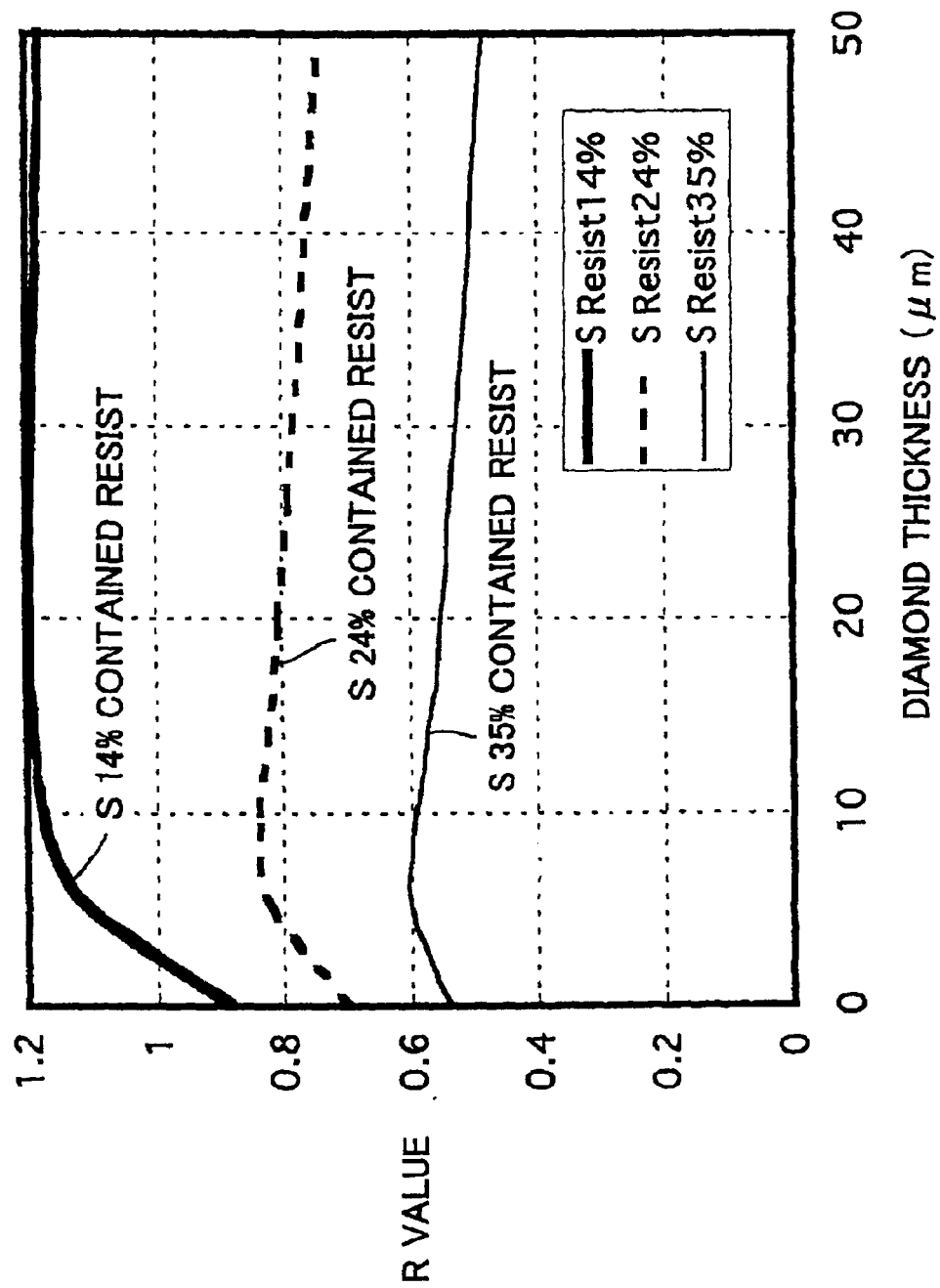
FIG. 40 is a graph showing a relationship between a filter thickness and an R value in each of cases where diamond filters are used in combinations of sulfur contained resists and aluminum substrates in the X-ray exposure method of a fifteenth embodiment of the present invention.
Figure 41:
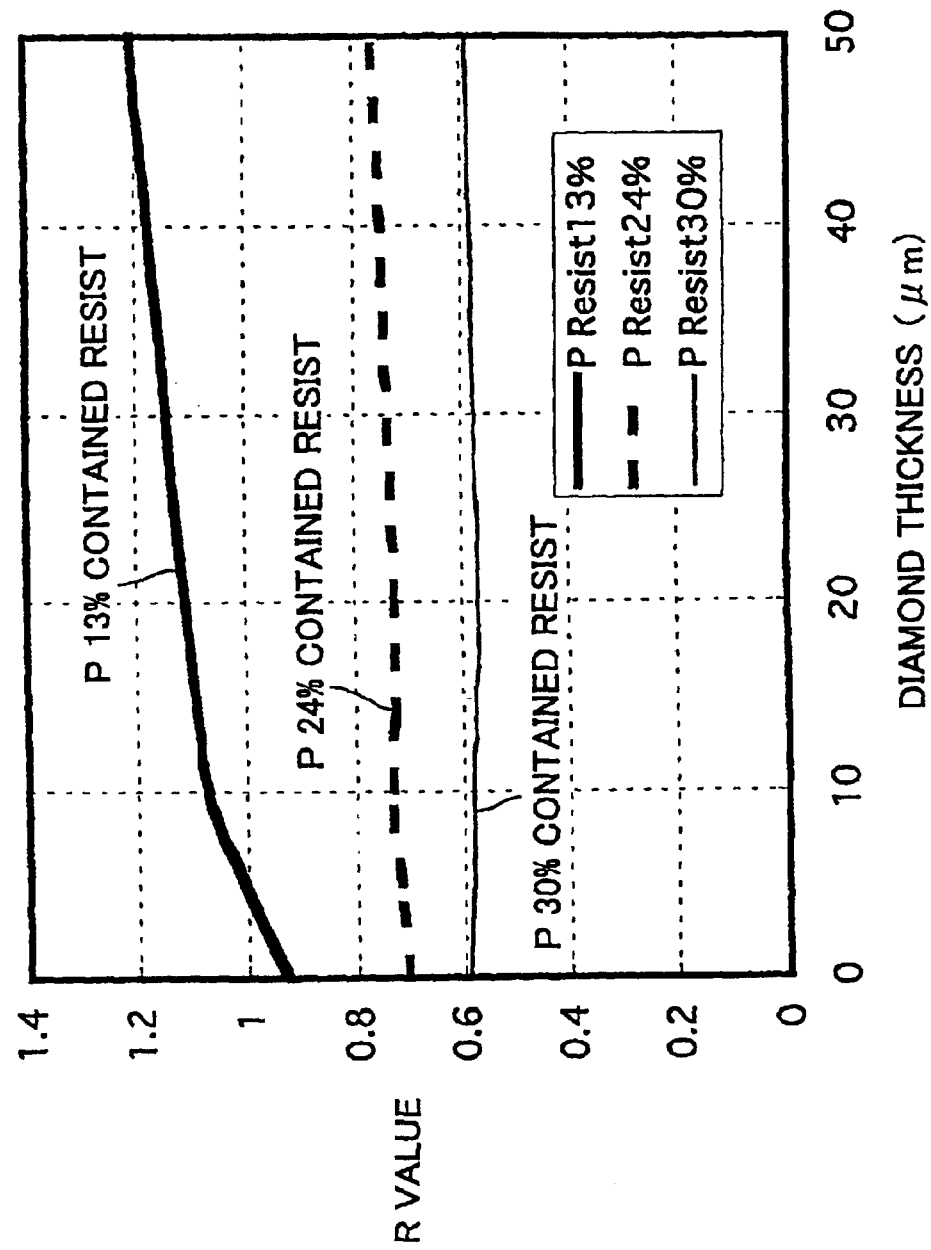
FIG. 41 is a graph showing a relationship between a filter thickness and an R value in each of cases where diamond filters are used in combinations of phosphorus contained resists and aluminum substrates in the X-ray exposure method of a fifteenth embodiment of the present invention.
Figure 42:
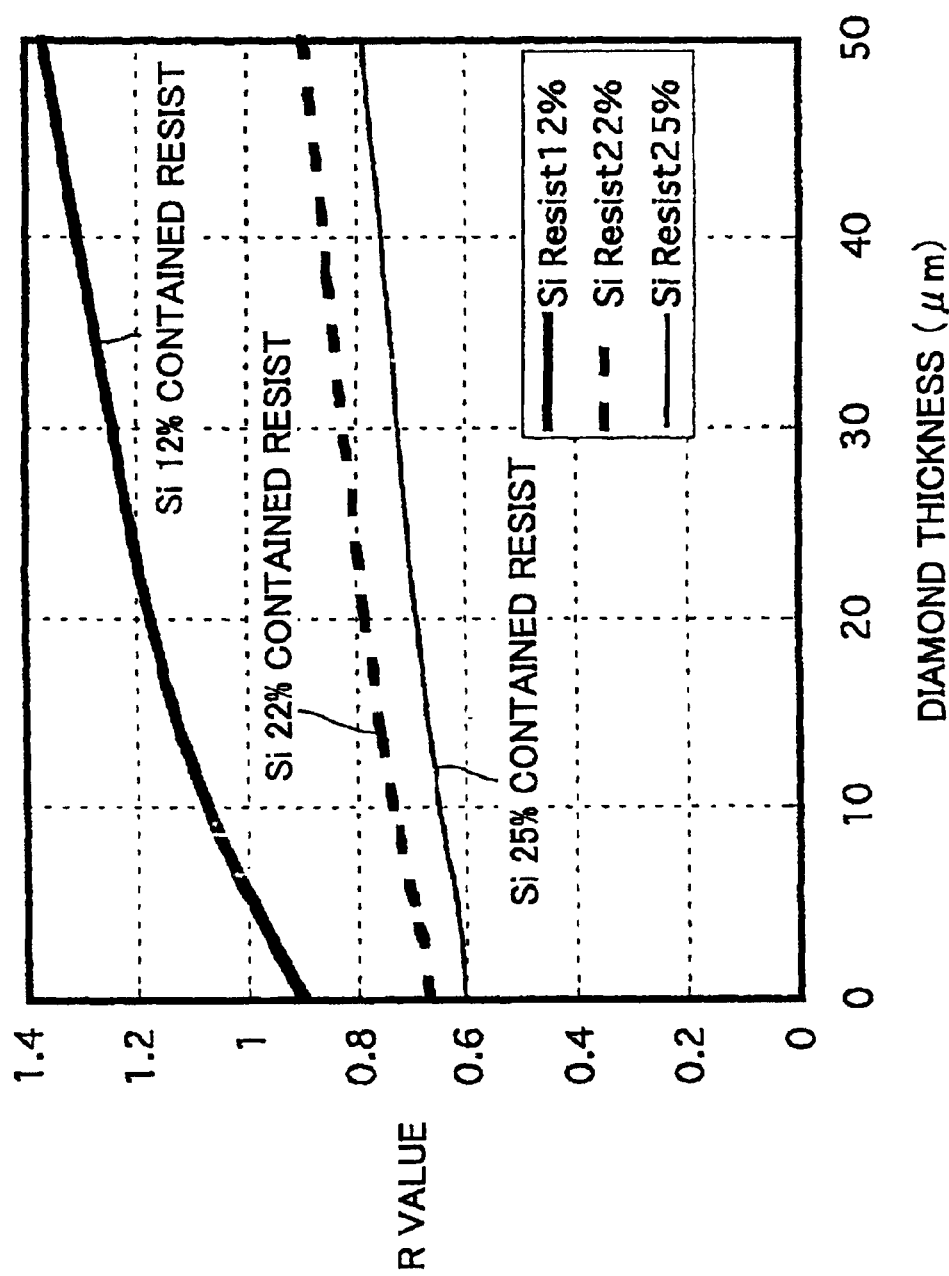
FIG. 42 is a graph showing a relationship between a filter thickness and an R value in each of cases where diamond filters are used in combinations of silicon contained resists and aluminum substrates in the X-ray exposure method of a fifteenth embodiment of the present invention.
Figure 43:
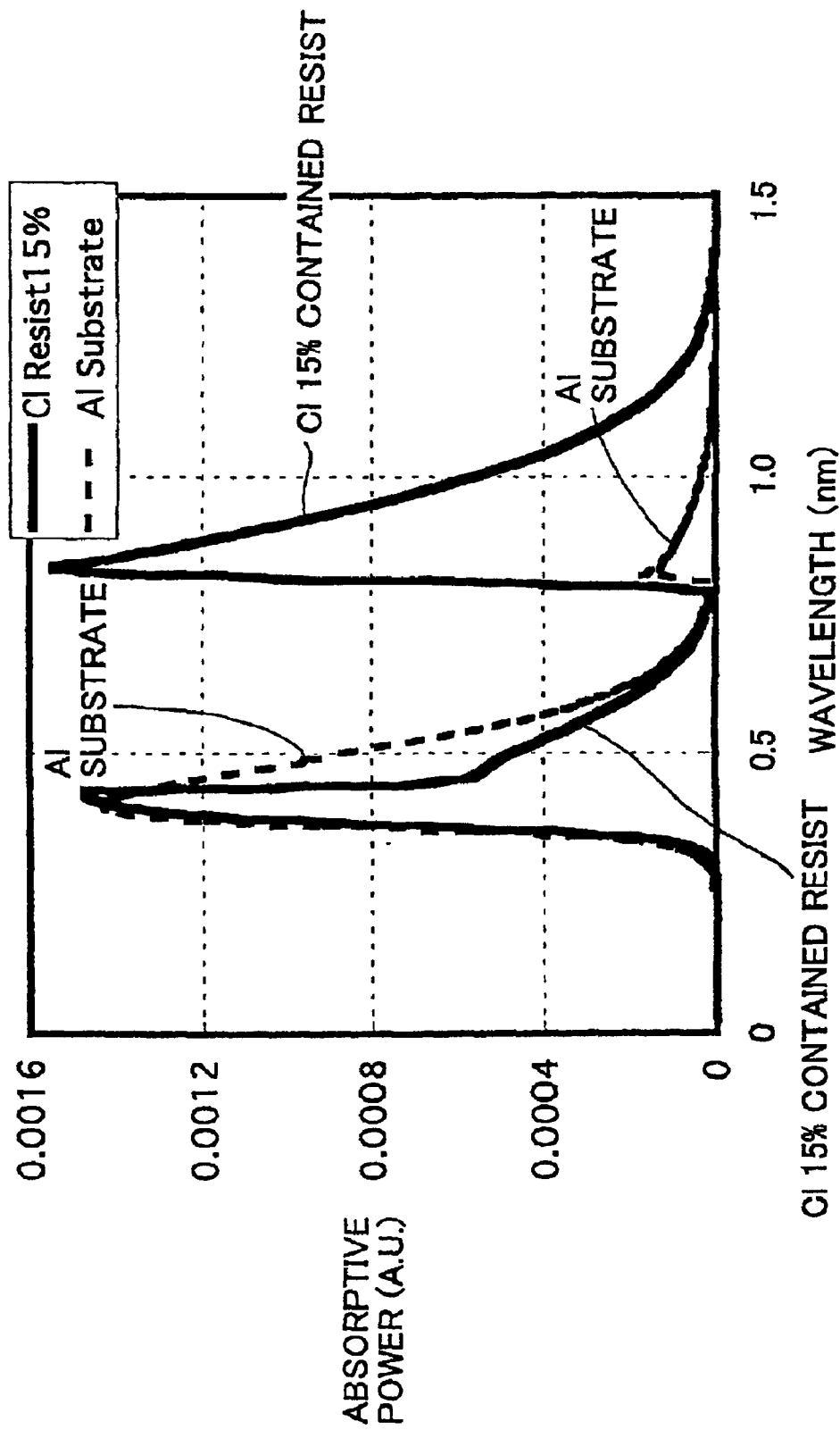
FIG. 43 is a graph showing absorption spectra of chlorine contained resists and aluminum substrates in a case where an aluminum filter of a thickness 5 µm is inserted in an X-ray exposure method of a sixteenth embodiment of the present invention.

Furthermore, FIG. 34 is a graph showing an iodine content dependency of an R value in the same system. An R value decreases monotonously with a content of iodine and assumes 0.6 or less in the range of iodine contents of 17% or more and an influence of secondary electrons from an aluminum substrate can be neglected.

Fourteenth Embodiment

In the above embodiment, by inserting a membrane or a filter including silicon, an influence from an aluminum substrate was able to be suppressed. In FIGS. 35 to 38, there are shown relationships between an R value of the evaluation function evaluating an influence of an aluminum substrate in cases in each of which an SiC membrane is used and a thickness of the SiC membrane. R values plotted according to a coordinate shows a correlation of downward convexity against a thickness of an SiC membrane on a scale of the abscissa, from which it is understood that there is an optimal thickness of an SiC membrane.

In a case of a chlorine contained resist, by setting a thickness of an SiC membrane to 8 $\mu$m, an R value assumes 0.6 or less and an influence of an aluminum substrate can be suppressed even at a chlorine content of 30%. Similarly, in a case of a sulfur contained resist, by setting a thickness of an SiC membrane to 7 $\mu$m, an R value assumes 0.6 or less and no necessity arise for regarding an influence of a substrate as a problem even at a sulfur content of 28%.

Furthermore, in a case of a phosphorus contained resist, by setting a thickness of an SiC membrane to 5 $\mu$m, an influence of a substrate can be suppressed even at a phosphorus content of 28%.

For a comparative purpose, in a case of a silicon contained resist, an influence of an aluminum substrate cannot be suppressed at a silicon content of 25% or less. Such a tendency is observed in a case of a resist containing bromine or iodine having an absorption-edge wavelength longer than that of aluminum. This is because by adding a filter, a long wavelength component that can be absorbed in a resist is cut off.

Fifteenth Embodiment

By inserting a diamond membrane or filter in a case of aluminum substrate which is generally used as an interconnection material, an influence of an aluminum substrate can be reduced. In FIGS. 39 to 42, there are shown diamond membrane thickness dependencies of an R value of the evaluation function to investigate an influence of an aluminum substrate. R values show a correlation of upward convexity against a thickness of a diamond membrane. Hence, in order to reduce an R value to 0.6 or less, it is understood that a necessity arise for setting a thickness of a diamond membrane to a prescribed thickness or more.

In a case of a chlorine contained resist (FIG. 39), by setting a thickness of a diamond membrane to 20 μm or more, an influence of a substrate can be suppressed at a chlorine content of 42%.

In a case of a sulfur contained resist (FIG. 40), by setting a thickness of a diamond membrane to 8 μm or more, an influence of a substrate can be suppressed at a sulfur content of 35%.

For a comparative purpose, in a case of a phosphorus contained resist at a phosphorus content of 30% or less (FIG. 42) or in a case of a silicon contained resist at a silicon content of 25% or less, an influence of a substrate cannot be surely suppressed with a diamond membrane of a thickness of 50 μm or less.

Sixteenth Embodiment

In the sixteenth embodiment of the present invention, in a case of aluminum substrate in use which is generally used as an interconnection material, a filter of aluminum is adopted. In FIGS. 43 to 48, there are shown absorption spectra in resists including elements of chlorine, sulfur, phosphorus, silicon, bromine and iodine, respectively, and absorption spectra of aluminum substrates in cases in each of which an aluminum filter of a thickness 5 μm is inserted.

Figure 44:
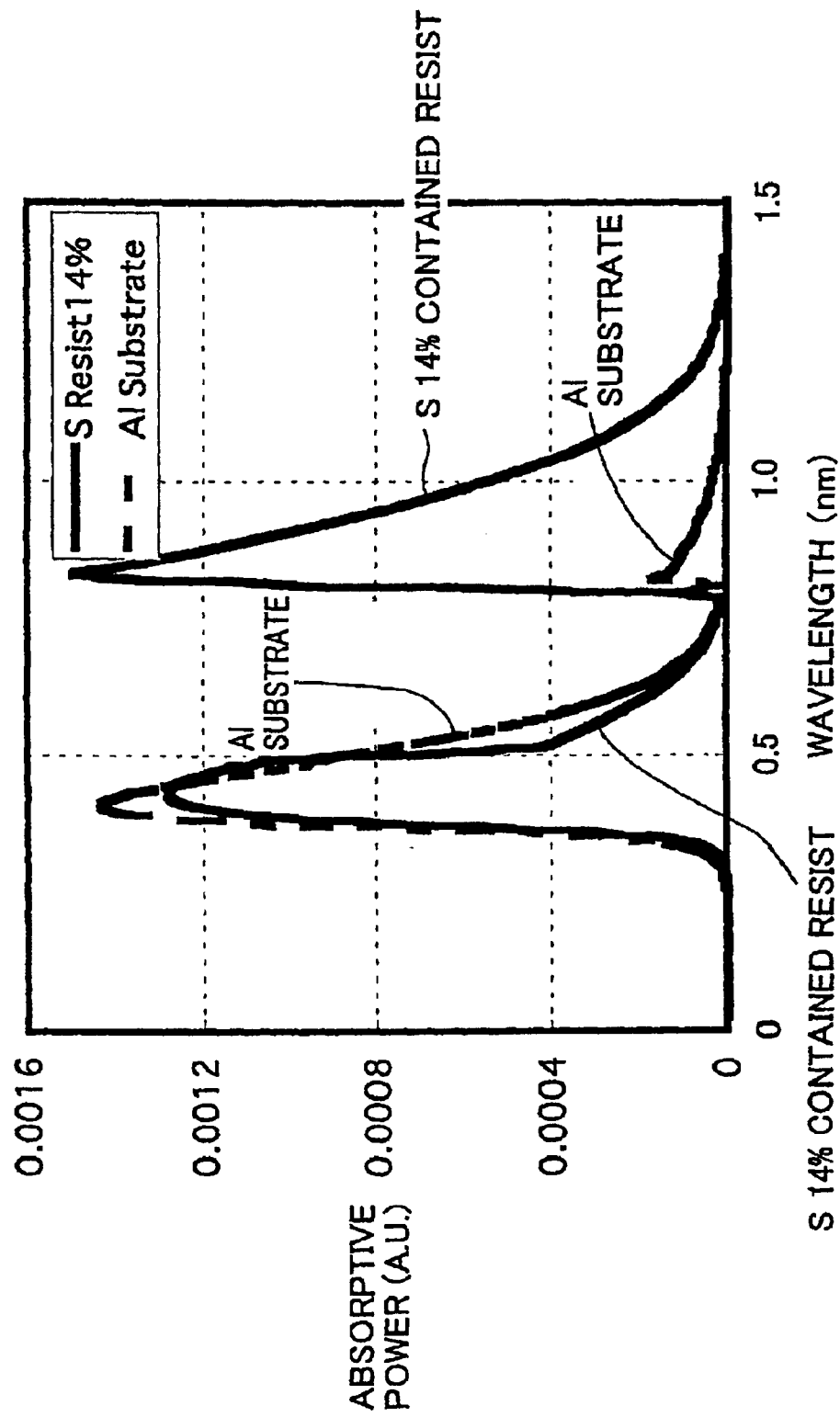
FIG. 44 is a graph showing absorption spectra of sulfur contained resists and aluminum substrates in a case where an aluminum filter of a thickness 5 µm is inserted in the X-ray exposure method of a sixteenth embodiment of the present invention.
Figure 45:
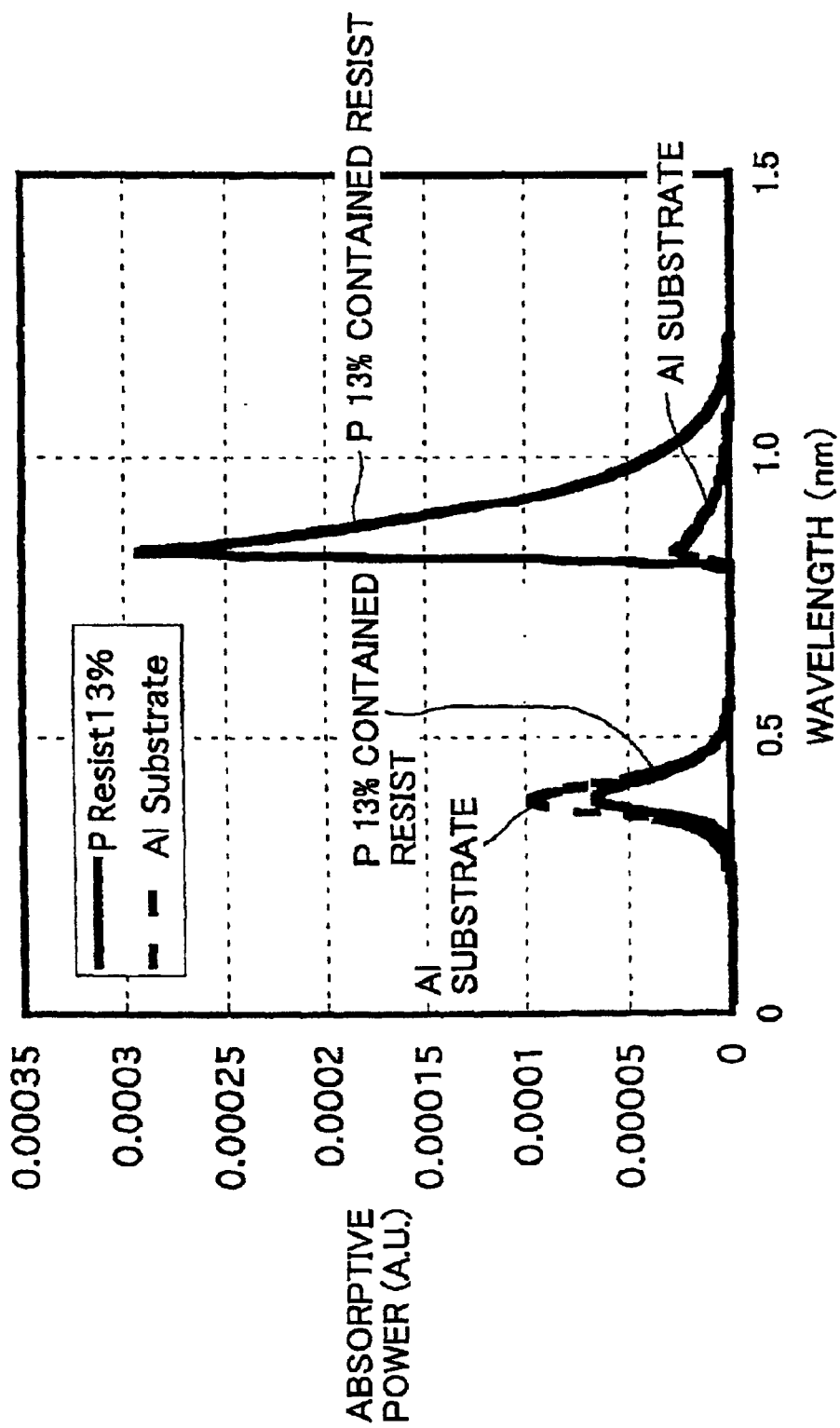
FIG. 45 is a graph showing absorption spectra of phosphorus contained resists and aluminum substrates in a case where an aluminum filter of a thickness 5 µm is inserted in the X-ray exposure method of the sixteenth embodiment of the present invention.
Figure 46:
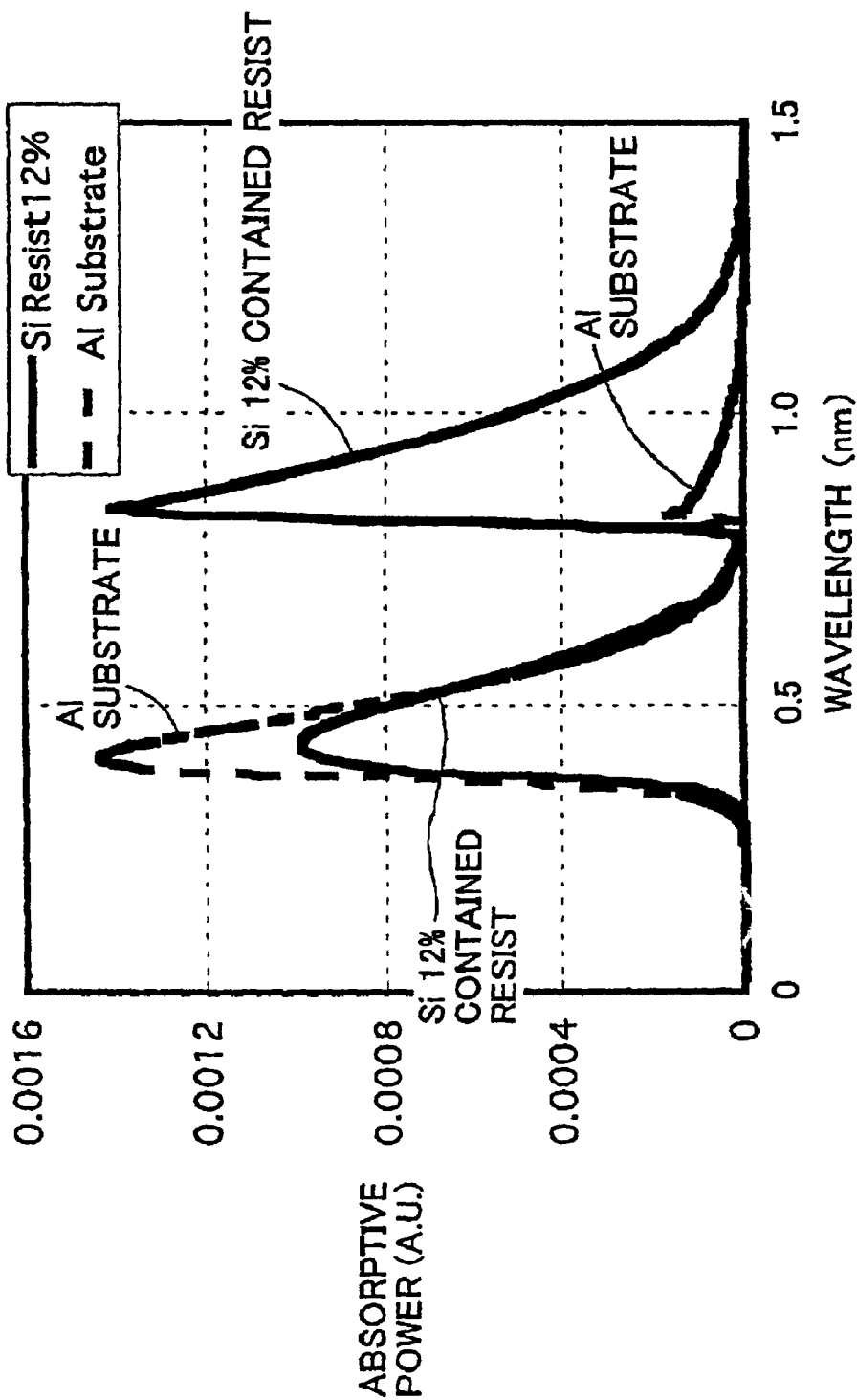
FIG. 46 is a graph showing absorption spectra of silicon contained resist and aluminum substrates in a case where an aluminum filter of a thickness 5 µm is inserted in the X-ray exposure method of a sixteenth embodiment of the present invention.
Figure 47:
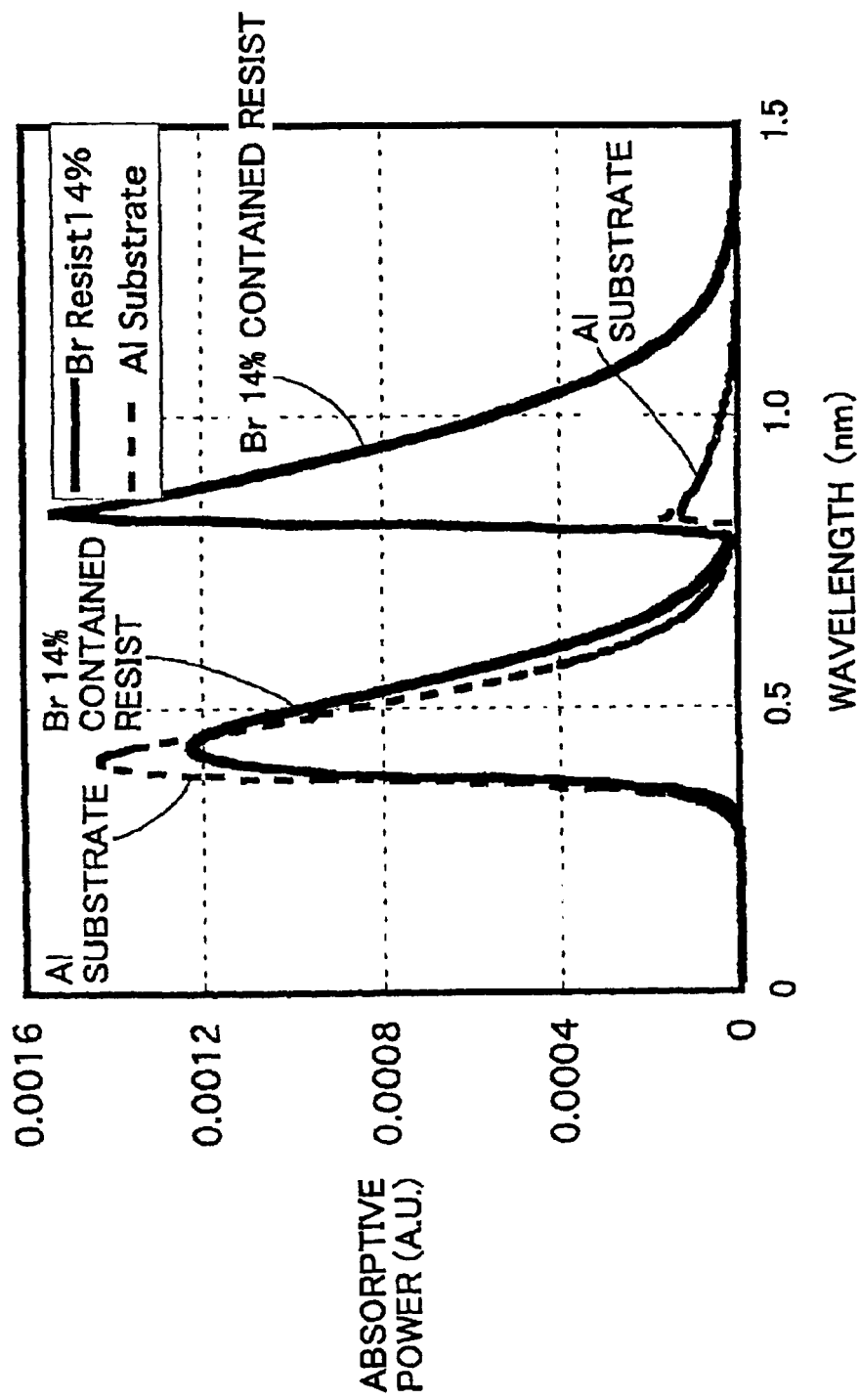
FIG. 47 is a graph showing absorption spectra of bromine contained resists and aluminum substrates in a case where a aluminum filter of a thickness 5 µm is inserted in the X-ray exposure method of the sixteenth embodiment of the present invention.
Figure 48:
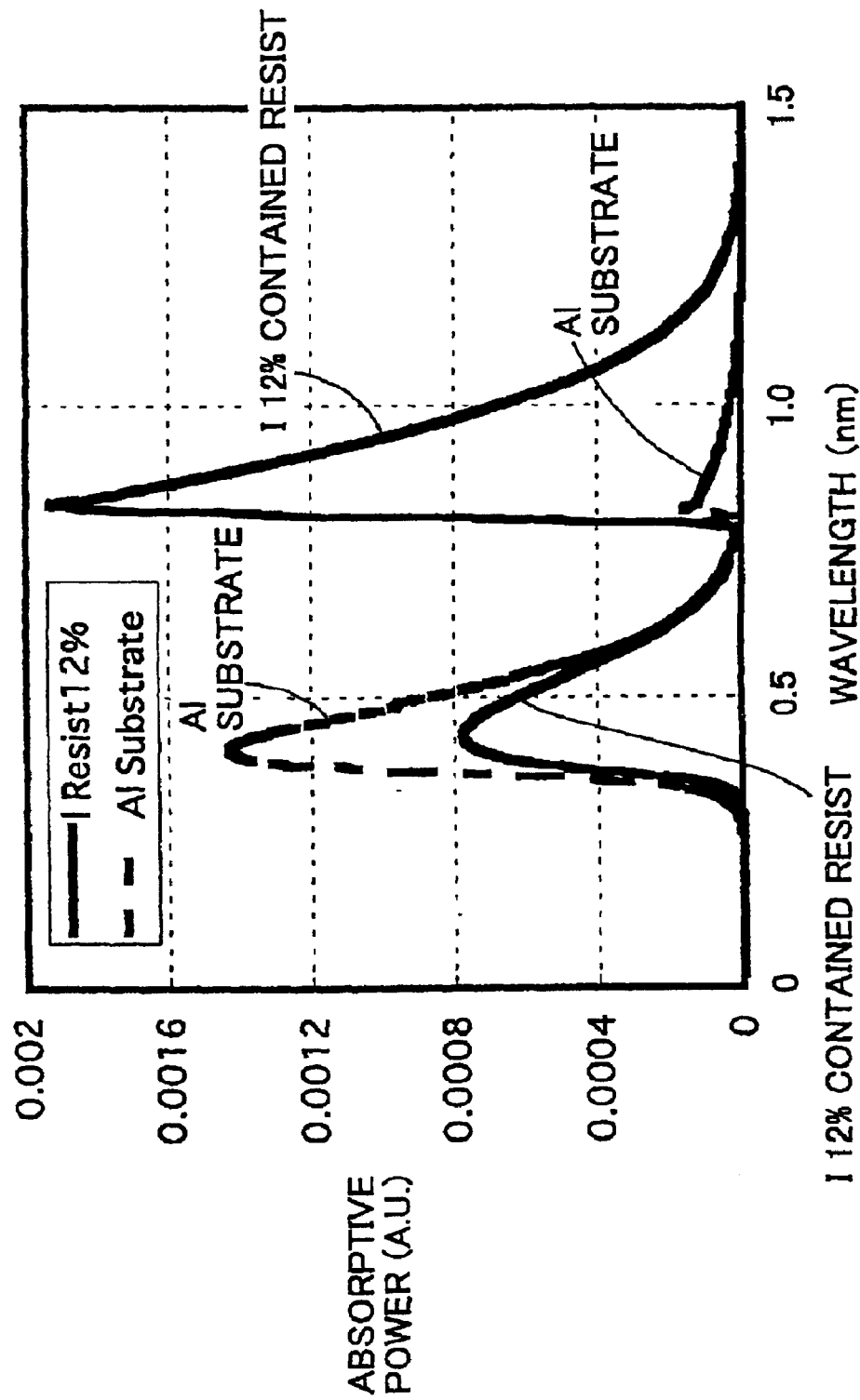
FIG. 48 is a graph showing absorption spectra of iodine contained resists and aluminum substrates in a case where an aluminum filter of a thickness 5 µm is inserted in the X-ray exposure method of a sixteenth embodiment of the present invention.
Figure 49:
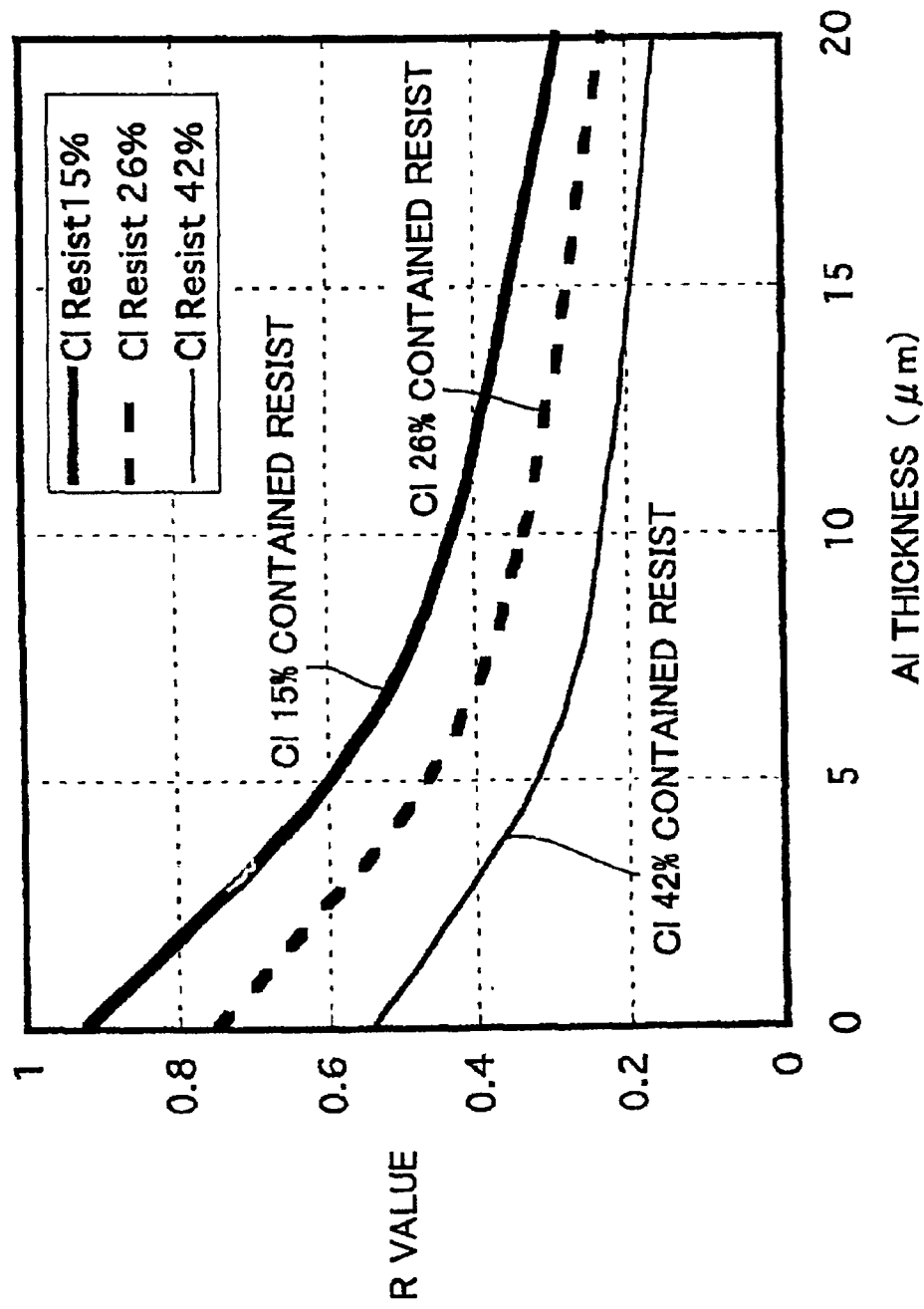
FIG. 49 is a graph showing a relationship between a filter thickness and an R value in each of cases where aluminum filters are used in combinations of chlorine contained resists and aluminum substrates in the X-ray exposure method of a sixteenth embodiment of the present invention.
Figure 50:
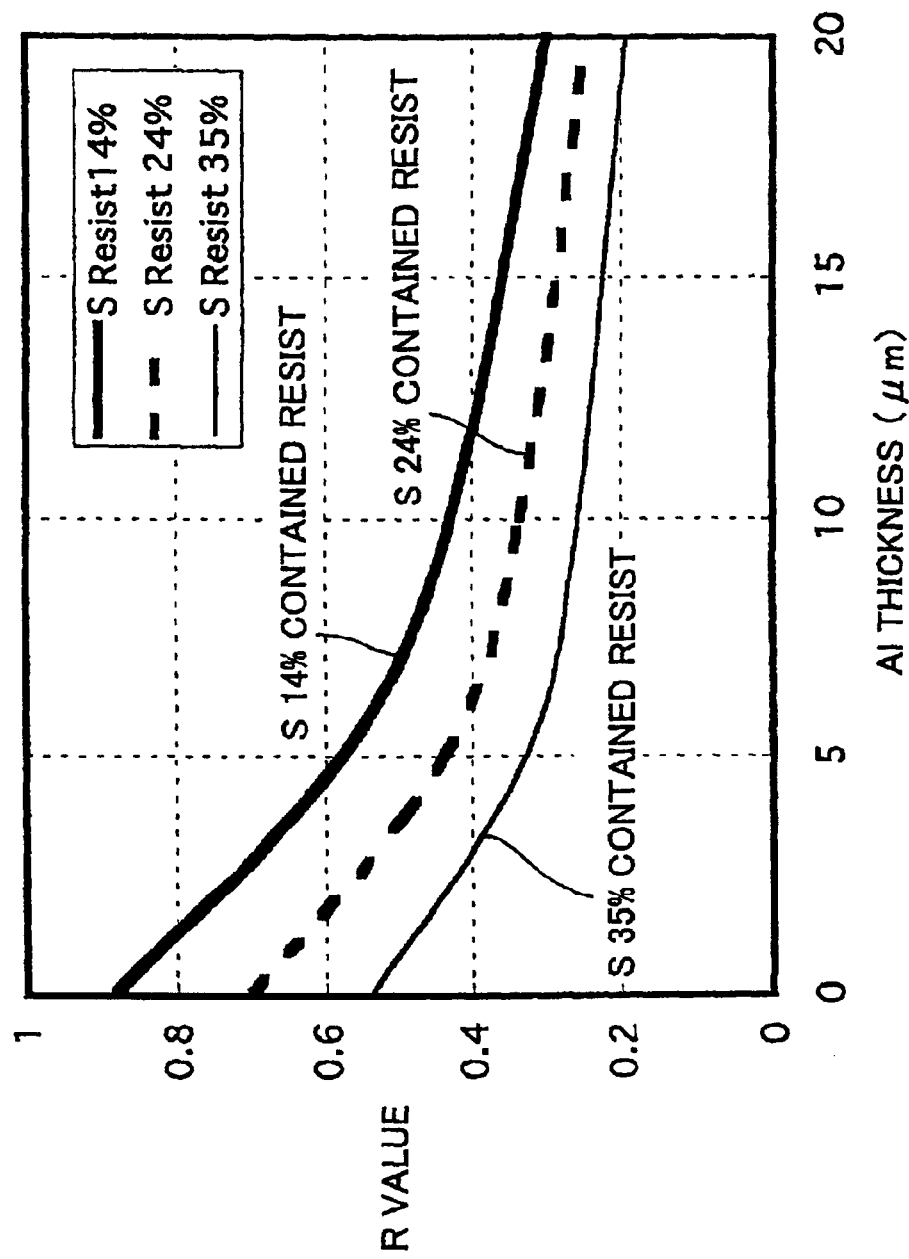
FIG. 50 is a graph showing a relationship between a filter thickness and an R value in each of cases where aluminum filters are used in combinations of sulfur contained resists and aluminum substrates in the X-ray exposure method of a sixteenth embodiment of the present invention.
Figure 51:
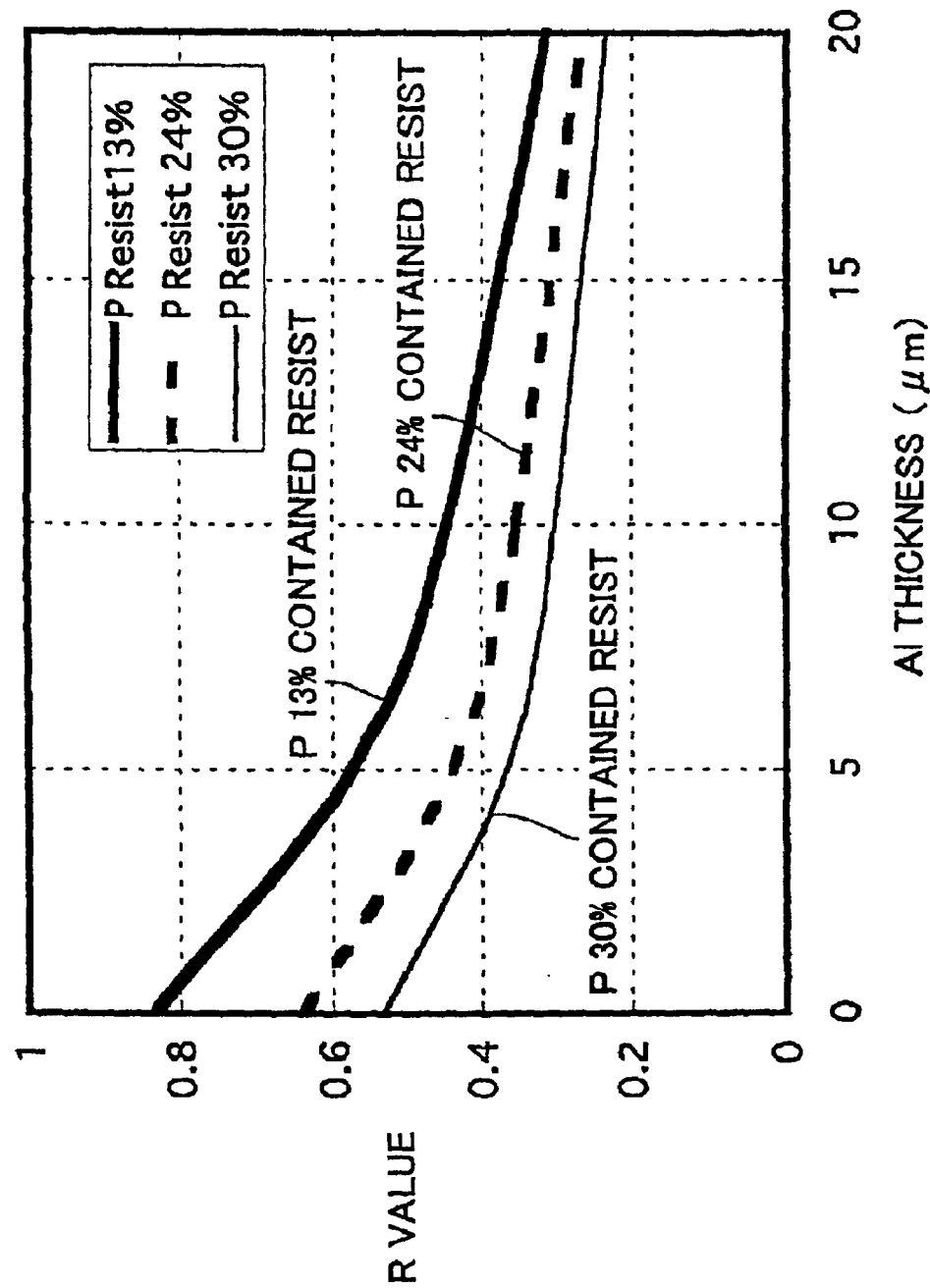
FIG. 51 is a graph showing a relationship between a filter thickness and an R value in each of cases where aluminum filters are used in combinations of phosphorus contained resists and aluminum substrates in the X-ray exposure method of a sixteenth embodiment of the present invention.
Figure 52:
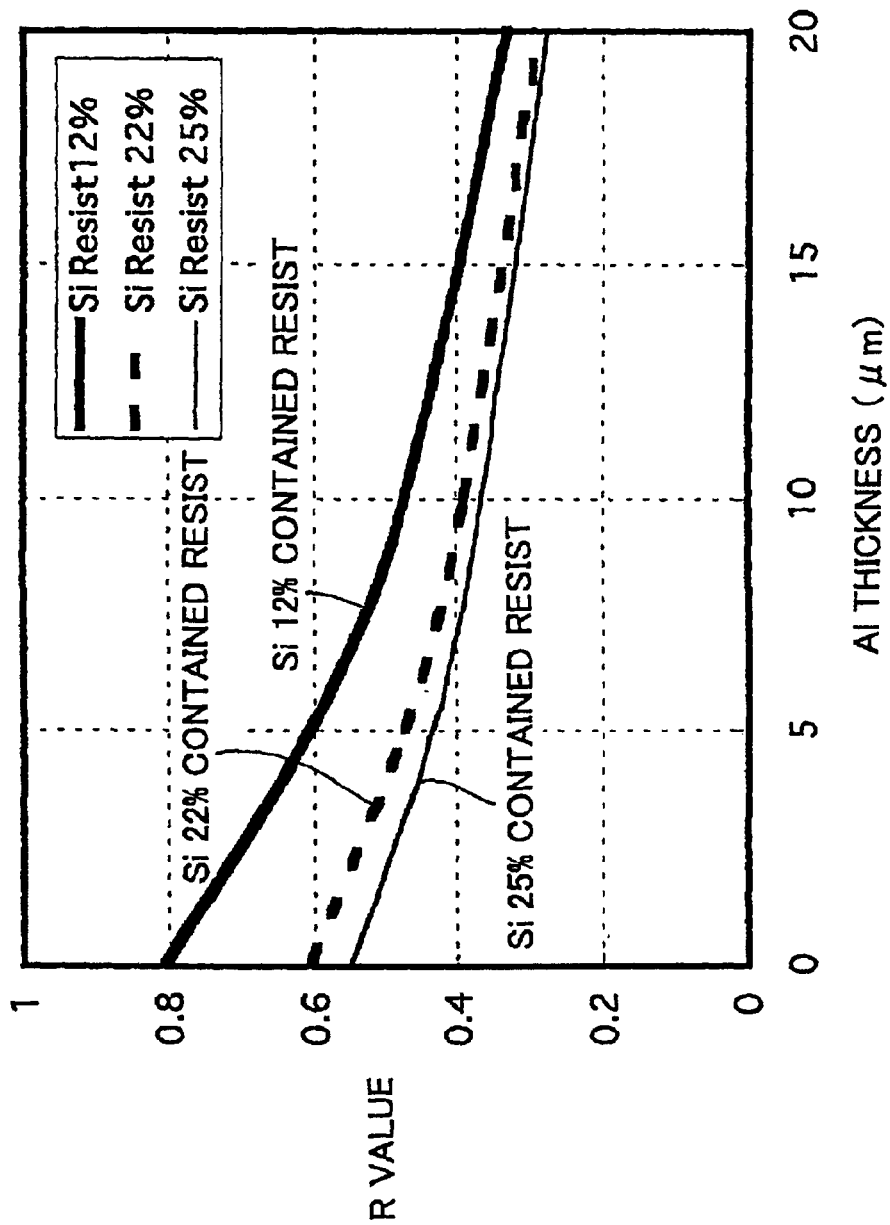
FIG. 52 is a graph showing a relationship between a filter thickness and an R value in each of cases where aluminum filters are used in combinations of silicon contained resists and aluminum substrates in the X-ray exposure method of a sixteenth embodiment of the present invention.
Figure 53:
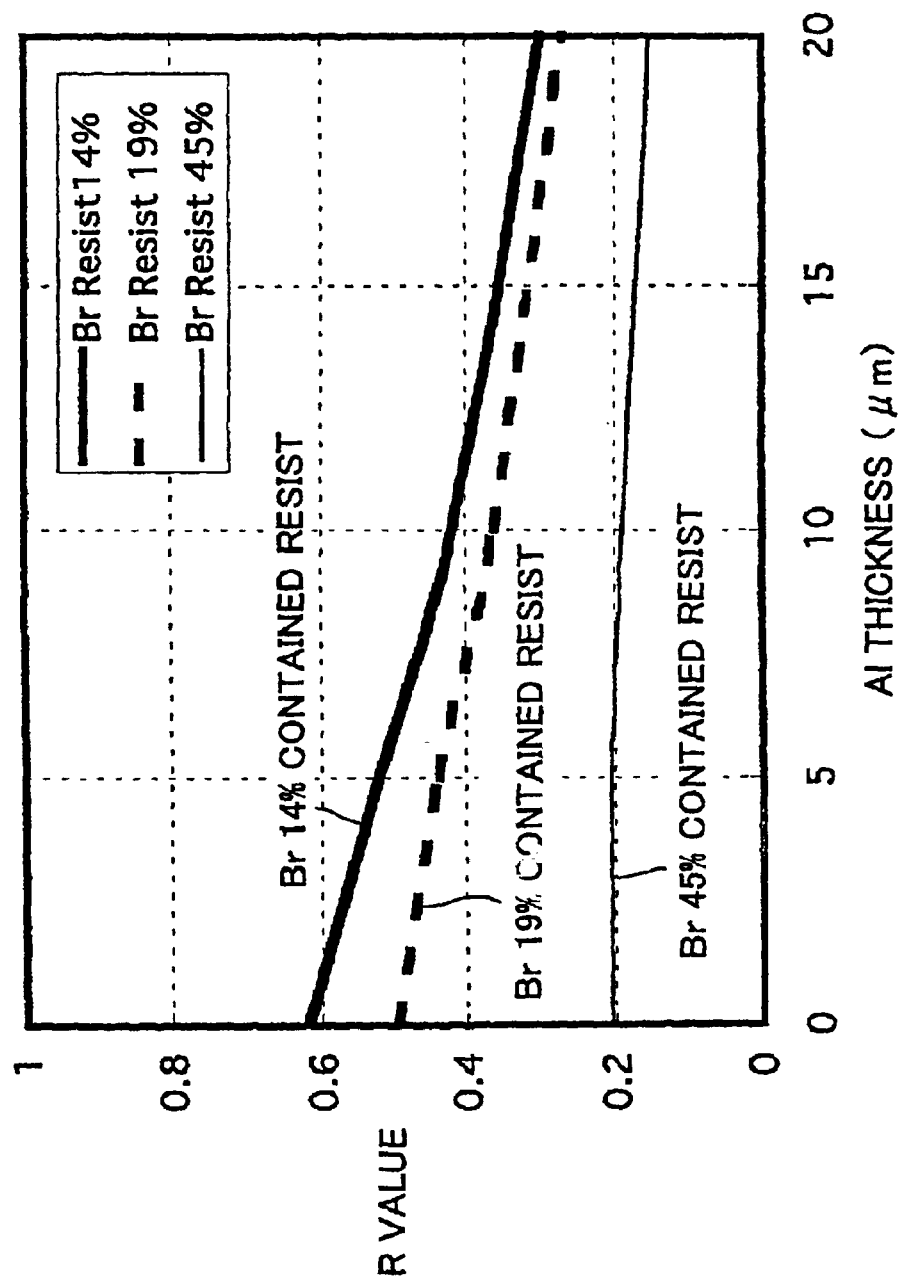
FIG. 53 is a graph showing a relationship between a filter thickness and an R value in each of cases where aluminum filters are used in combinations of bromine contained resists and aluminum substrates in the X-ray exposure method of a sixteenth embodiment of the present invention.
Figure 54:
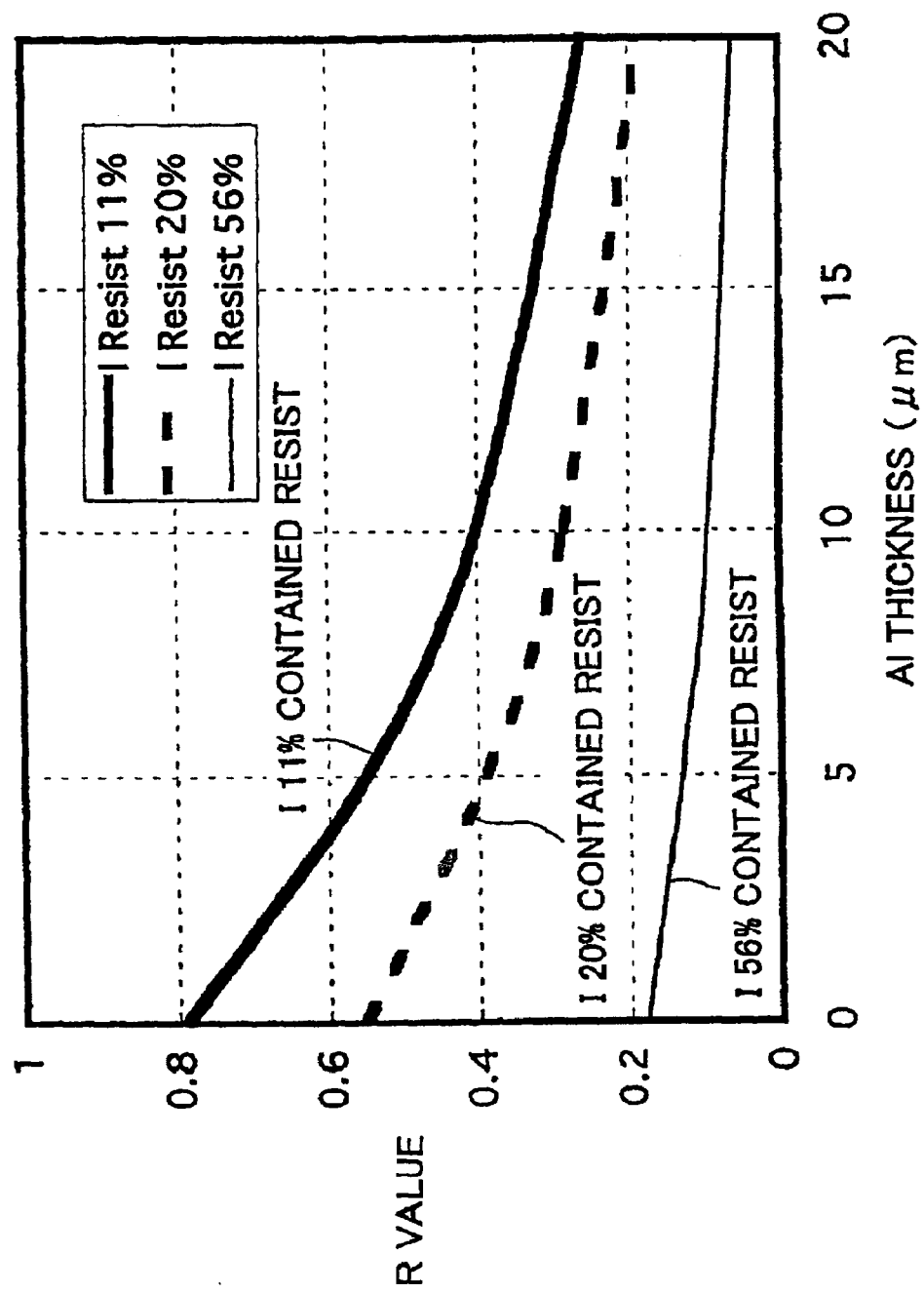
FIG. 54 is a graph showing a relationship between a filter thickness and an R value in each of cases where aluminum filters are used in combinations of sulfur contained resists and aluminum substrates in the X-ray exposure method of a sixteenth embodiment of the present invention.

In a case of a chlorine contained resist at a content of 15% (FIG. 43), an R value can be 0.6 for exposure wavelengths. Furthermore, in a case of a sulfur contained resist at a content of 14%, an R value can also be 0.58 (FIG. 44). In a case of a phosphorus contained resist at a content of 13%, an R value can be 0.58 (FIG. 45). Furthermore, in a case of a silicon contained resist at a content of 12%, an R value can also be 0.61 as shown in FIG. 46. In a case of a bromine contained resist at a content of 14%, an R value can be 0.52 (FIG. 47). Furthermore, in a case of an iodine contained resist at a content of 11%, an R value can also be restricted to 0.55 (FIG. 48).

In FIGS. 49 to 54, there are shown relationships between a thickness of an aluminum filter and an R value for cases where resists including elements such as chlorine. Even with resists including any of the elements, an R value decrease monotonously with a thickness of an aluminum filter.

In a case of a chlorine contained resist (FIG. 49), by setting a content of chlorine to 15% and a thickness of an aluminum filter to 5 μm or more, an R value assumes 0.6 or less and an influence of a substrate can be suppressed.

In a case of a sulfur contained resist (FIG. 50), by setting a content of sulfur to 14% and a thickness of an aluminum filter to 5 μm or more, an R value assumes 0.6 or less and an influence of a substrate can be suppressed.

In a case of a phosphorus contained resist (FIG. 51), by setting a content of phosphorus to 13% and a thickness of an aluminum filter to 5 μm or more, an R value assumes 0.6 or less and an influence of a substrate can be neglected.

In a case of a silicon contained resist (FIG. 52), by setting a content of silicon to 13% and a thickness of an aluminum filter to 5 μm or more, an R value assumes 0.6 or less and an influence of a substrate can be neglected.

In a case of a bromine contained resist (FIG. 53), by setting a content of bromine to 14% and a thickness of an aluminum filter to 2 μm or more, an R value assumes 0.6 or less and an influence of a substrate can be suppressed.

In a case of an iodine contained resist (FIG. 54), by setting a content of iodine to 11% and a thickness of an aluminum filter to 4 μm or more, an R value assumes 0.6 or less and an influence of a substrate can be suppressed.

Seventeenth Embodiment

In the seventeenth embodiment of the present invention, description will be given of pattern formation with a multilayer film made of magnetic materials. MRAM is constituted of a multilayer of magnetic materials, whose top layer is made of a tantalum thin film. In pattern formation by X-ray exposure on such a tantalum substrate as well, an influence of secondary electrons from the substrate can be reduced by selecting a proper mirror material and a reflecting angle thereof, and using a bromine or iodine contained resist.

Since tantalum has an absorption-edge at 0.67 nm, a necessity arises for a mirror construction cutting off radiation with wavelengths shorter than the absorption-edge wavelength. For this reason, there is provided a drive mechanism capable of freely changing an angle of mirrors, which are made of, for example, diamond.

As a radiation source, a radiation emitted from a radiation generator with a critical wavelength 0.85 nm is used. The radiation is reflected twice using diamond mirrors and transmitted through a beryllium window with a thickness 20 μm. In this embodiment, an exposure system is used in which a mask surface of a diamond membrane with a thickness 2 μm is illuminated with the transmitted radiation to form a pattern. An angle of oblique incidence is set to 0.8 degree in a case of a silicon substrate, while in a case of a tantalum substrate, an angle of oblique incidence is set to 1.2 degrees.

Figure 55:
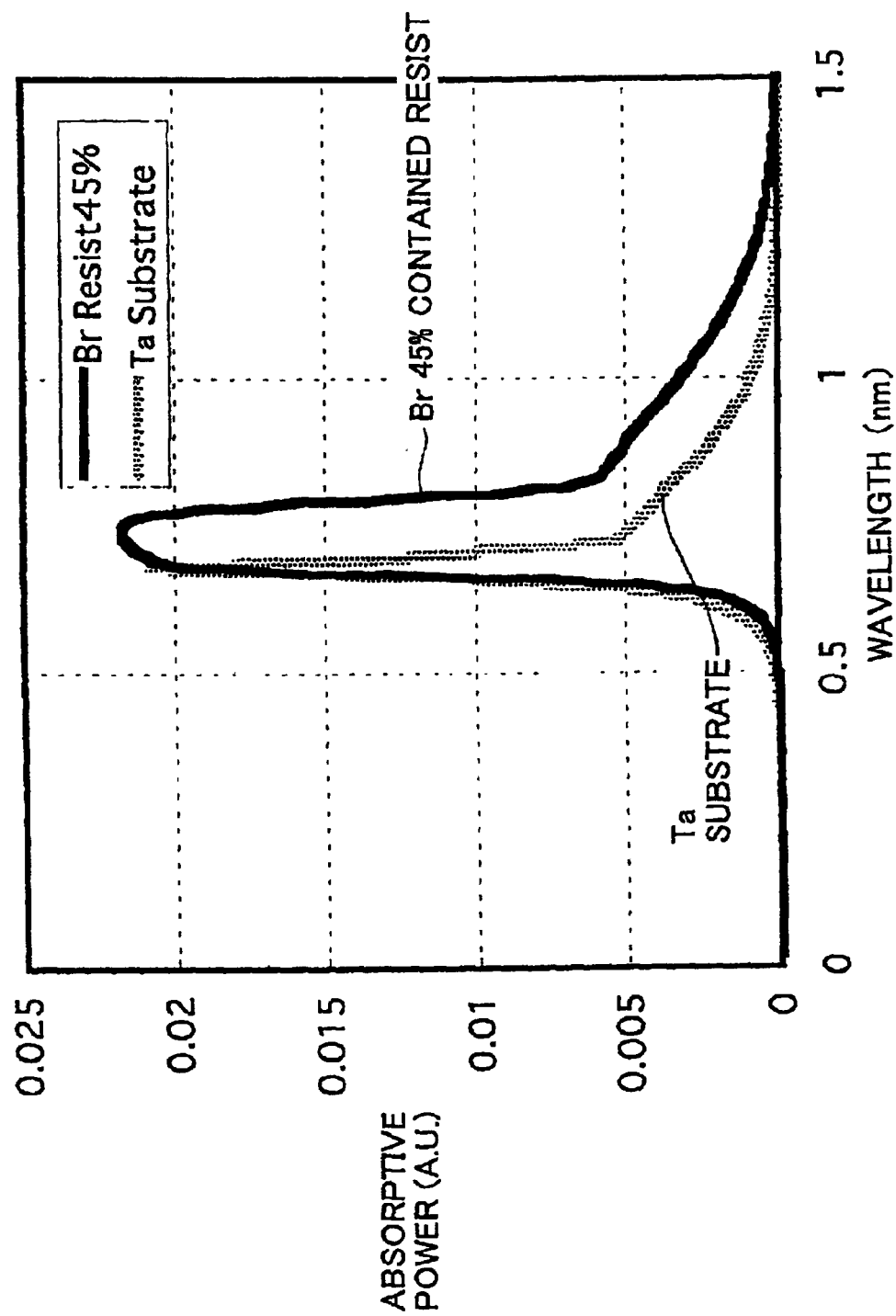
FIG. 55 is a graph showing absorption spectra of a bromine contained resist and an tantalum substrate in an X-ray exposure method of a seventeenth embodiment of the present invention.
Figure 56:
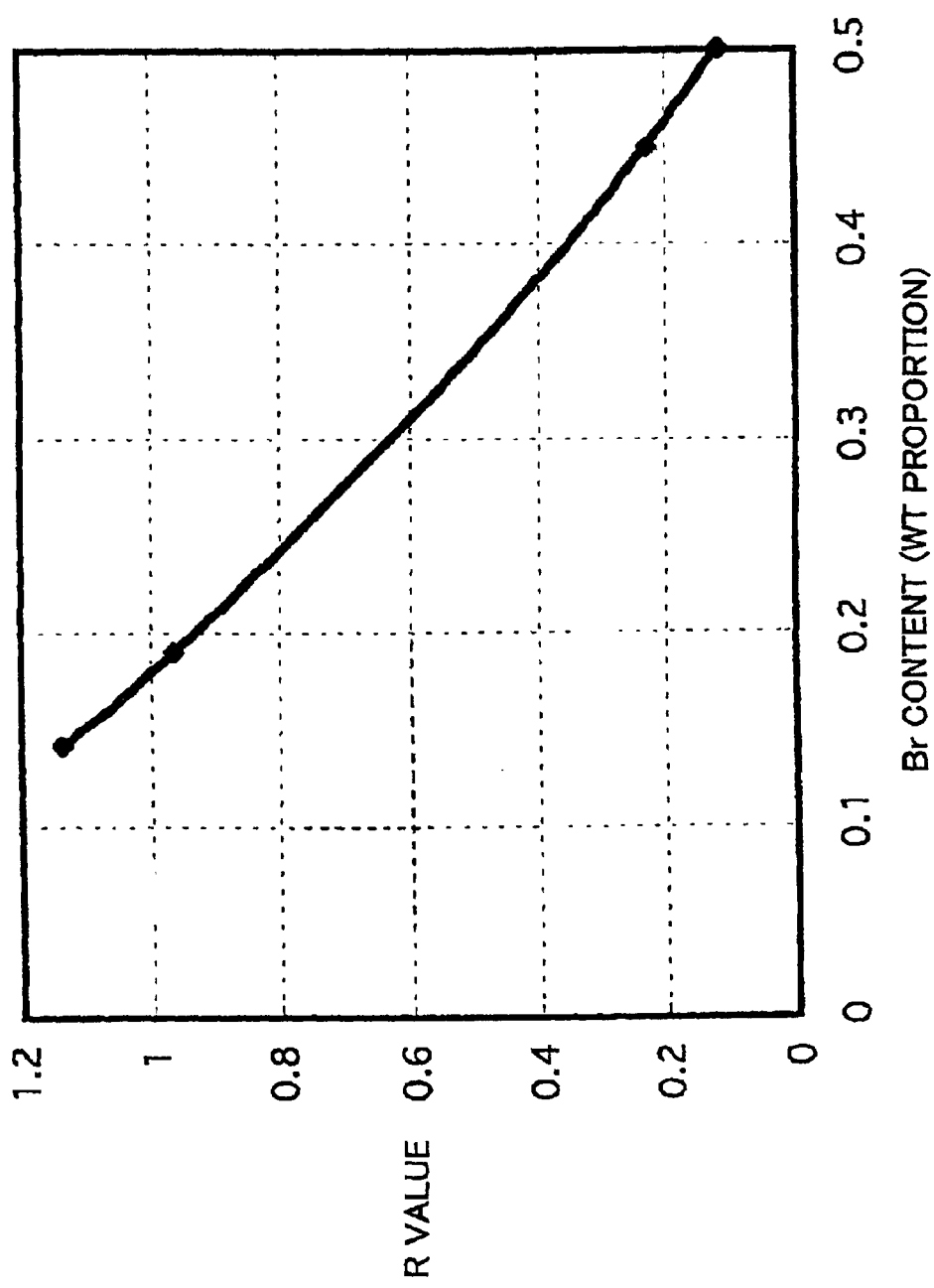
FIG. 56 is a graph showing a relationship between a bromine content in a bromine contained resist and an R value in the X-ray exposure method of a seventeenth embodiment of the present invention.

In FIG. 55, there are shown an absorption spectrum in a resist containing bromine at a content of 45% in use and an absorption spectrum by a tantalum substrate. As seen from FIG. 55, an R value in exposure wavelengths assumes 0.23 and an influence of the tantalum substrate can be sufficiently suppressed. In FIG. 56, there is shown a bromine content dependency of an R value. An R value assumes 0.6 or less in a range of bromine contents of 32% or more, thus enabling suppression of an influence of the tantalum substrate.

Figure 57:
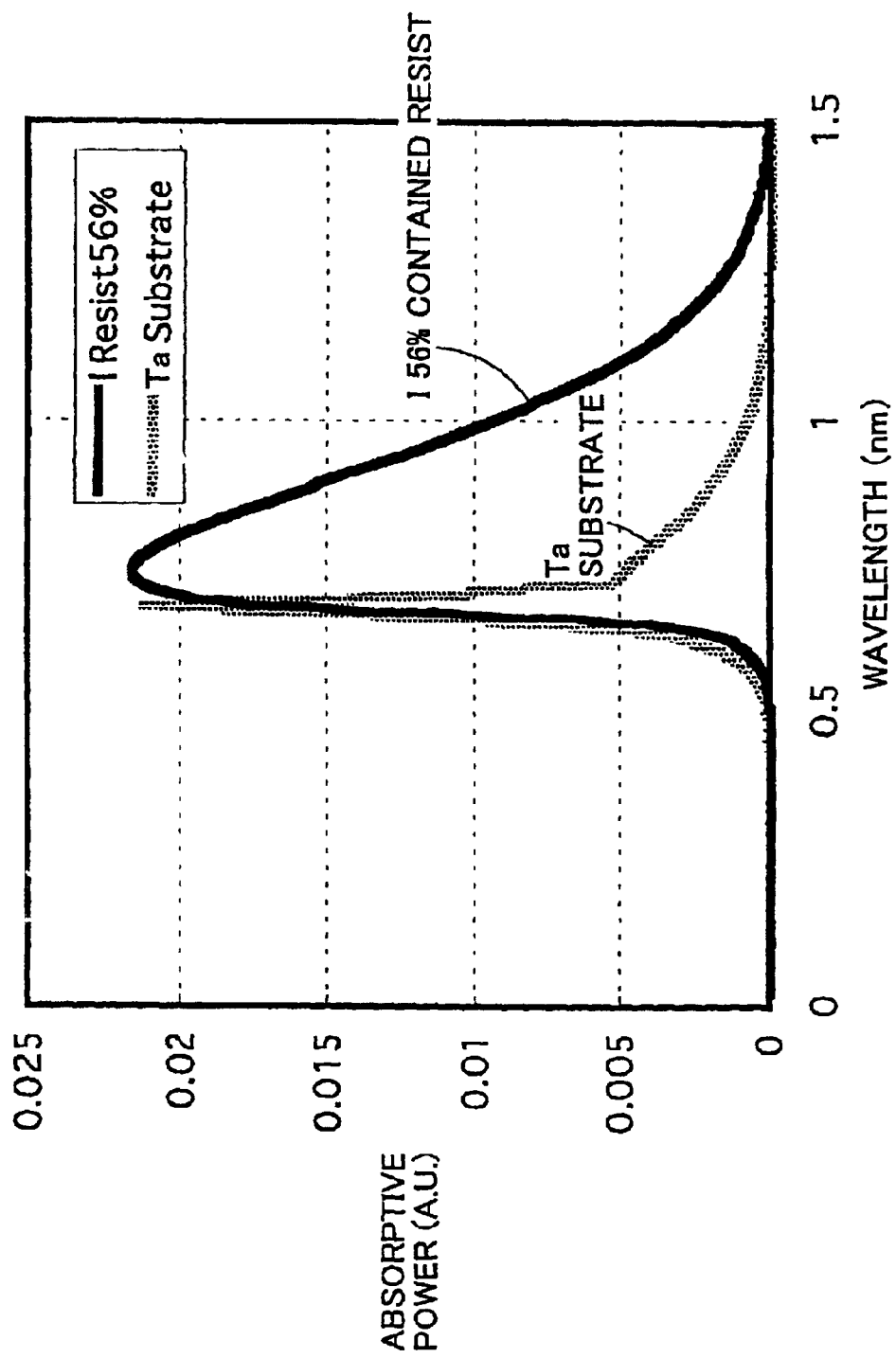
FIG. 57 is a graph showing absorption spectra of an iodine contained resist and an tantalum substrate in the X-ray exposure method of a seventeenth embodiment of the present invention.
Figure 58:
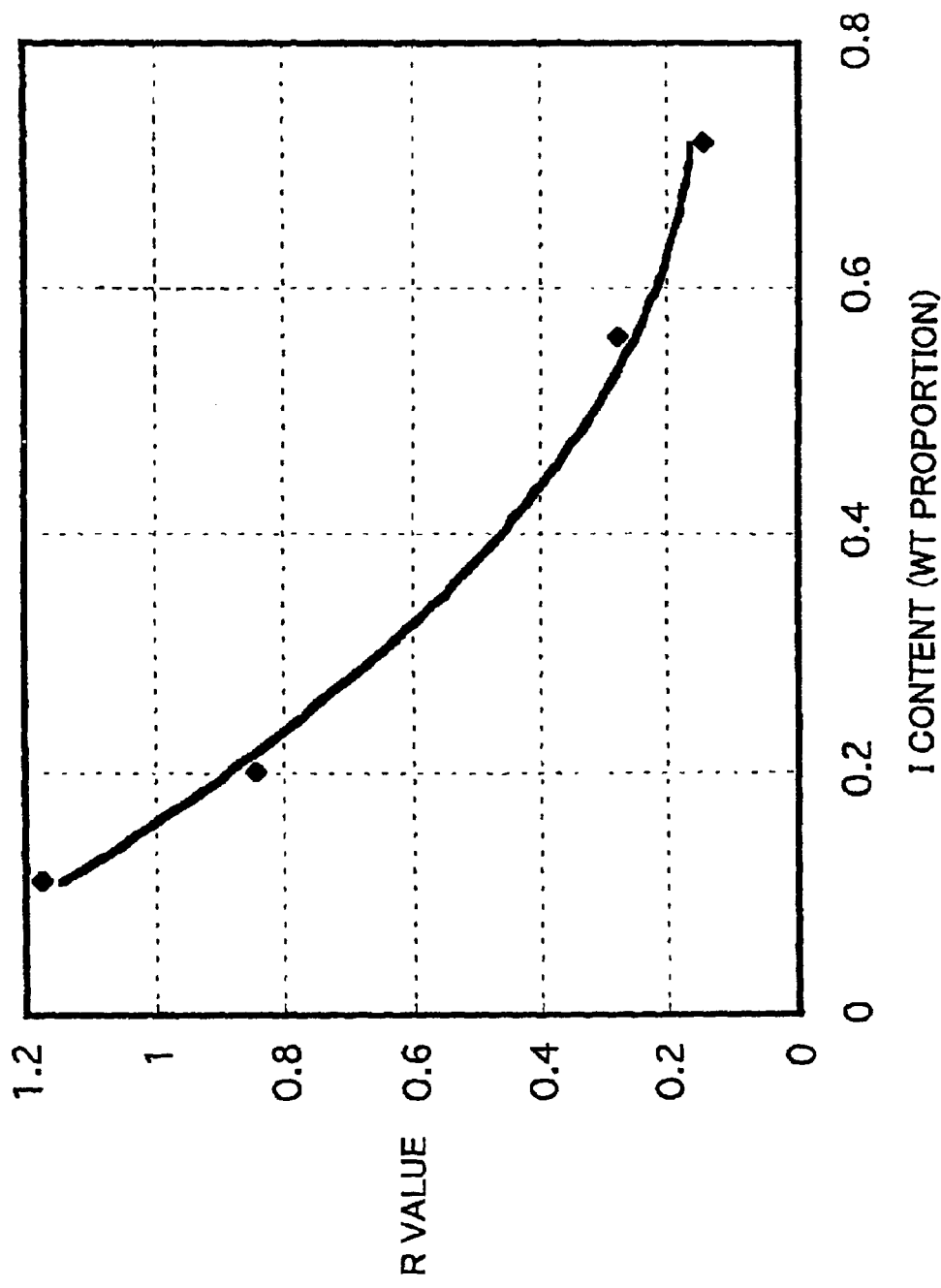
FIG. 58 is a graph showing a relationship between an iodine content in an iodine contained resist and an R value in the X-ray exposure method of a seventeenth embodiment of the present invention.

Then, in FIG. 57, there are shown an absorption spectrum in a resist containing iodine at a content of 56% in use and an absorption spectrum by a tantalum substrate. As seen from FIG. 57, an R value in exposure wavelengths assumes 0.28 and an influence of the tantalum substrate can be sufficiently suppressed. In FIG. 58, there is shown an iodine content dependency of an R value. An R value assumes 0.6 or less in a range of iodine contents of 32% or more, thus enabling suppression of an influence of the tantalum substrate.

Eighteenth Embodiment

In the eighteenth embodiment of the present invention, description will be given of a method for forming a fine pattern on a copper interconnection substrate using X-ray exposure. In fine pattern formation on a copper interconnection substrate using X-ray exposure in the shorter wavelength range, an influence of secondary electrons from a substrate can be reduced by using a combination of proper mirrors and a proper filter and a bromine contained resist.

Since copper has an absorption-edge at 1.3 nm, no method can be use to cut off wavelengths shorter than the absorption-edge of a material of a substrate with mirrors. Therefore, the resist is illuminated with a spectrum having a narrowed wavelength range slightly shorter than an absorption-edge of the resist. For this reason, for example, diamond is used as a mirror material.

As a radiation source, a radiation emitted from a radiation generator with a critical wavelength 0.85 nm is used. The radiation is reflected twice using diamond mirrors and transmitted through a beryllium window with a thickness 20 µm. In this embodiment, an exposure method in a system is used in which a mask surface of a diamond membrane with a thickness 2 µm is illuminated with the transmitted radiation. An angle of oblique incidence is set to 1.2 degree in a case of a copper substrate of this embodiment as in the case of a tantalum substrate.

Figure 59:
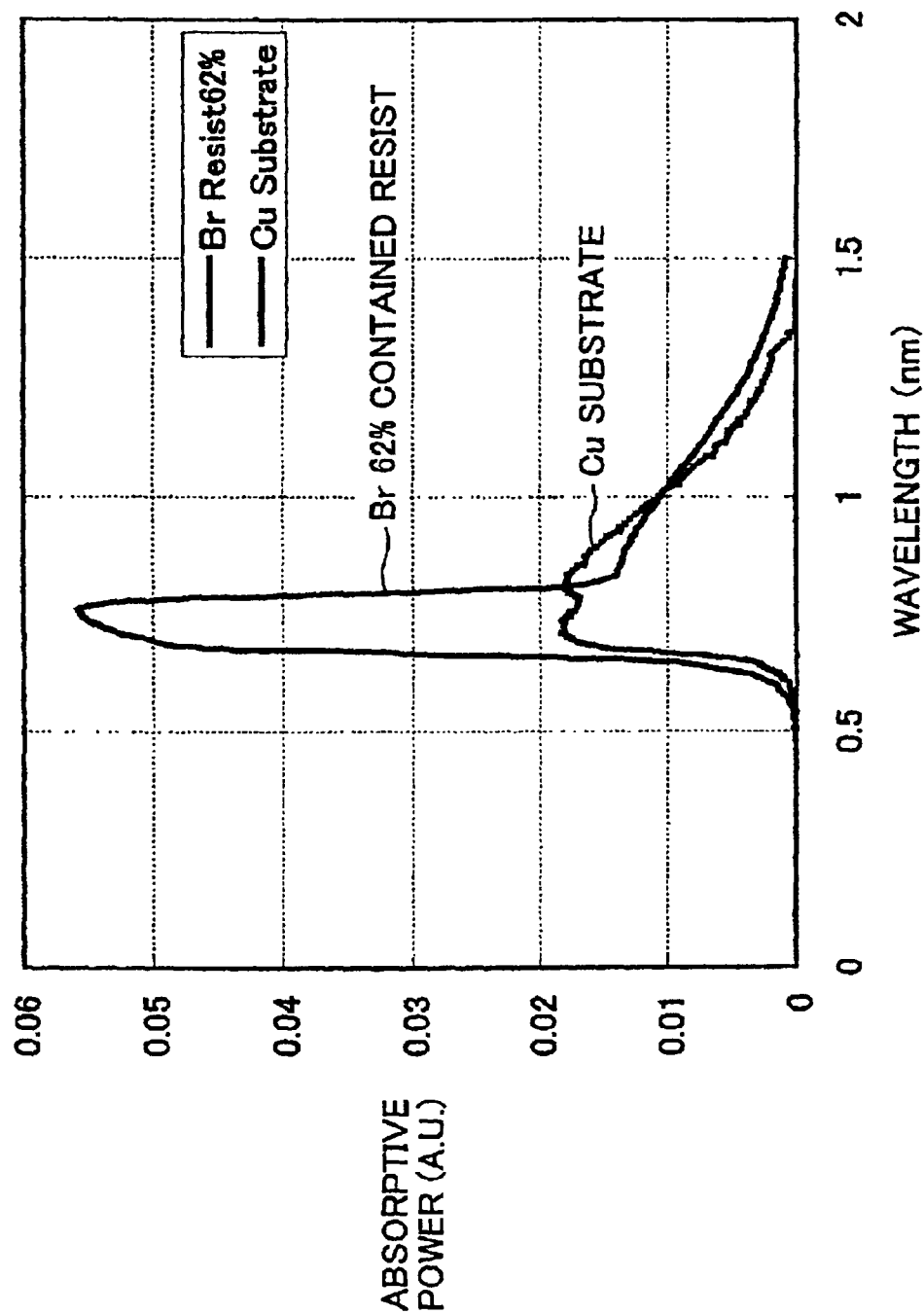
FIG. 59 is a graph showing absorption spectra of a bromine contained resist and an copper substrate in an X-ray exposure method of an eighteenth embodiment of the present invention.

In FIG. 59, there are shown an absorption spectrum in a bromine contained resist at a content of 62% in use and an absorption spectrum by a copper. An R value assumes 0.23 in exposure wavelengths is 0.57 and an influence of the copper substrate can be sufficiently suppressed.

Figure 60:
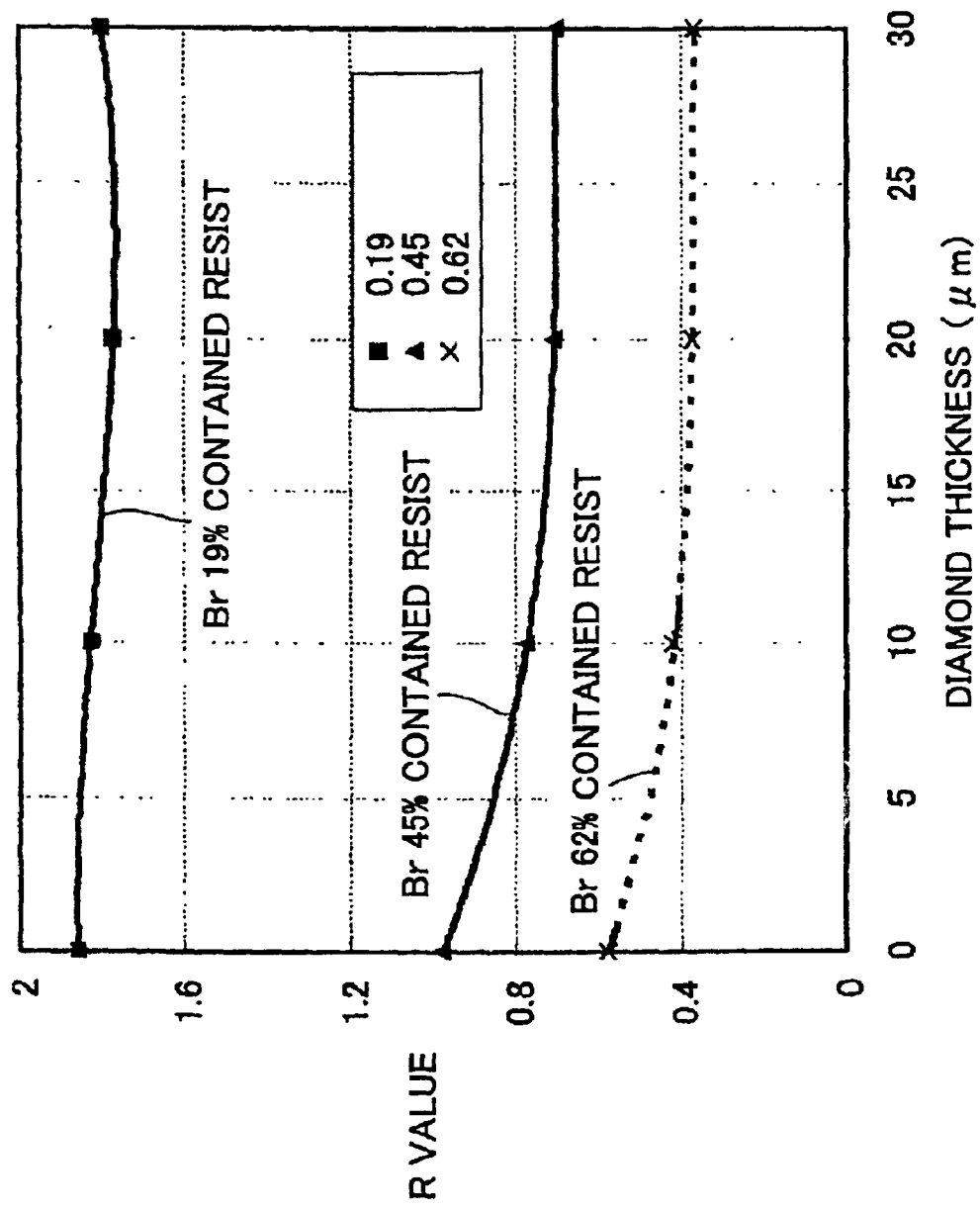
FIG. 60 is a graph showing a relationship between a filter thickness and an R value in each of cases where diamond filters are used in combinations of bromine contained resists and copper substrates in the X-ray exposure method of an eighteenth embodiment of the present invention.

In FIG. 60, there are shown filter thickness dependencies of an R value in cases each of which a diamond filter is inserted. Any of bromine contained resists at respective contents of bromine assumes the minimum of an R value at a diamond thickness 20 µm.

Figure 61:
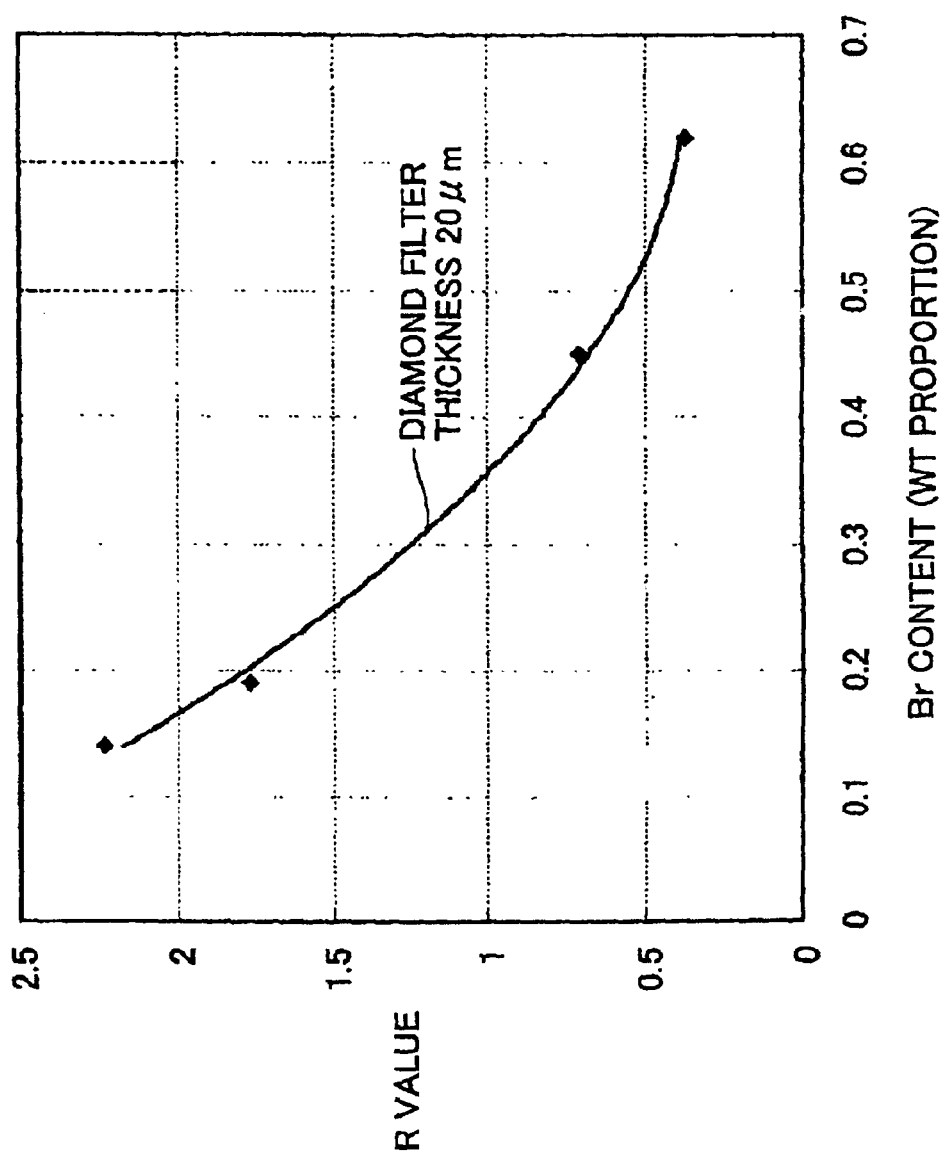
FIG. 61 is a graph showing a relationship between a bromine content in a bromine contained resist and an R value in a case where a thickness of a diamond filter is 20 $\mu$m in the X-ray exposure method of an eighteenth embodiment of the present invention.
Figure 62:
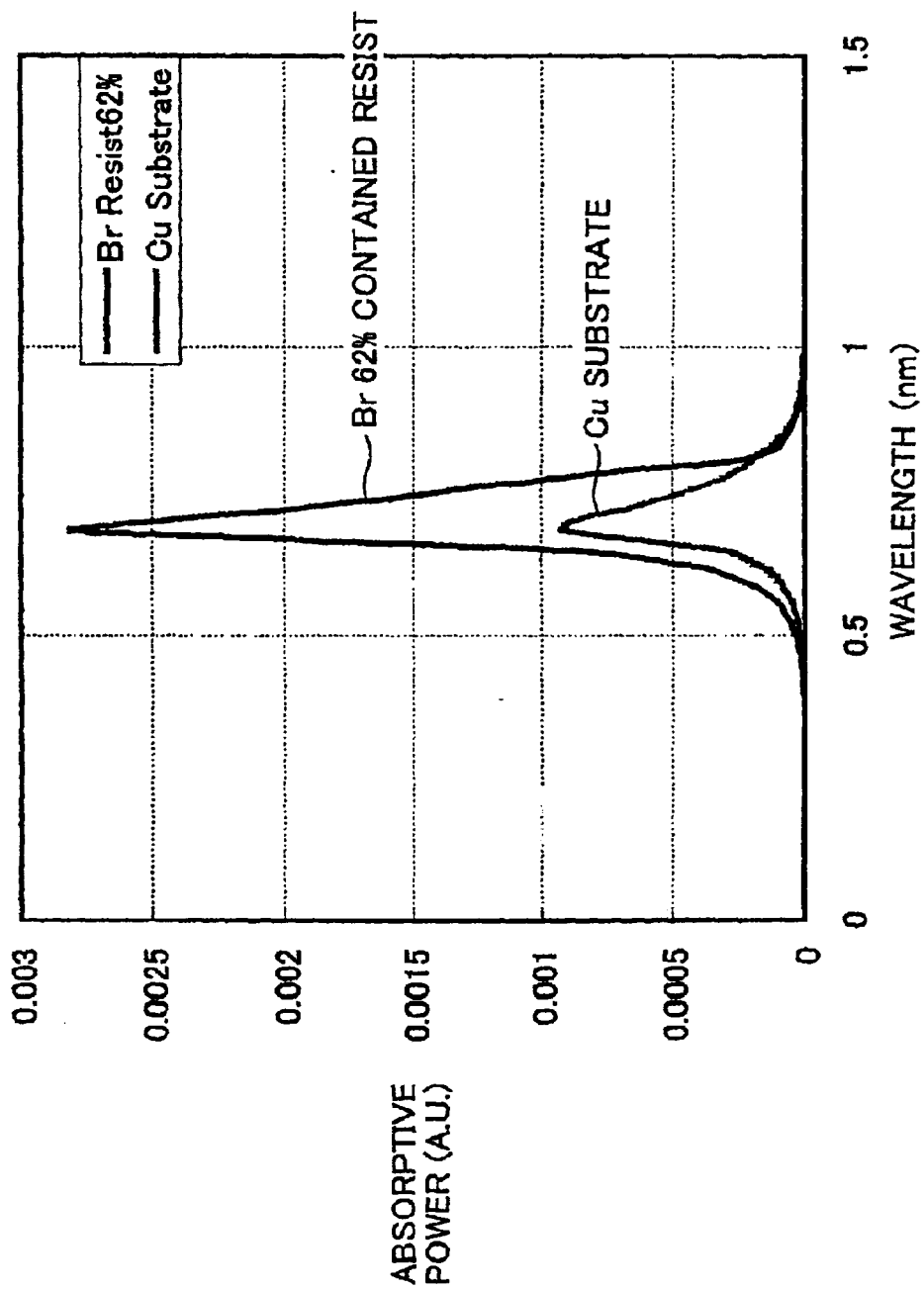
FIG. 62 is a graph showing absorption spectra of a bromine contained resist and a copper substrate in a case where a thickness of a diamond filter is 20 $\mu$m in the X-ray exposure method of an eighteenth embodiment of the present invention.

Further, in FIG. 61, there are shown a bromine content dependency of an R value in a case where a diamond filter of 20 µm in thickness is inserted. With a bromine content of 48% or more, an R value assumes 0.6 or less and an influence of secondary electrons from a copper substrate can be suppressed. In FIG. 62, there are shown an absorption spectrum in a resist and an absorption spectrum by a copper substrate. As seen from FIG. 62, an illumination spectrum is limited in a range as narrow as between 0.65 nm and 0.8 nm and absorbed X-rays are those with a wavelength width equivalent to an energy width of about 350 eV. As a result, Generation of secondary electrons in a substrate can berestricted to the lowest possible level.

Figure 63:
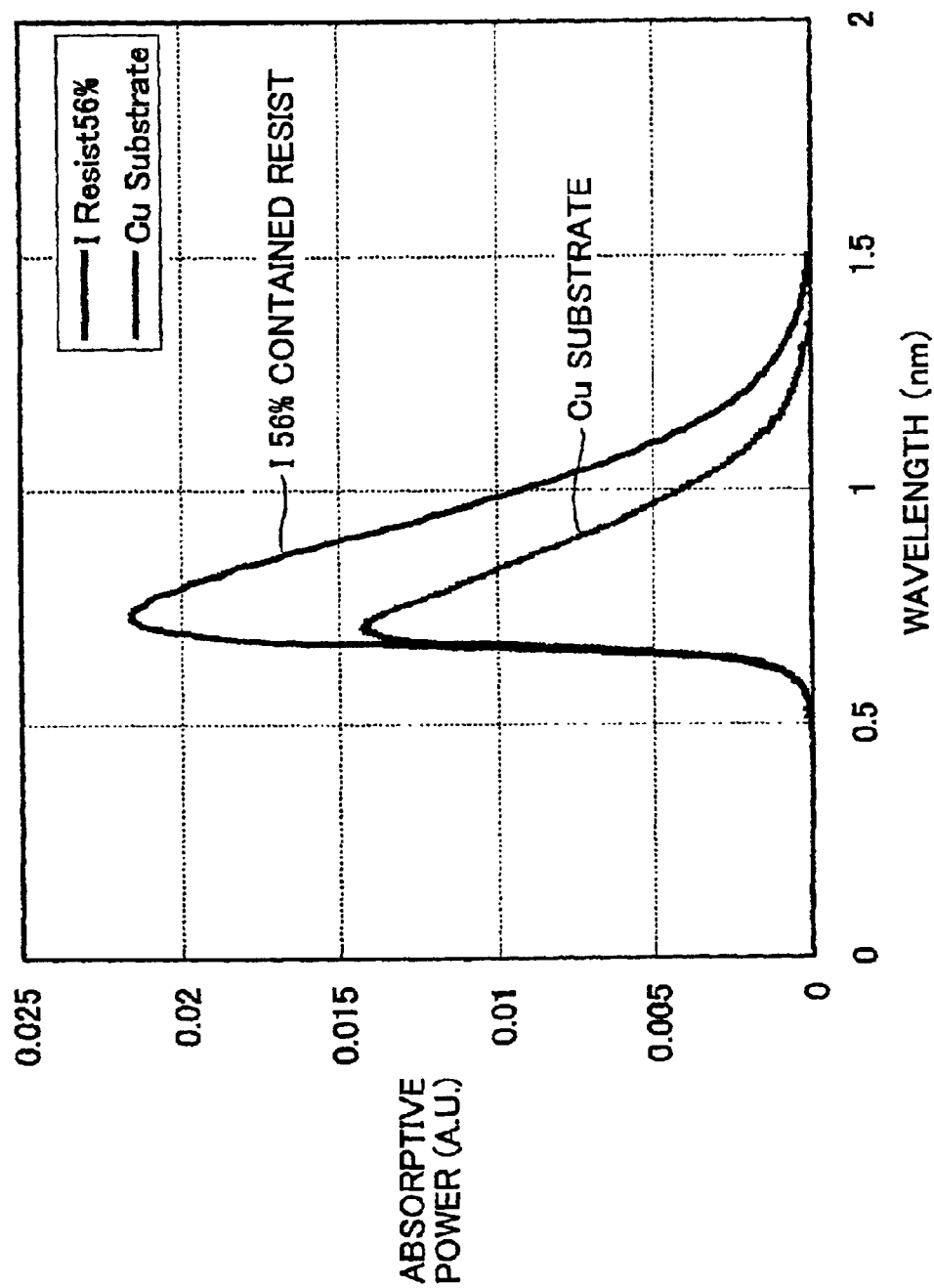
FIG. 63 is a graph showing absorption spectra of an iodine contained resist and a copper substrate in the X-ray exposure method of an eighteenth embodiment of the present invention.
Figure 64:
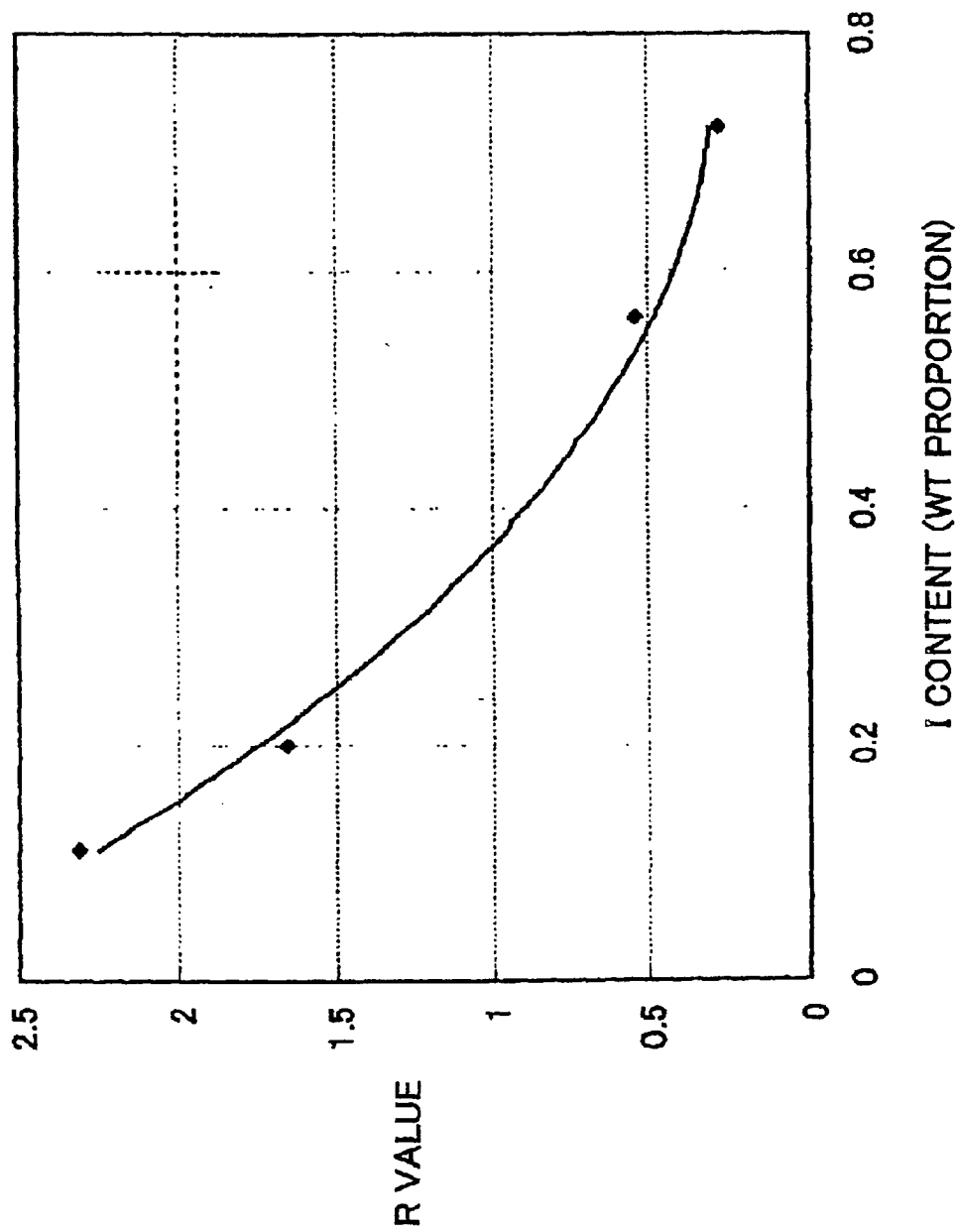
FIG. 64 is a graph showing a relationship between an iodine content in an iodine contained resist and an R value in the X-ray exposure method of an eighteenth embodiment of the present invention.

In FIG. 63, there are shown an absorption spectrum in a case where a iodine contained resist at a content of 56% and an absorption spectrum by a copper substrate. An R value shows 0.54 and an influence of secondary electrons from a copper substrate can be sufficiently suppressed. In a case of iodine, no absorption-edge resides within an illumination wavelength range, and thus, no need arises for inserting a filter. In FIG. 64, there is shown an iodine content dependency of an R value. With an iodine content of 48% or more, an R value assumes 0.6 or less and it is understood that an influence of secondary electrons from a copper substrate can be sufficiently suppressed.

Nineteenth Embodiment

In the nineteenth embodiment of the present invention, description will be given of a method for forming a fine pattern on a gallium arsenide substrate using X-ray exposure. An influence of secondary electrons from a gallium aresenide interconnection substrate can be reduced by using a proper construction including mirrors and a filter, and a bromine contained resist and applying a method according to this embodiment. Since gallium has an absorption-edge at 1.5 nm and arsenic has an absorption-edge in the vicinity of 9.2 nm, no method is adopted that cuts off wavelengths shorter than an absorption-edge of a material of a substrate with mirrors. Therefore, the resist is illuminated with a narrow spectrum having a wavelength range slightly shorter than the absorption-edge of the resist. For this reason, for example, diamond is used as a mirror material.

As a radiation source, a radiation emitted from a radiation generator (SR apparatus) with a critical wavelength 0.85 nm is used. The radiation is reflected twice using diamond mirrors and transmitted through a beryllium window with a thickness 20 µm. In this embodiment, an exposure method in a system is described in which a mask surface of a diamond membrane with a thickness 2 µm placed on a gallium arsenide substrate is illuminated with the transmitted radiation. An angle of oblique incidence is set to 1.2 degree in a case of a gallium arsenide substrate, too, as in the case of a tantalum substrate.

Figure 65:
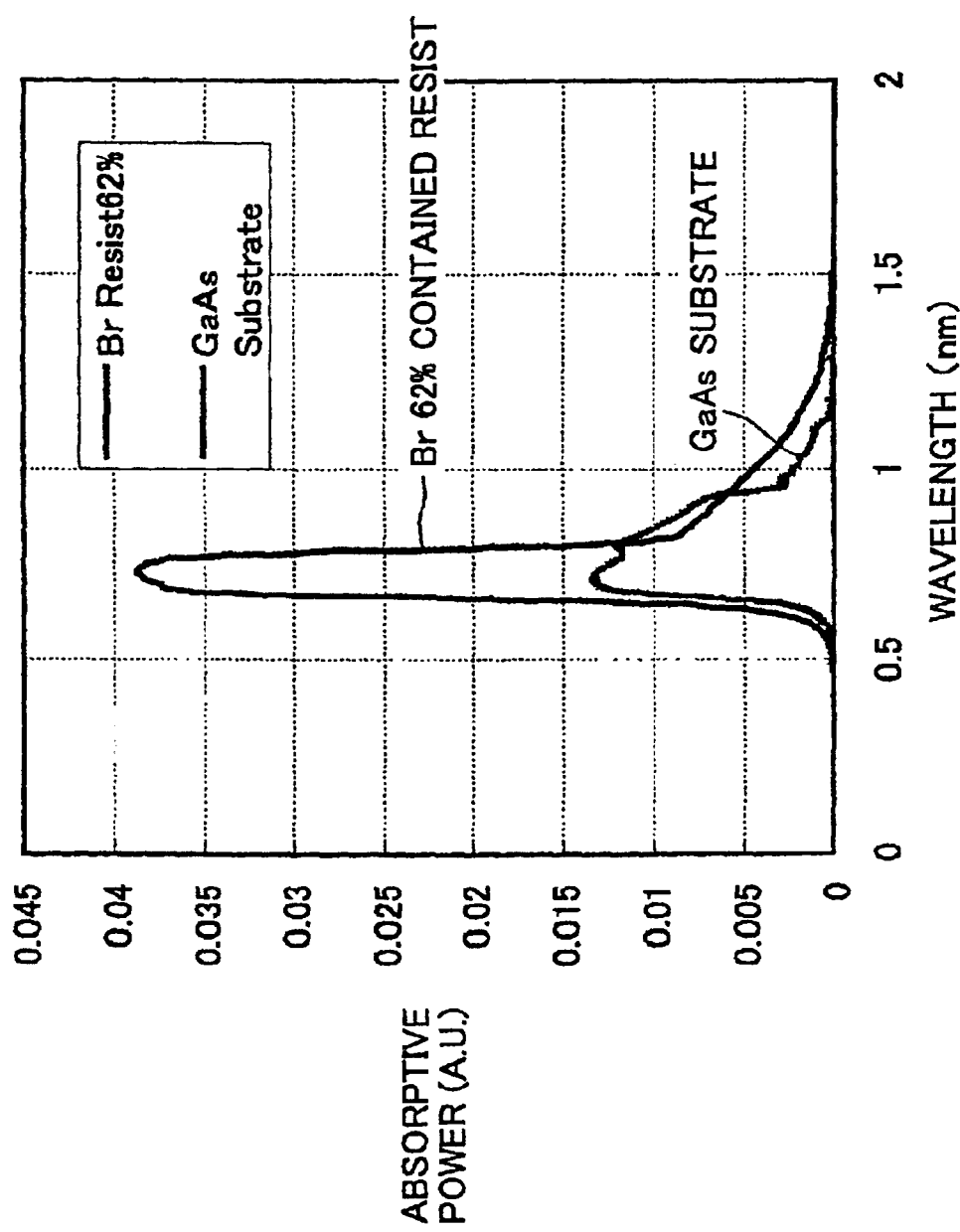
FIG. 65 is a graph showing absorption spectra of a bromine contained resist and a gallium arsenide substrate in an X-ray exposure method of a nineteenth embodiment of the present invention.
Figure 66:
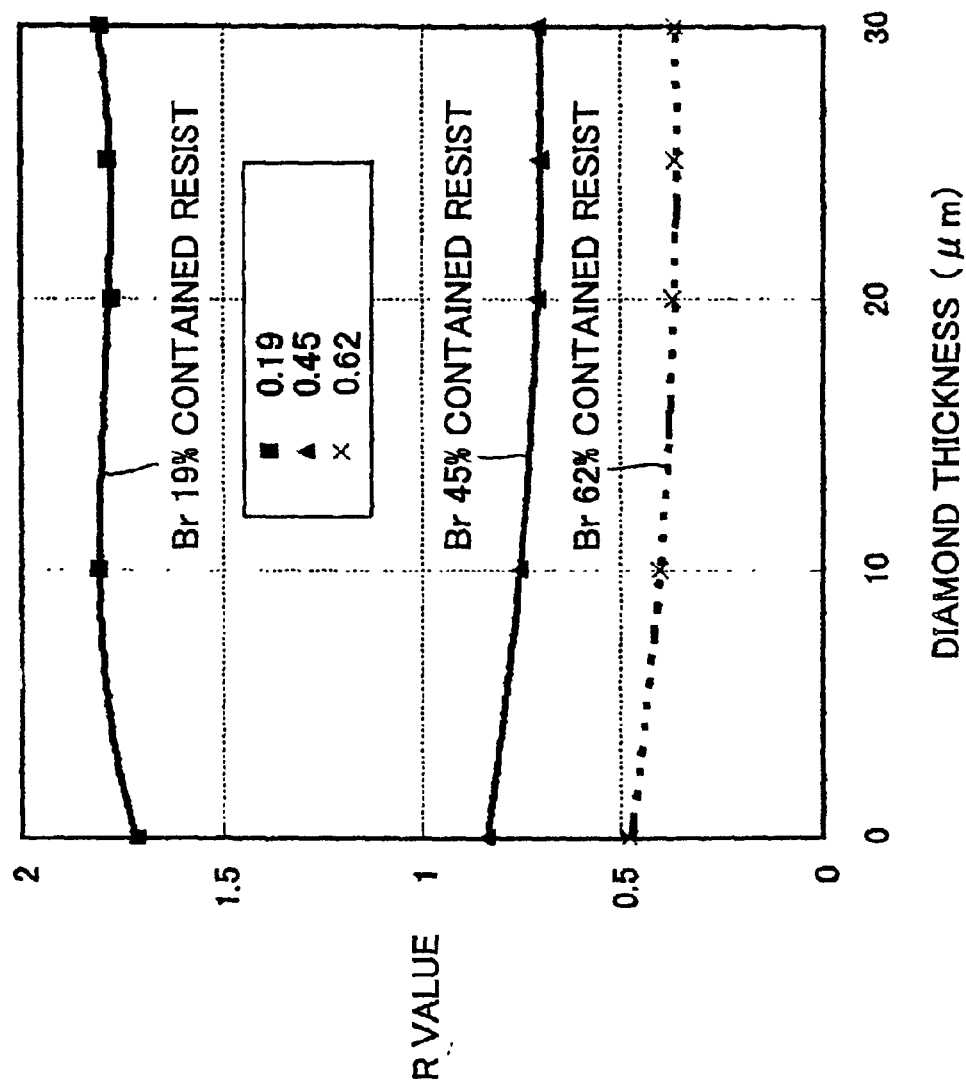
FIG. 66 is a graph showing a relationship between a filter thickness and an R value in each of cases where diamond filters are used in combinations of bromine contained resists and gallium arsenide substrates in the X-ray exposure method of a nineteenth embodiment of the present invention.

In FIG. 65, there are shown an absorption spectrum in a resist containing bromine at a content of 62% in use and an absorption spectrum by a gallium arsenide substrate. As seen from FIG. 65, an R value is obtained as 0.48. The R value is 06 or less and an influence of a gallium arsenide substrate can be sufficiently suppressed. In FIG. 66, there are shown filter thickness dependencies of an R value in cases in each of which a diamond filter is inserted. Any of bromine contained resists at respective contents of bromine assumes the minimum of an R value at diamond thicknesses ranging from 20 to 25 µm.

Figure 67:
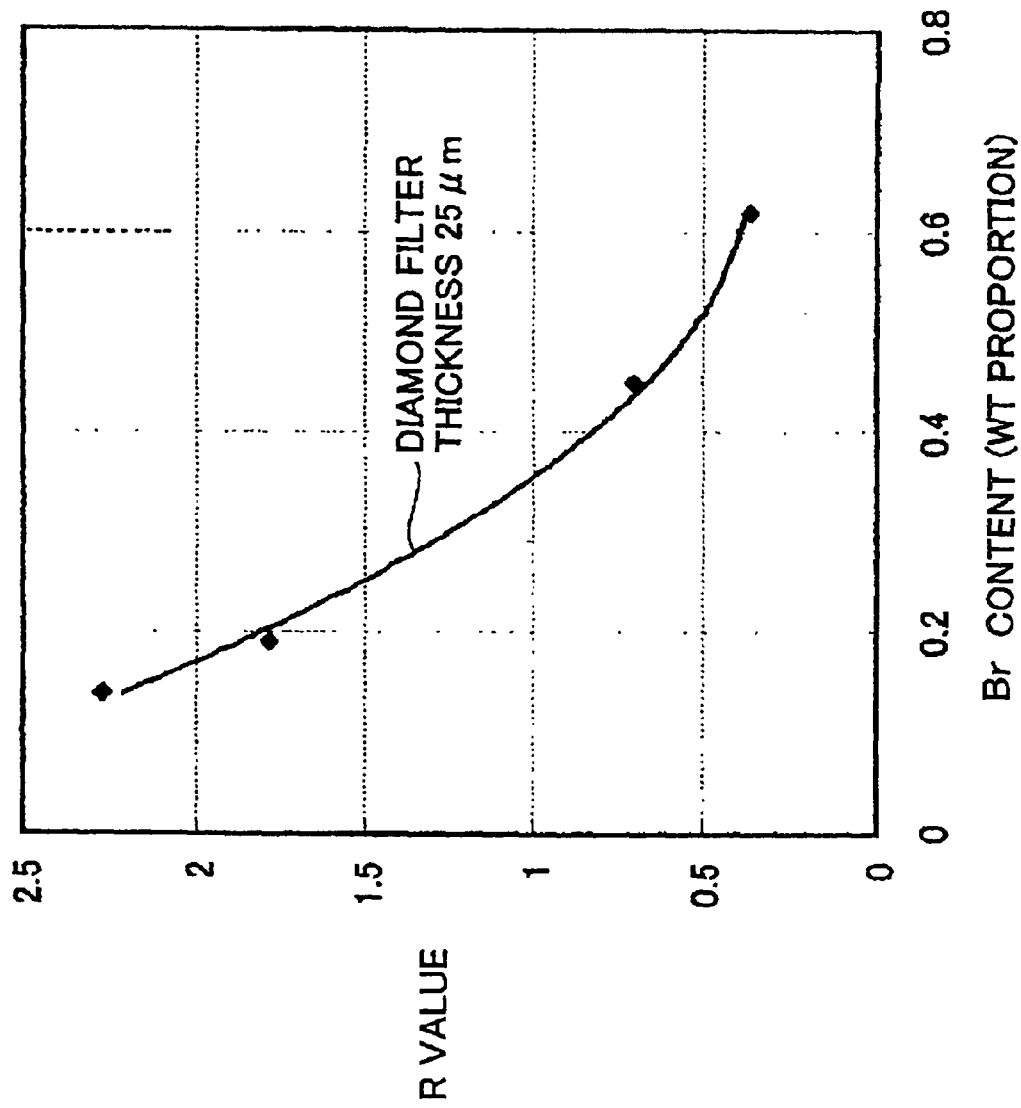
FIG. 67 is a graph showing a relationship between a bromine content in a bromine contained resist and an R value in a case where a thickness of a diamond filter is 20 $\mu$m in the X-ray exposure method of a nineteenth embodiment of the present invention.

Further, in FIG. 67, there are shown a bromine content dependency of an R value in a case where a diamond filter of 25 µm in thickness is inserted. With a bromine content of 48% or more, an R value assumes 0.6 or less and an influence of secondary electrons from a gallium arsenide substrate can be suppressed.

Twentieth Embodiment

In the twentieth embodiment of the present invention, description will be given of a method using a material having no absorption-edge in a wavelength range such as diamond, boron nitride or the like as a filter used for obtaining shorter wavelengths. In the seventh embodiment, it is described that by using a mask substrate or a filter containing a silicon such as an SiC substrate, secondary electrons from a silicon substrate can be suppressed. In this embodiment, a material is used that has no absorption-edge in a wavelength such as diamond, boron nitride or the like as a filter used for obtaining shorter wavelengths.

As a radiation source, a radiation emitted from a radiation generator with a critical wavelength 0.846 nm is used. The radiation is reflected twice using cobalt mirrors with an angle of oblique incidence 1 degree and transmitted through a beryllium window with a thickness 20 µm. In this embodiment, a system is used in which a mask surface of a diamond membrane with a thickness 2 µm is illuminated with the transmitted radiation to form a pattern on a silicon substrate.

Figure 68:
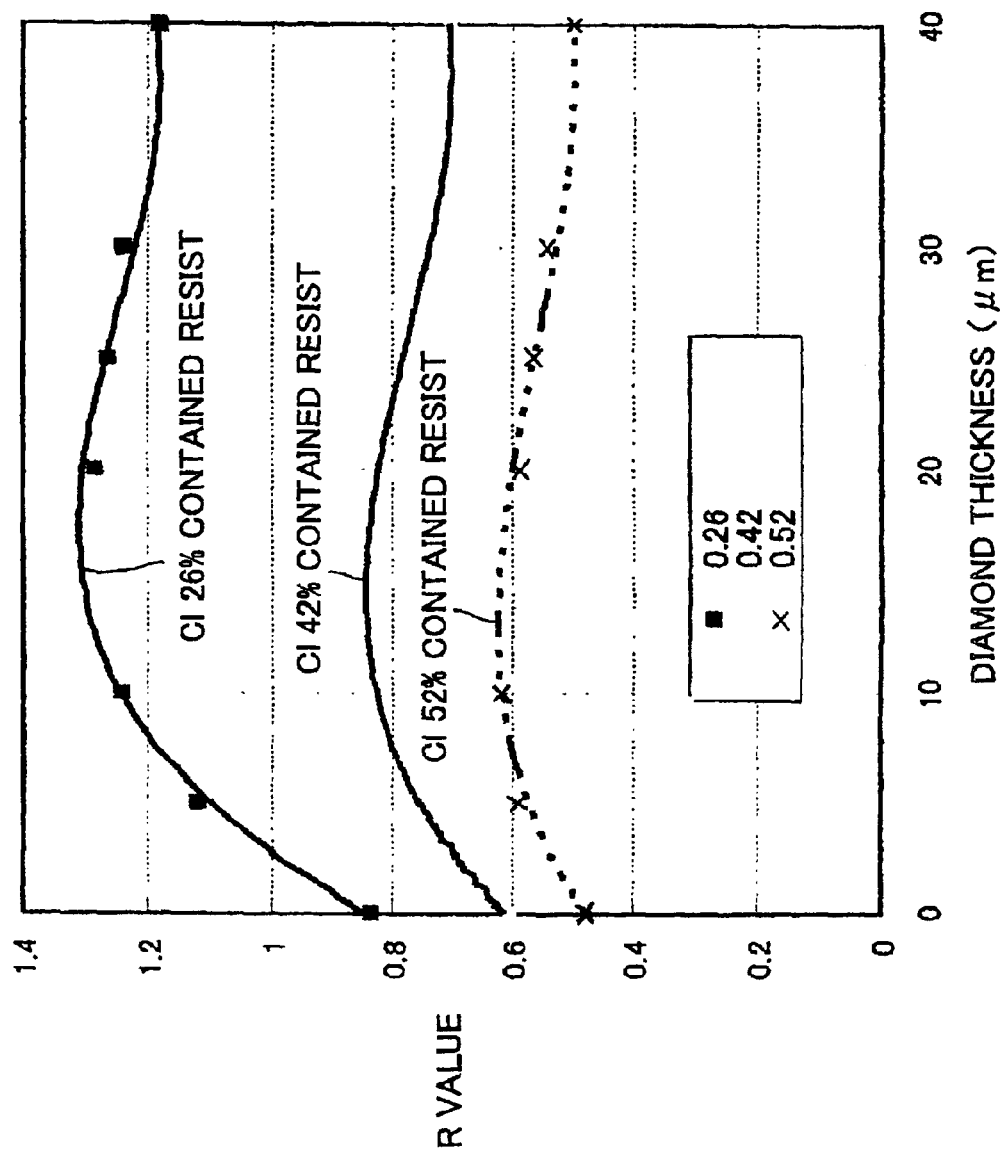
FIG. 68 is a graph showing a relationship between a filter thickness and an R value in each of case where diamond filters are used in combinations of chlorine contained resists and silicon substrates in an X-ray exposure method of a twentieth embodiment of the present invention.

In FIG. 68, there are shown diamond thickness dependencies of an R value in cases where chlorine containing resists are used. In a case of a chlorine contained resist, a tendency is observed that with a thickness of a diamond filter (membrane), an R value increases, but there exists a point at which an R value is reduced in the vicinity of 30 µm. In a case of a resist of a chlorine content 52%, an R value never exceeds 0.6 independently of a thickness of a diamond filter; therefore, no necessity arise for regarding an influence of a silicon substrate as a problem.

Figure 69:
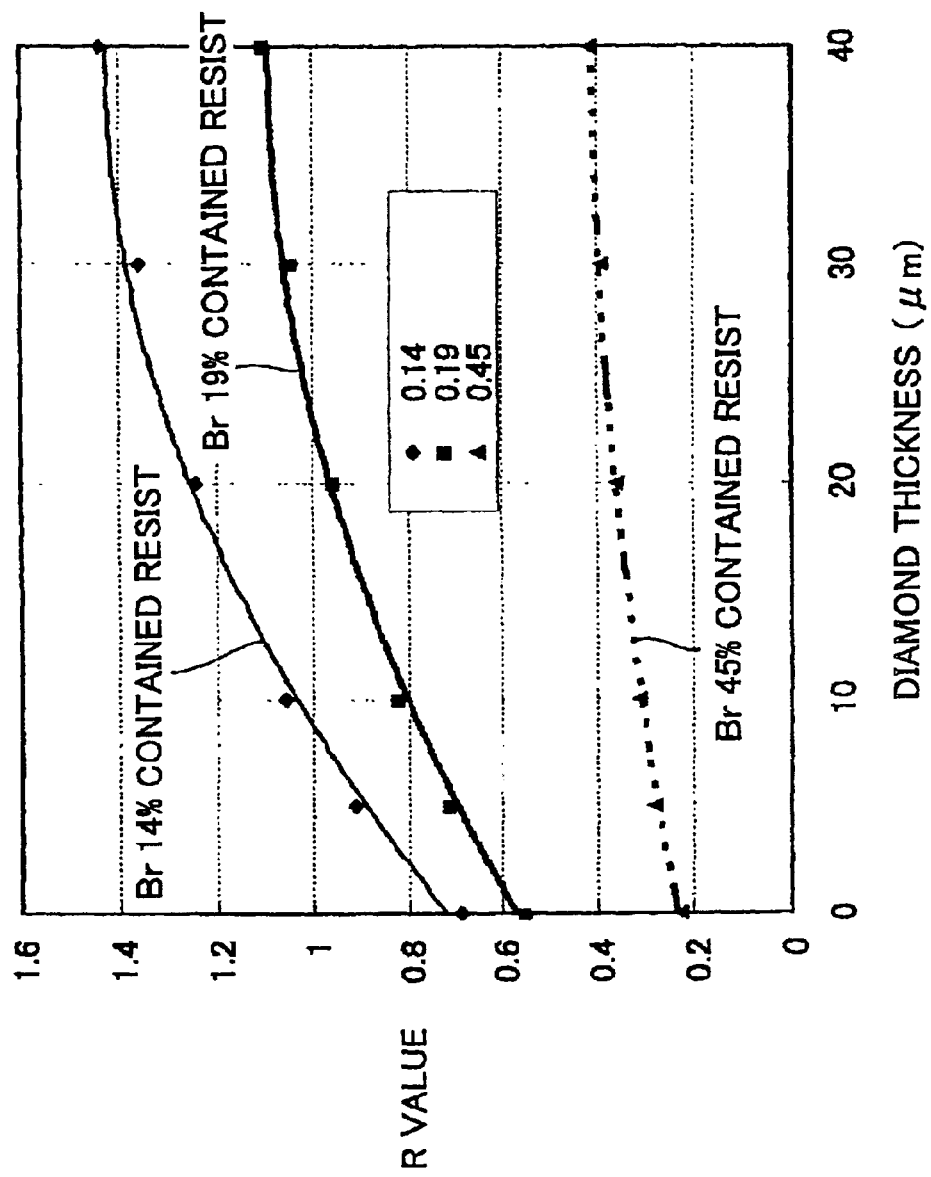
FIG. 69 is a graph showing a relationship between a filter thickness and an R value in each of cases where diamond are used in combinations of bromine contained resists and silicon substrates in the X-ray exposure method of a twentieth embodiment of the present invention.

In FIG. 69, there are shown a diamond filter thickness dependencies of an R value in cases of bromine contained resists in use. In a case of a bromine contained resist, an R value increases with increase in thickness of a diamond filter (membrane). With a boron content of 45% or more however, an R value assumes 0.6 or less; therefore, no necessity arise for regarding an influence of a silicon substrate as a problem.

In a case where a thickness of a filter is determined in response to a request for shorter wavelengths as an exposure wavelength range, the lowest necessary content of bromine can be estimated with ease by again plotting a curve in FIG.

Figure 70:
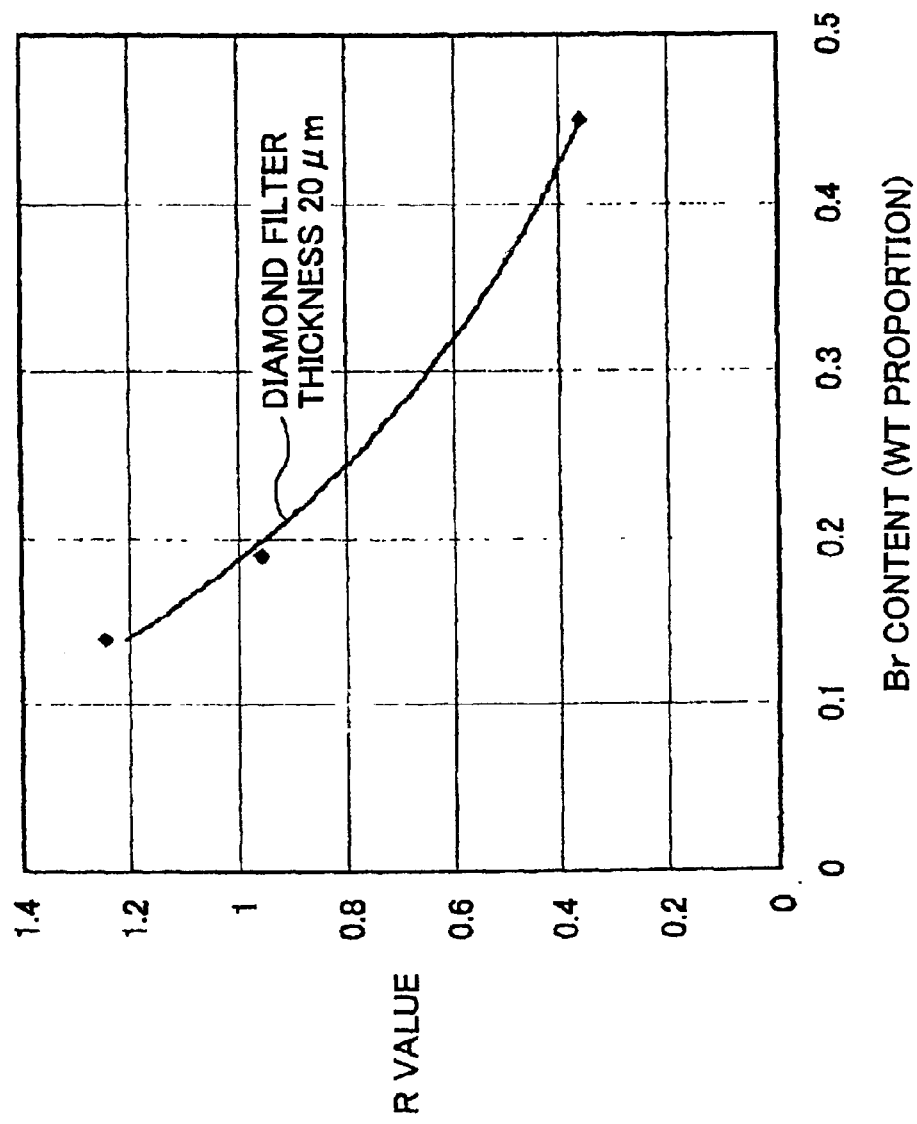
FIG. 70 is a graph showing a relationship between a bromine content in a bromine contained resist and an R value in a case where a thickness of a diamond filter is 20 $\mu$m in the X-ray exposure method of a twentieth embodiment of the present invention.

69. For example, in a case where a thickness of a diamond filter is 20 μm, a correlation between an R value and a bromine content is as shown in FIG. 70 and it is understood that an influence of secondary electrons from a silicon substrate is non-problematic at a bromine content of 28% or more.

Twenty-First Embodiment

In the twenty-first embodiment of the present invention, description will be given of a method for forming a pattern on a silicon substrate using X-rays in the shorter wavelength range. As a radiation source, a radiation emitted from a radiation generator (SR apparatus) with a critical wavelength 0.846 nm is used. The radiation is reflected twice using nickel mirrors with an angle of oblique incidence 1 degree and transmitted through a beryllium window with a thickness 20 μm. In this embodiment, a surface of a mask with a diamond membrane with a thickness 2 μm as a transmissive part is illuminated with the transmitted radiation to form a pattern on a resist coated on a silicon substrate.

Figure 71:
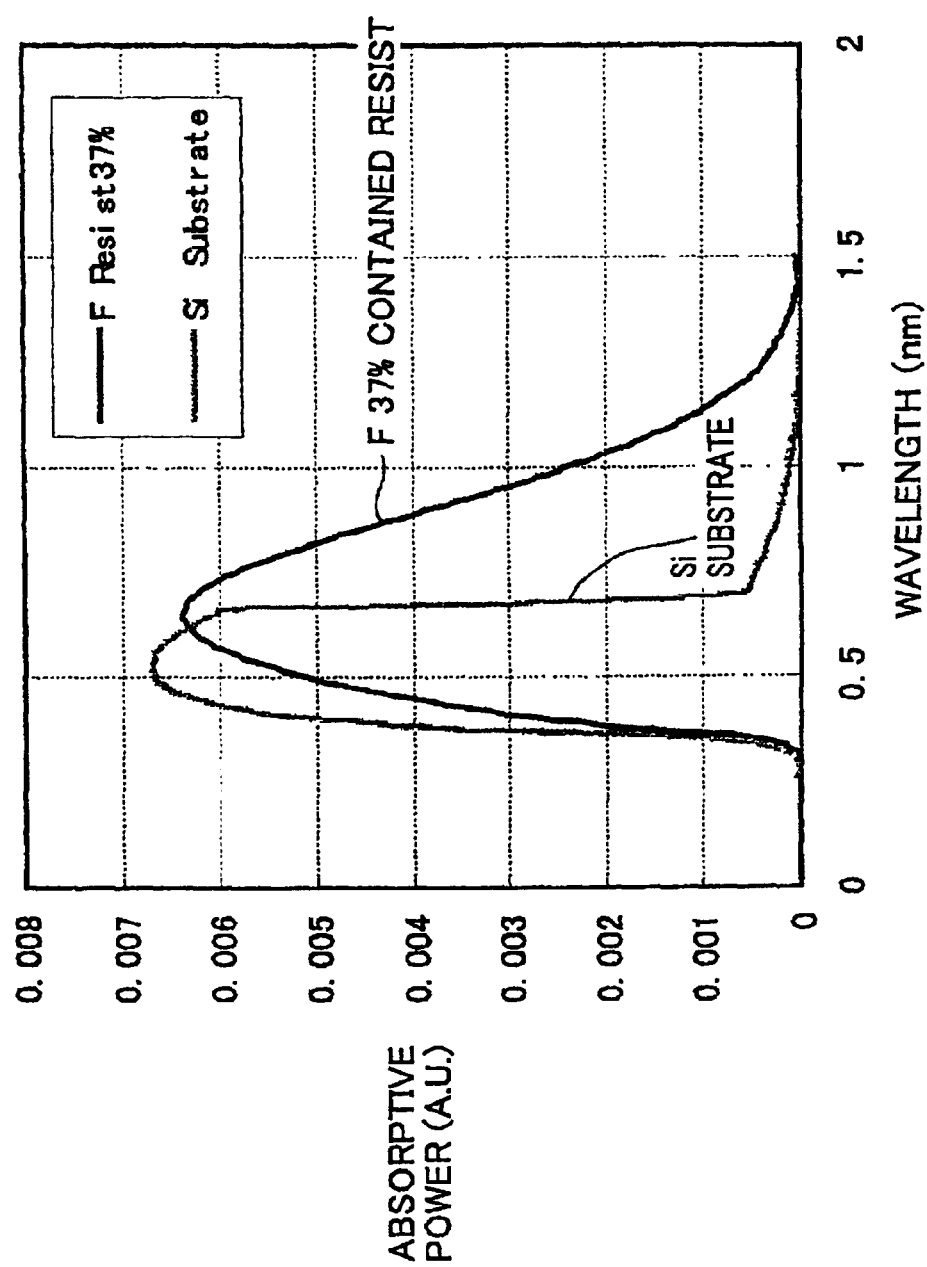
FIG. 71 is a graph showing absorption spectra of a fluorine contained resist and a silicon substrate in an X-ray exposure method of a twenty-first embodiment of the present invention.

A resist in use is a fluorine contained resist, which is a mixture in proportion of 3 atoms of fluorine to 1 unit of PMMA (C:H:O=5:8:2). A content of fluorine in the resist at this time is 37 wt %. In FIG. 71, there are shown a spectrum absorbed in the resist containing fluorine at a content 37% and a spectrum of secondary electrons emitted from a silicon substrate into the resist. Both correspond to the denominator of the evaluation formula (1) and the numerator thereof. By obtaining an R value on the basis of the spectra, an R value is 0.60, allowing to determine that an influence of the substrate is not problematical.

Figure 72:
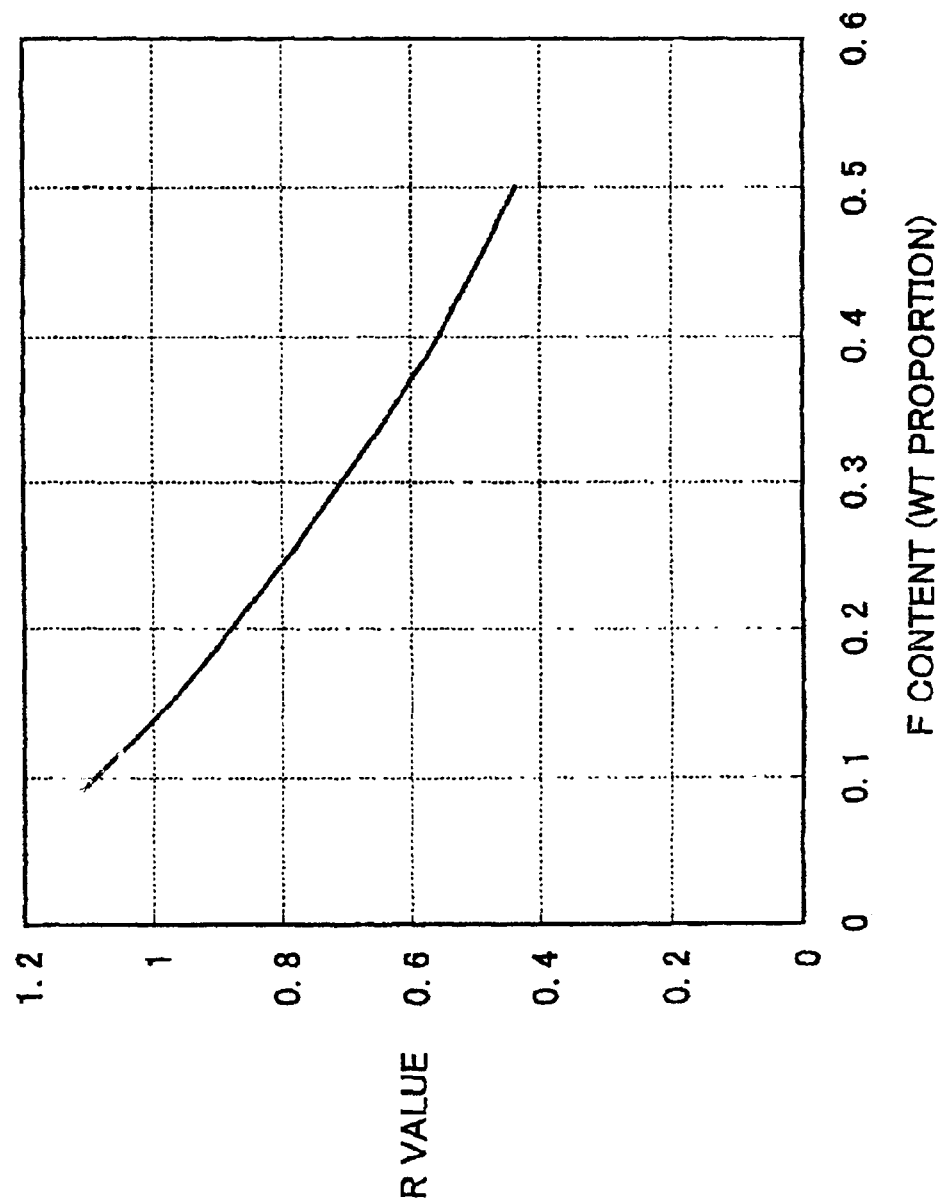
FIG. 72 is a graph showing a relationship between a fluorine content in a fluorine contained resist and an R value in the X-ray exposure method of a twenty-first embodiment of the present invention.

Furthermore, FIG. 72 is a graph showing a fluorine content dependency of an R value in the same system. According to the figure, an R value decreases monotonously with a content of fluorine and shows a value of 0.6 or less in the range of chlorine contents of 37% or more; therefore, it is understood that no necessity arise for regarding an influence of secondary electrons from a silicon substrate as a problem.

Twenty-Second Embodiment

Figure 73:
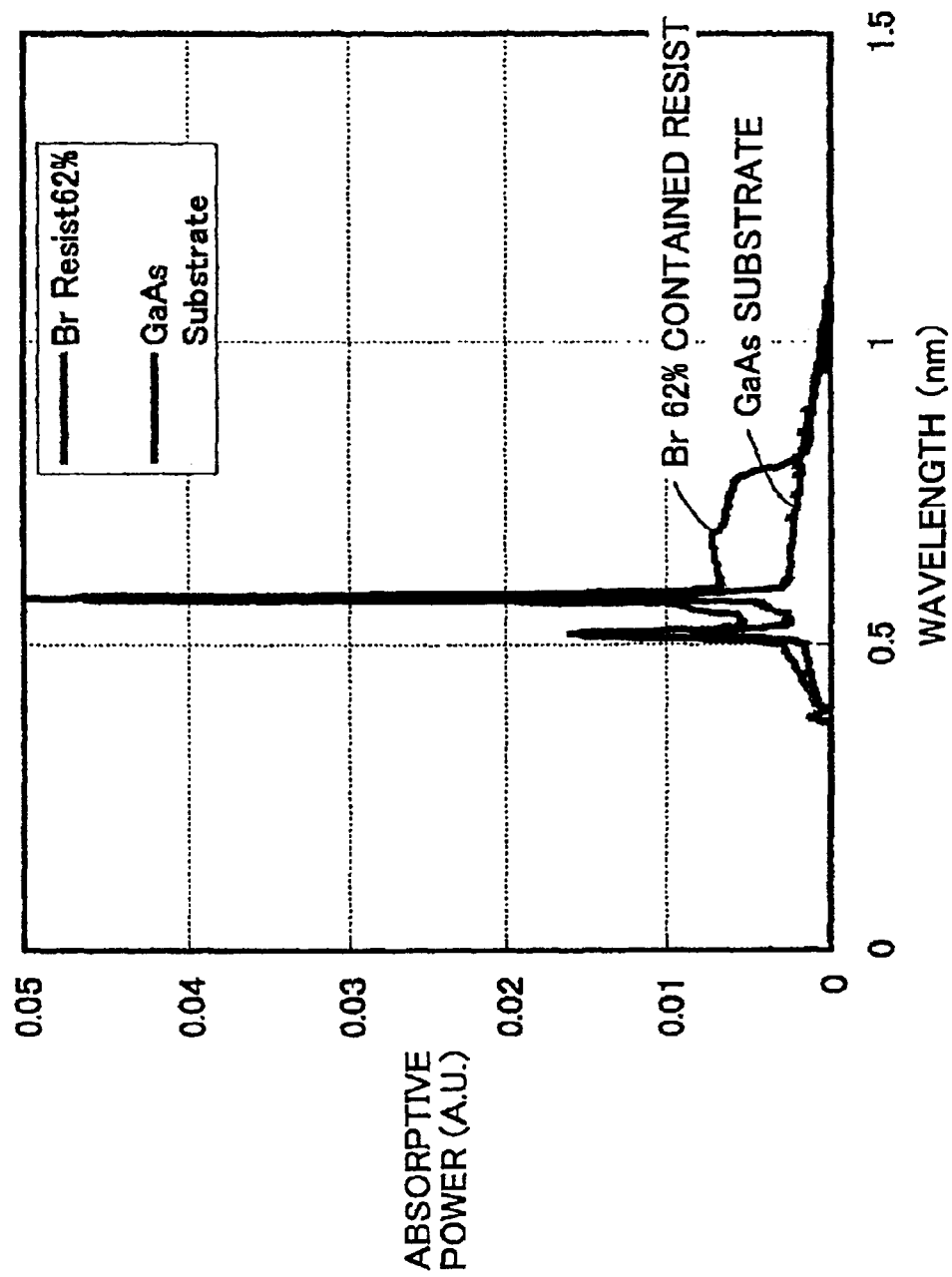
FIG. 73 is a graph showing absorption spectra of a bromine contained resist and a silicon substrate in an X-ray exposure method of a twenty-second embodiment of the present invention.
Figure 74:
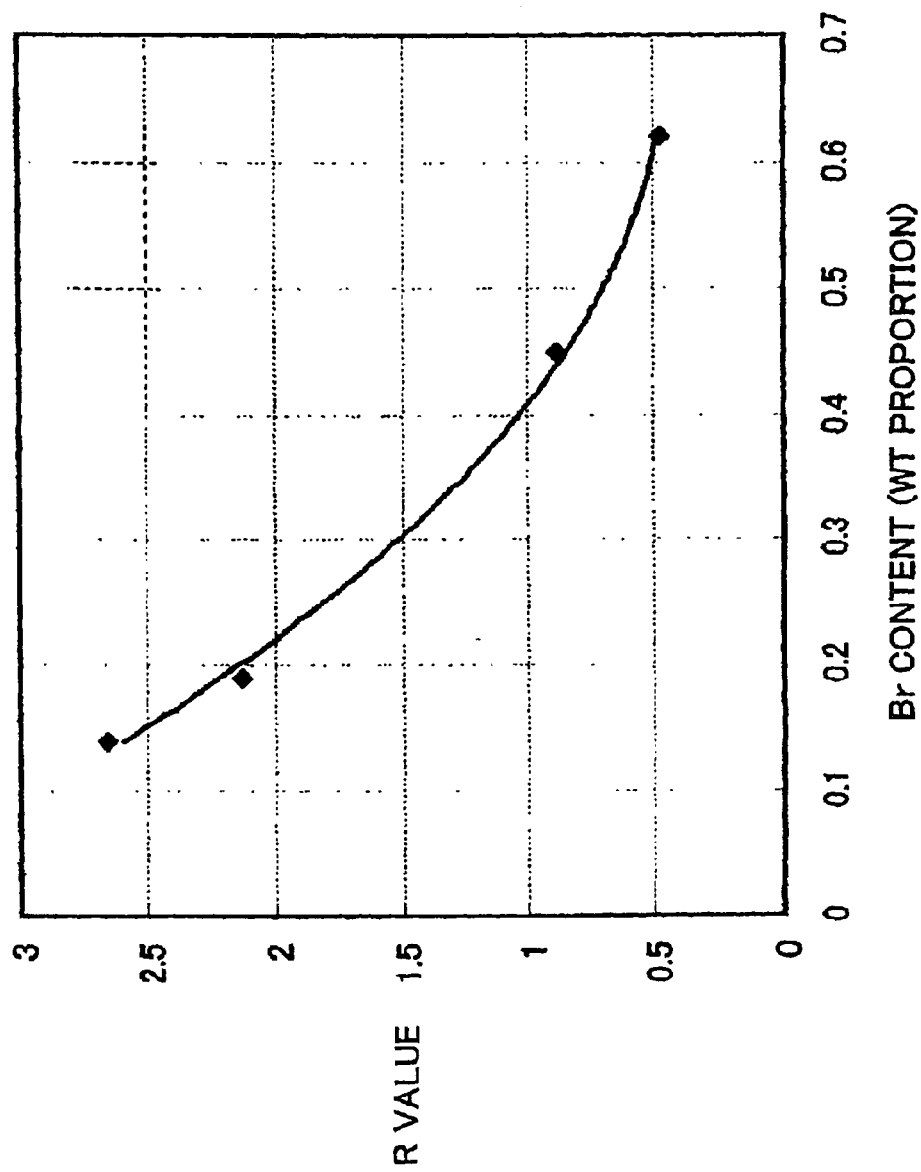
FIG. 74 is a graph showing a relationship between a bromine content in a bromine contained resist and an R value in the X-ray exposure method of a twenty-second embodiment of the present invention.

In the twenty-second embodiment of the present invention, a pattern is formed on a gallium substrate using a system in which a surface of a mask with a diamond membrane of a thickness 2 μm as a transmissive part is illuminated with characteristic X-rays emitted from rhodium. In FIG. 73, there are shown an absorption spectrum in a bromine containedresist at a content 62% in use and an absorption spectrum of a gallium arsenide substrate. From the figure, an R value-is obtained as 0.47 using the equation (1). The R value means that an influence of secondary electrons from a gallium arsenide substrate can be sufficiently suppressed. FIG. 74 is a graph showing a bromine content dependency of an R value in the same system. According to the figure, with a bromine content of 55% or more, an R value assumes 0.6 or less, allowing to determine that an influence of secondary electrons from the substrate is not problematical.

Twenty-Third Embodiment

Figure 75:
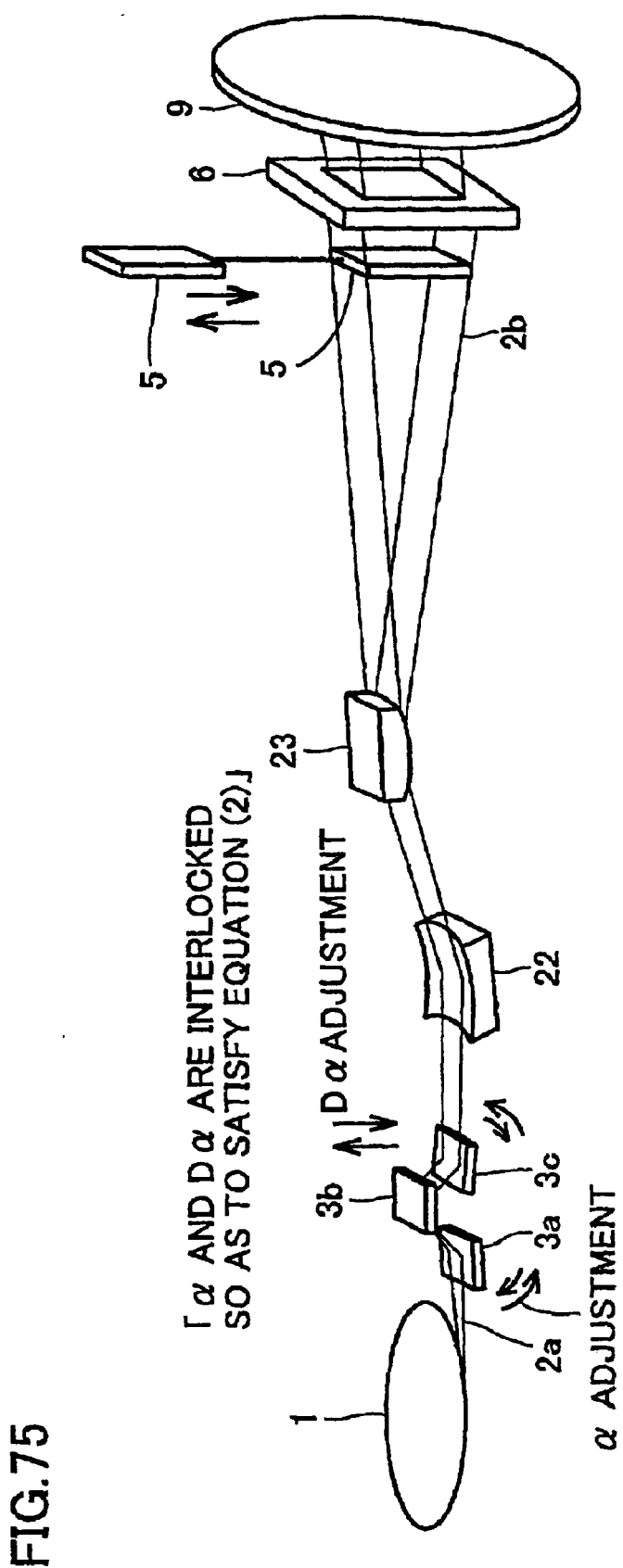
FIG. 75 is a perspective view describing an X-ray exposure apparatus of a twenty-third embodiment of the present invention.

FIG. 75 is a perspective view describing an X-ray exposure apparatus in the twenty-third embodiment of the present invention. A synchrotron radiation apparatus includes: a synchrotron radiation source 1; X-ray mirrors, which are plane mirrors, 3a, 3b and 3c; a collective mirror 22; a magnifying mirror 23; and a filter 5. The X-ray exposure apparatus further includes the synchrotron radiation apparatus and an X-ray mask 6. X-rays mirrors 3a, 3b and 3c are made of beryllium. X-rays as radiation are emitted from the synchrotron radiation apparatus, which is a radiation source.

A radiation 2a emitted from synchrotron radiation source 1 passes through X-ray mirrors 3a, 3b and 3c, through collective mirror 22 and magnifying mirror 23, and then through X-ray mask 6 to impinge onto a substrate 9 with a resist coated thereon.

X-ray mirrors 3a, 3b and 3c are arranged so as to satisfy the following formula:

$$L=\{D\alpha/\tan(2\alpha)\}=\{D\beta/\tan(2\beta)\} \qquad (2)$$

Figure 76:
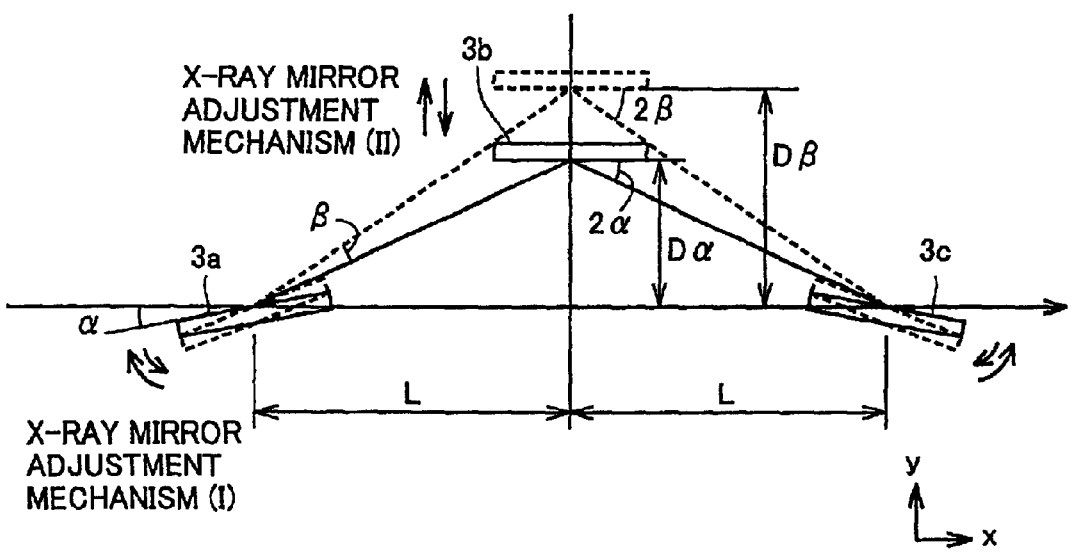
FIG. 76 is an illustration of a configuration of X-ray reflecting mirrors in the twenty-third embodiment of the present invention.

Symbols in the above formula are as shown in FIG. 76. An angle α between an incident X-ray direction and X-ray mirror 3a are functionally interlocked with an angle β and a distance Dα and a construction is designed so as to satisfy the above formula (2) even when any of α, β and Dα is changed. In this embodiment, there is provided, for example, an X-ray mirror adjustment mechanism (I) by which α can be adjusted from outside of the X-ray exposure apparatus. Such an α adjustment mechanism can be constructed with high precision using an existing mechanism such as an interlocking gear train or the like. The X-ray mirror adjustment mechanism (I) can change α, therefore Dα, with high precision while satisfying the formula (2) with a constant distance L along a incident radiation ray axis of the X-ray reflecting mirrors. Needless to say that a mechanism may be provided in which all of α, β and Dα, and L are all interlocked with each other so as to satisfy the formula (2) without keeping distance L constant.

Since X-ray mirrors 3a, 3b and 3c are rotated by X-ray mirror adjustment mechanism (I) so as to satisfy the above formula, an optical axis of radiation, which is a reflecting radiation, emitted from X-ray mirror 3c almost superimposes on an optical axis 2a of radiation emitted from synchrotron radiation apparatus 1. This relation in arrangement is constructed so as not to change even in rotation by the α adjustment mechanism. That is, even when locations of X-ray mirrors 3a, 3b and 3c, and an angle α of oblique incidence to X-ray mirrors 3a, 3b and 3c (see FIG. 76) are changed, movements in the construction are performed so as to satisfy the above formula (2); therefore, an optical axis of radiation emitted from X-ray mirror 3c can be kept in such an arrangement as to almost superimpose on an optical axis of radiation 2a emitted from synchrotron radiation source 1. As a result, even when an angle of oblique incidence α of radiation to X-ray mirrors 3a, 3b and 3c is changed, a position of an optical axis of radiation incident on collective mirror 22 can be kept constant. Here, while description is given of a case where α is externally adjusted, similar description also applies to an X-ray mirror adjustment mechanism (II) for Dα adjusted externally. In this case, since a change in the construction occurs so as to satisfy the formula (2) with L at a constant value, needless to say that α also changes in company with a change in Dα. A mechanism can also be realized by which movements in the construction can be performed changing α, Dα and L in an interlocking fashion so as to satisfy the formula (2) as described above without keeping L constant.

Beryllium of X-ray mirrors 3a, 3b and 3c has an adsorption-edge of 11.1 nm. Furthermore, beryllium has no absorption-edge in a wavelength range shorter than the wavelength of 11.1 nm. For this reason, a change in an angle of oblique incidence of radiation to X-ray mirrors 3a, 3b and 3c made of beryllium enables achievement of X-rays having any peak wavelength in a wavelength range ranging from 0.45 nm to 0.7 nm and in addition, absorption and cutting off of X-rays in a wavelength range shorter than any wavelength.

Then, radiation emitted from X-ray mirror 3c is directed to collective mirror 22 and magnifying mirror 23. Here, radiation 2a emitted from synchrotron radiation source 1 has a comparatively large output angle in a horizontal direction, but a comparatively small output angle in a vertical direction. Therefore, in a case where radiation emitted from X-ray mirrors 3a, 3b and 3c is used to impinge on X-ray mask 6 and to proceed a exposure step without any modification to the original, it is hard to secure a sufficient illumination area in a vertical direction. In order to solve this problem, a reflecting surface of magnifying mirror 23 reflecting radiation thereon is convex outwardly. As a result, an illumination area in a vertical direction of radiation 2b emitted from magnifying mirror 23 can be increased. Here, rhodium is used as a material of collective mirror 22 and magnifying mirror 23 and an angle of incidence is set at 89 degrees.

Then, radiation 2b emitted from magnifying mirror 23 is directed to filter 5. Filter 5 can be operated so as to be freely advanced or retreated by a straight-line travel drive motor. X-rays in a prescribed wavelength range are cut off and X-beam 2b transmitted through a filter without being cut off impinges on X-ray mask 6.

Figure 77:
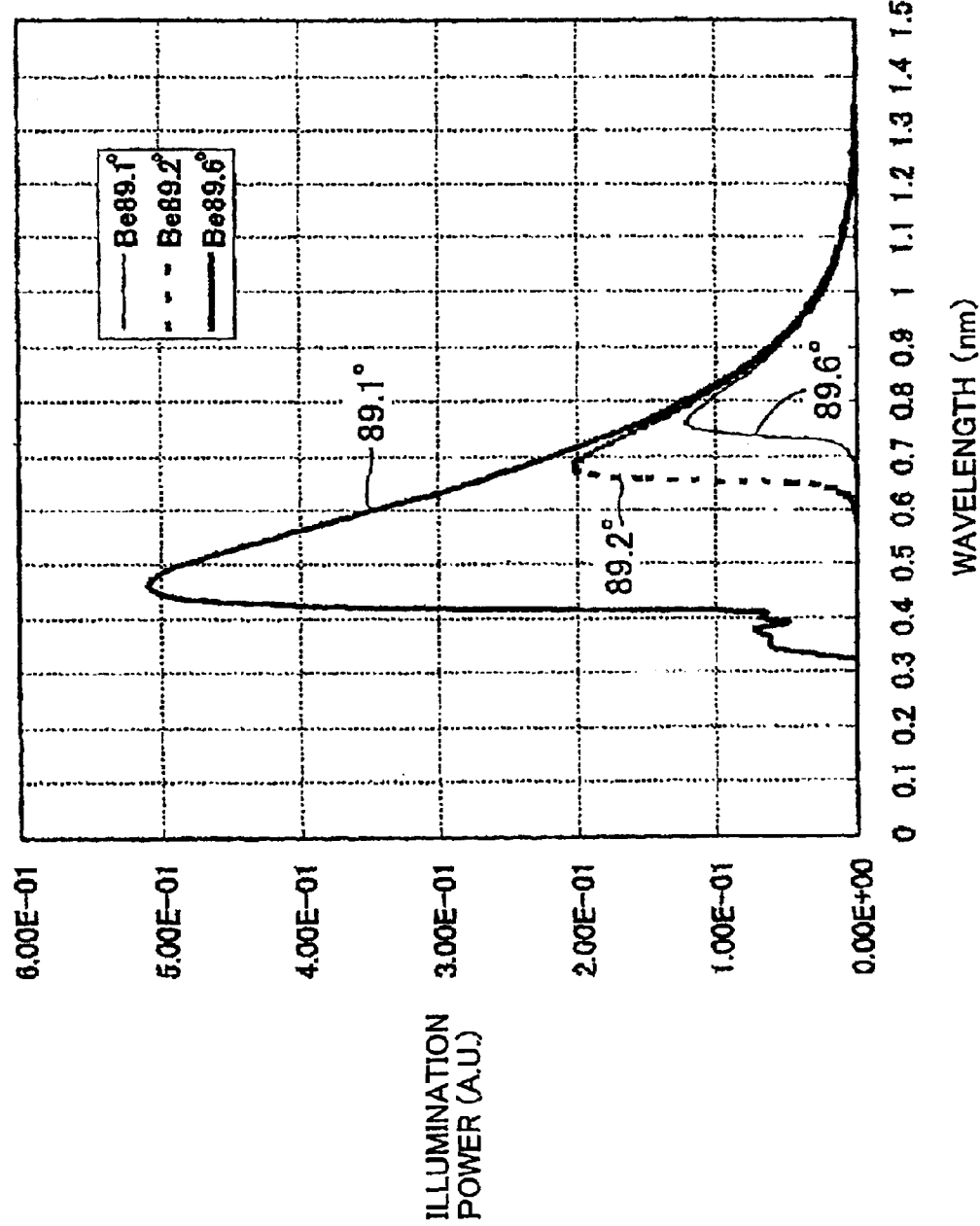
FIG. 77 is a graph showing spectra of exposure X-rays when an angle of reflecting X-ray mirrors in the twenty-third embodiment of the present invention.

In the construction shown in FIG. 75, by setting an angle of incidence to X-ray mirrors 3a made of beryllium 3b and 3c at 89.1 degrees, 89.2 degrees and 89.3 degrees, a peak wavelength of illumination radiation can be shifted as shown in FIG. 77.

Figure 78:
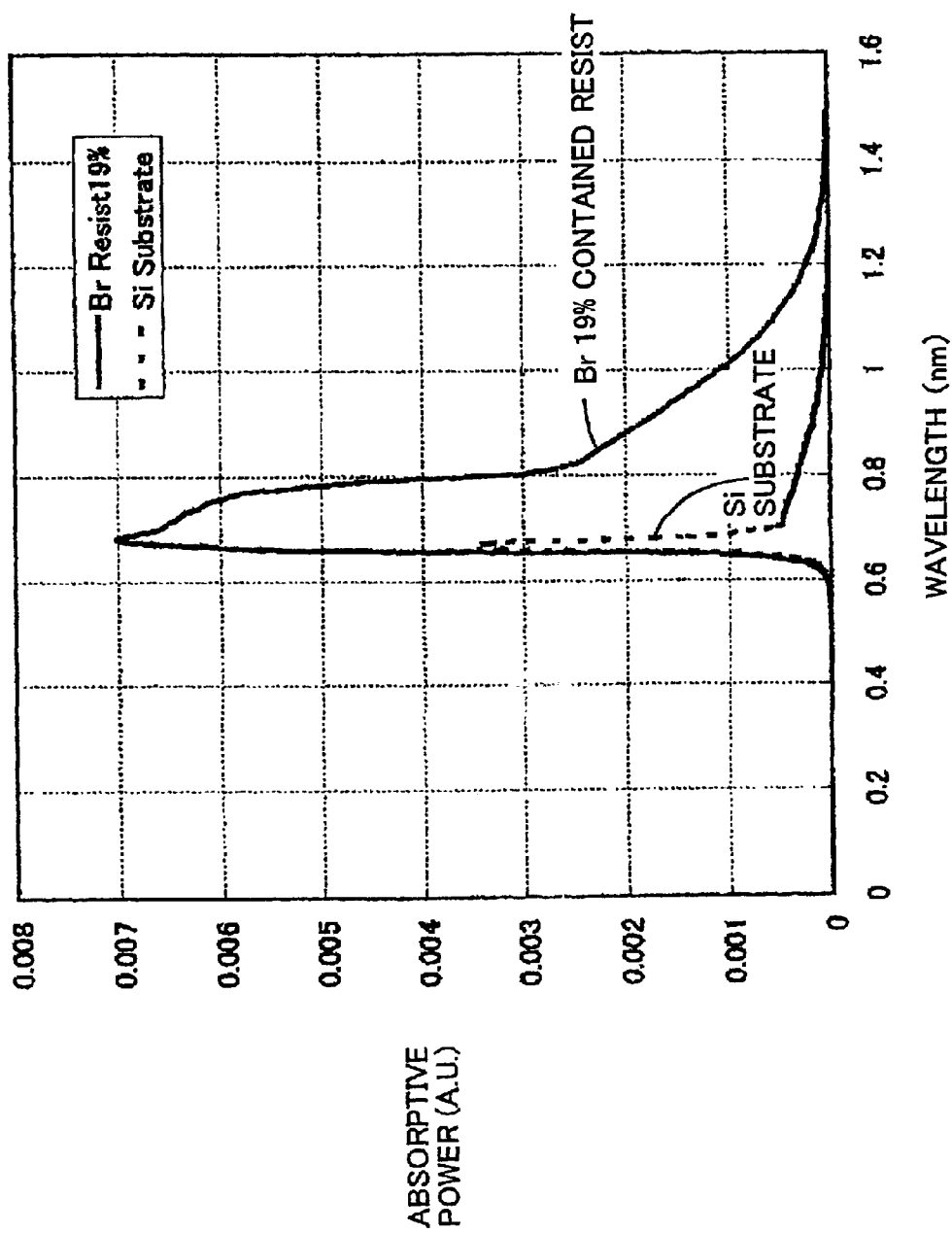
FIG. 78 is a graph showing absorption spectra of a bromine contained resist and a silicon substrate in an X-ray exposure method of the twenty-third embodiment of the present invention.

In a case of a silicon substrate, by setting angles of incidence of X-ray mirrors 3a, 3b ad 3c at 89.6 degrees and using a bromine contained resist without inserting filter 5, there are obtained an absorption spectrum in the resist and an absorption spectrum in a silicon substrate, which are shown in FIG. 78. From the two spectra, an R value is obtained as 0.14 for the resist of a bromine content 19%.

Figure 79:
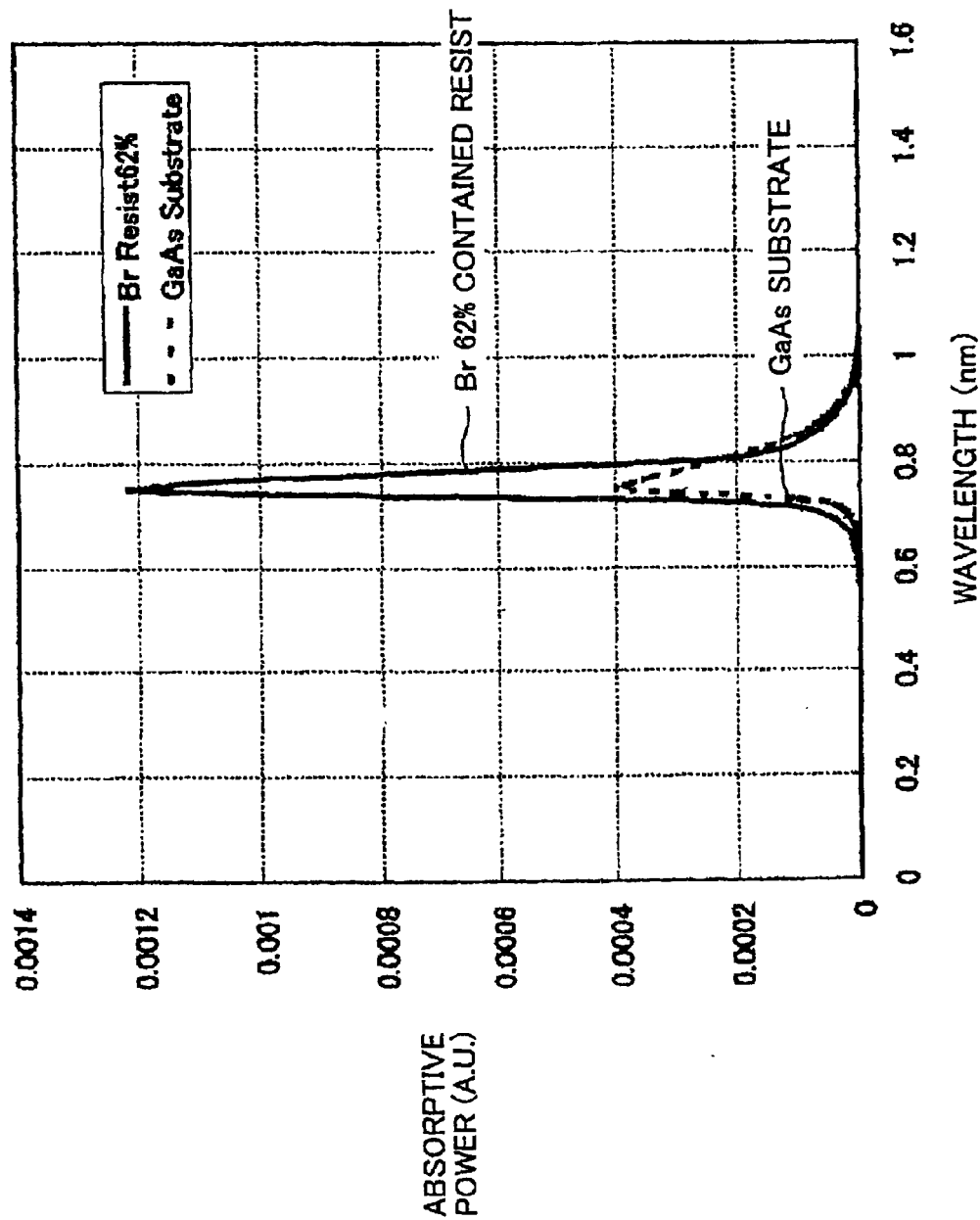
FIG. 79 is a graph showing absorption spectra of a bromine contained resist and a gallium arsenide substrate in the X-ray exposure method of a twenty-third embodiment of the present invention.

In a case of a gallium arsenide substrate, by setting angles of incidence of X-ray mirrors 3a, 3b ad 3c at 89.2 degrees and using a bromine contained resist at a bromine content 62% with filter 5 of a thickness 20 µm inserted, there are obtained an absorption spectrum in the resist and an absorption spectrum in a silicon substrate, which are shown in FIG. 79. From the two spectra, an R value is obtained as 0.43 in a case where the bromine contained resist at a bromine content of 62% on the gallium arsenide substrate is used in the above system.

Figure 80:
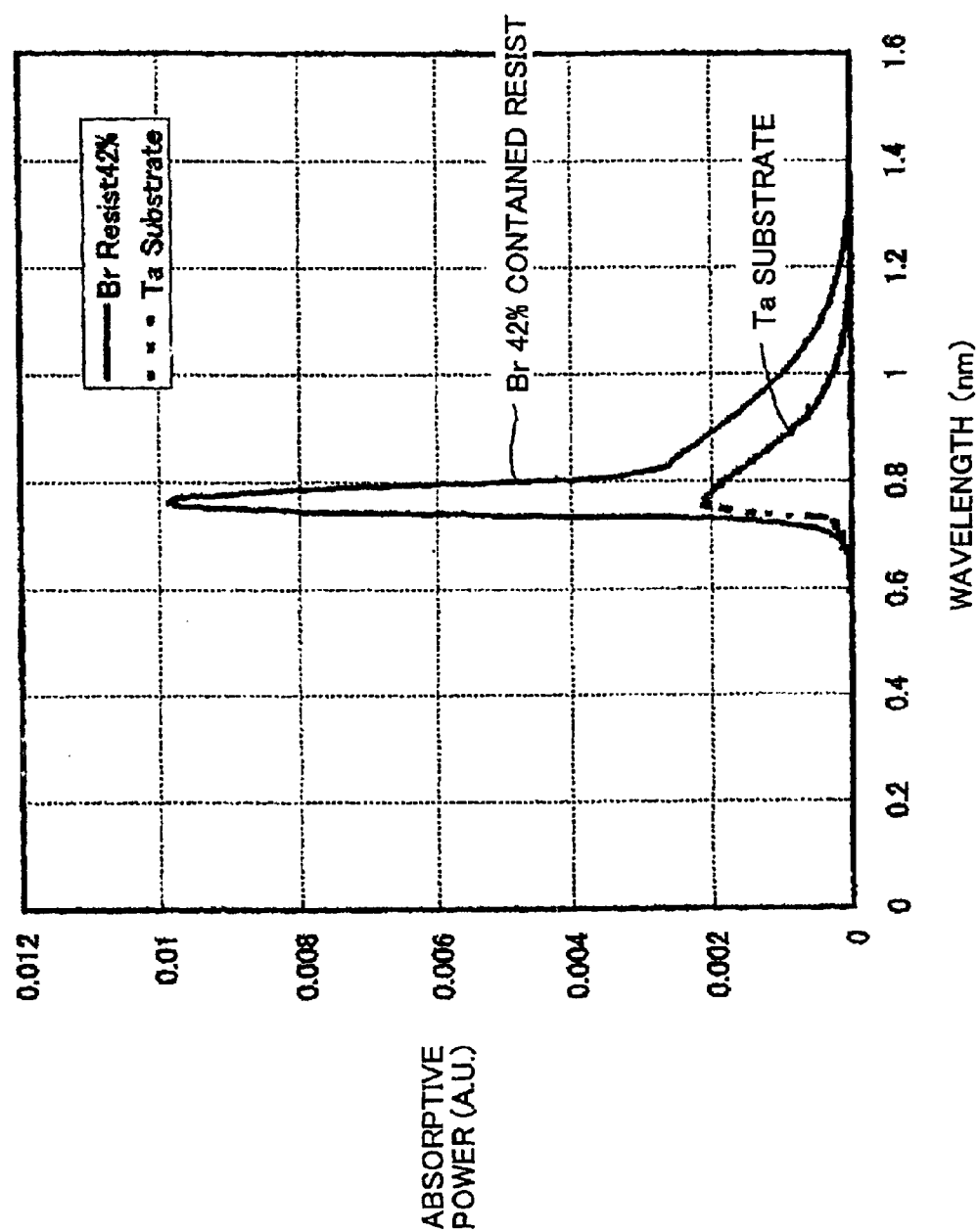
FIG. 80 is a graph showing absorption spectra of a bromine contained resist and a tantalum substrate in the X-ray exposure method of a twenty-third embodiment of the present invention.
Figure 81:
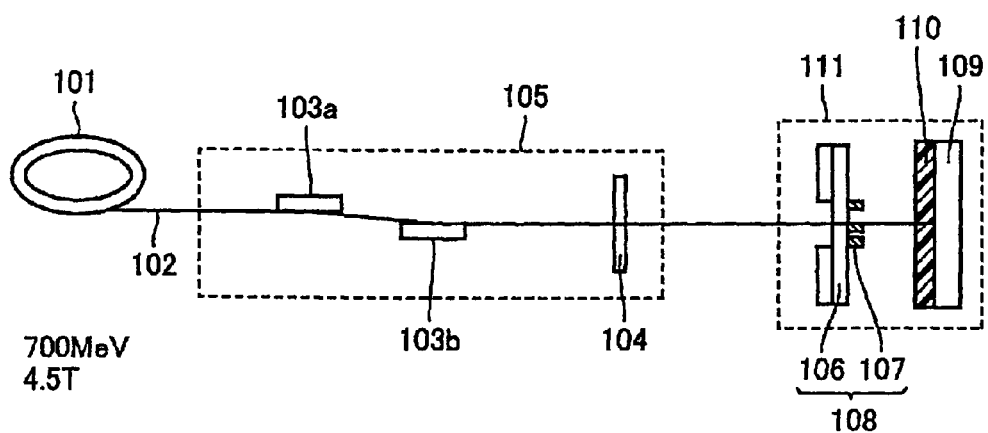
FIG. 81 is an illustration showing a prior art X-ray exposure apparatus.
Figure 82:
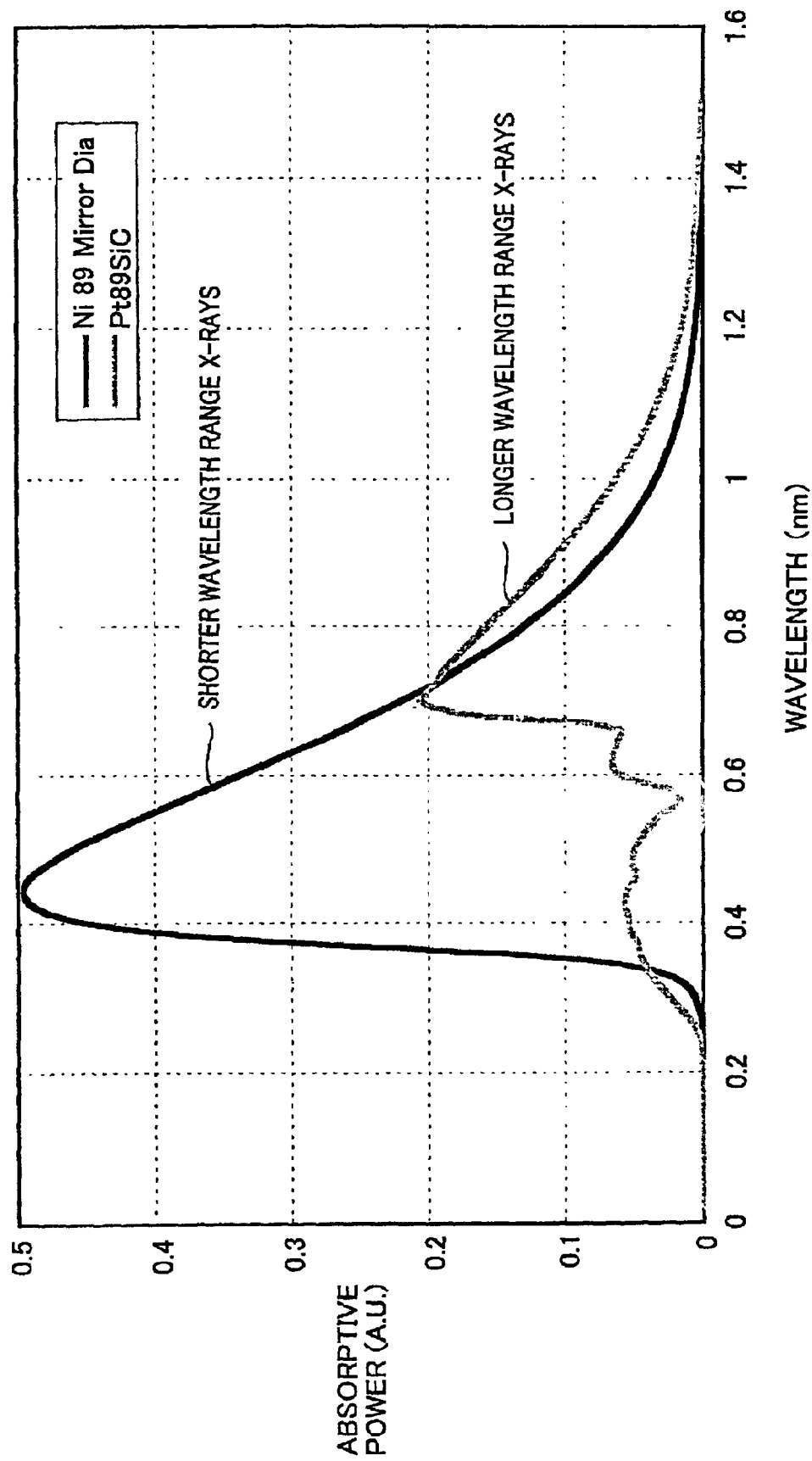
FIG. 82 is a graph showing spectra of general two kinds of exposure X-rays in respective longer and shorter wavelength ranges.

In a case of a tantalum substrate, by setting an angle of incidence of X-ray mirrors 3a, 3b ad 3c at 89.1 degrees and using a bromine contained resist at a bromine content 42% without inserting filter 5, there are obtained an absorption spectrum in the resist and an absorption spectrum in a silicon substrate, which are shown in FIG. 80. From the two spectra, an R value is obtained as 0.31 in a case where the bromine contained resist on the tantalum substrate is used in the above system.

In any of the above cases, by adjusting an angle of X-ray mirrors externally and selecting and inserting a proper filter cutting off X-rays in a prescribed wavelength range, an R value can be reduced low. In this embodiment, a mechanism is provided that can simultaneously adjust X-ray mirrors and a filter in such a way during operation of an X-ray exposure apparatus. With such a mechanism, a resist containing a prescribed element at a prescribed proportion and exposure X-rays in a proper wavelength range reducing a fog caused by secondary electrons from a substrate can be supplied with swiftness and convenience for a combination of the substrate with the resist.

While, in the above description, the embodiments of the present invention are taken up, the embodiments of the present invention are presented by way of illustration and example only and the scope of the present invention is not limited by the embodiments of the present invention. For example, (a) here, while description is mainly of a system in which X-rays emitted from a radiation generator are employed, there is no limitation to X-rays emitted from the radiation generator as apparent from the principle of the present invention, but it is natural that similar effects can be attained even with various kinds of X-ray sources including a plasma X-ray source and the applications to those X-ray sources are included in the scope of the present invention. Furthermore, it is natural that a similar effect can be attained by an exposure technique using an electron beam having energies of the same order as X-rays, which is also included in the present invention. (b) in addition, description is given of resist films each containing a single element for making clear an effect of each of elements. However, in a case where plural elements are included, it is needless to say that effects of respective elements are summed up each other, which is included in the scope of the present invention. The scope of the present invention is expressed by the terms of the appended claims and is intended to include a scope equivalent to the terms of the appended claims and all modifications or alternations within the scope.

What is claimed is:

1. An X-ray exposure method comprising:
    forming, by coating, a resist film on a substrate made of a material having an absorption-edge wavelength in or near an illumination wavelength range; and
    illuminating the resist film with X-rays in the illumination wavelength range, including the absorption-edge wavelength, through an X-ray mask, wherein a ratio of X-rays absorbed at a surface and within prescribed depth of said substrate to X-rays absorbed in the resist film does not exceed a prescribed value.

2. The X-ray exposure method according to claim 1, including reducing X-ray intensity in a wavelength range of an absorption spectrum including the absorption-edge of the material of the substrate in an optical path leading to the substrate.

3. The X-ray exposure method according to claim 1, wherein the resist film includes an element having an absorption spectrum overlapping the absorption spectrum including the absorption-edge of the material of the substrate.

4. The X-ray exposure method according to claim 1, wherein the resist film includes an element having an absorption-edge in a wavelength range longer than the absorption-edge of the material of the substrate, and reducing X-ray intensity in a wavelength range no longer than the absorption-edge wavelength of the material of the substrate.

5. The X-ray exposure method according to claim 1, wherein the resist film includes an element having an absorption-edge in a wavelength range shorter than the absorption-edge of the material of the substrate and reducing X-ray intensity in a wavelength range no shorter than the absorption-edge wavelength of the element included in the resist film.

6. The X-ray exposure method according to claim 1, including transmission of the X-rays through at least one of a filter and a transmissive part of the mask with an absorptive power in or near a wavelength range of the absorption-edge wavelength of the material of the substrate.

7. The X-ray exposure method according to claim 6, wherein the at least one of a filter and a transmissive part of the mask decreases transmission of X-rays having wavelengths equal to and shorter than the absorption-edge wavelength of the material of the substrate.

8. The X-ray exposure method according to claim 6, wherein the at least one of a filter and a transmissive part of the mask decreases transmission of X-rays having wavelengths equal to and longer than the absorption-edge wavelength of the material of the substrate.

9. The X-ray exposure method according to claim 1, including reflecting X-rays from a mirror changing the spectrum of the X-rays, without changing optical axis with respect to the X ray mask, and adjusting the mirror, so that X-ray intensity in a wavelength range of an absorption spectrum including the absorption edge of the material of the substrate is reduced.

10. The X-ray exposure method according to claim 1, wherein the resist film includes an element having a mass number larger than that of the material of the substrate.

11. The X-ray exposure method according to claim 1, wherein the resist film includes an element having an absorption-edge wavelength and using X-rays that have a wavelength range from the absorption-edge wavelength to a wavelength shorter by 400 eV than the absorption-edge wavelength to illuminate the resist film.

12. The X-ray exposure method according to claim 11, wherein absorbed wavelength of X-rays is in a range from 0.8 nm to 0.65 nm.

13. The X-ray exposure method according to claim 1, wherein the material of the substrate is a heavy metal and the resist film includes at least one of bromine and iodine.

14. The X-ray exposure method according to claim 1, wherein, when the material of the substrate is selected from the group consisting of silicon, aluminum, tantalum, copper, tungsten, and gallium arsenide, and oxides and nitrides thereof, the resist film includes at least one selected from the group consisting of chlorine, sulfur, phosphorus, silicon, bromine, iodine, fluorine, and oxygen.

15. A fine structure patterned and fabricated using an X-ray exposure method according to claim 1.

16. A semiconductor device patterned and fabricated using an X-ray exposure method according to claim 1.

17. An X-ray exposure apparatus in which a resist film on a substrate made of a material having an absorption edge wavelength is illuminated with X-rays in a wavelength range including the absorption-edge wavelength, through an X-ray mask, comprising:

a filter mounting mechanism, located in an optical path leading to the substrate and freely demountable from outside of said X-ray exposure apparatus for changing wavelength distribution of exposure X-rays according to a material of the substrate; and a reflecting X-ray mirror having a variable reflecting spectrum while holding the optical path at a fixed position.

* * * * *